US011817508B2

(12) United States Patent
Koezuka et al.

(10) Patent No.: US 11,817,508 B2
(45) Date of Patent: Nov. 14, 2023

(54) METHODS FOR MANUFACTURING A SEMICONDUCTOR DEVICE HAVING A METAL OXIDE LAYER WITH A CONCENTRATION GRADIENT OF OXYGEN AND AN INSULATING LAYER WITH EXCESS OXYGEN

(71) Applicant: Semiconductor Energy Laboratory Co., Ltd., Atsugi (JP)

(72) Inventors: Junichi Koezuka, Tochigi (JP); Kenichi Okazaki, Tochigi (JP); Yukinori Shima, Tatebayashi (JP); Yasutaka Nakazawa, Tochigi (JP); Yasuharu Hosaka, Tochigi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 122 days.

(21) Appl. No.: 17/151,941

(22) Filed: Jan. 19, 2021

(65) Prior Publication Data

US 2021/0167223 A1 Jun. 3, 2021

Related U.S. Application Data

(62) Division of application No. 15/904,867, filed on Feb. 26, 2018, now Pat. No. 10,985,283.

(30) Foreign Application Priority Data

Mar. 3, 2017 (JP) .................................. 2017-041019
Mar. 13, 2017 (JP) .................................. 2017-047019

(51) Int. Cl.
*H01L 29/786* (2006.01)
*H01L 21/02* (2006.01)
(Continued)

(52) U.S. Cl.
CPC ........ *H01L 29/78696* (2013.01); *G06F 3/044* (2013.01); *G06F 3/0412* (2013.01);
(Continued)

(58) Field of Classification Search
CPC .................... H01L 29/78696; H01L 29/7896
See application file for complete search history.

(56) References Cited

U.S. PATENT DOCUMENTS 8,293,595 B2 10/2012 Yamazaki et al.
8,420,553 B2 4/2013 Yamazaki
(Continued)

FOREIGN PATENT DOCUMENTS

JP 2013-179290 A 9/2013
JP 2014-007399 A 1/2014
(Continued)

OTHER PUBLICATIONS

Yamazaki.S et al., "Achievement of a high-mobility FET with a cloud-aligned composite oxide semiconductor", Jpn. J. Appl. Phys. (Japanese Journal of Applied Physics), Oct. 13, 2016, vol. 55, pp. 115504-1-115504-7.
(Continued)

*Primary Examiner* — Younes Boulghassoul
(74) *Attorney, Agent, or Firm* — ROBINSON INTELLECTUAL PROPERTY LAW OFFICE; Eric J. Robinson

(57) ABSTRACT

A semiconductor device with favorable electrical characteristics is to be provided. A highly reliable semiconductor device is to be provided. A semiconductor device with lower power consumption is to be provided. The semiconductor device includes a gate electrode, a first insulating layer over the gate electrode, a metal oxide layer over the first insulating layer, a pair of electrodes over the metal oxide layer, and a second insulating layer over the pair of electrodes. The
(Continued)

first insulating layer includes a first region and a second region. The first region has a region being in contact with the metal oxide layer and containing more oxygen than the second region. The second region has a region containing more nitrogen than the first region. The metal oxide layer has at least a concentration gradient of oxygen in a thickness direction, and the concentration gradient becomes high on a first region side and on a second region side.

15 Claims, 37 Drawing Sheets

(51) Int. Cl.
H01L 29/24 (2006.01)
H01L 29/66 (2006.01)
H01L 27/12 (2006.01)
H01L 27/02 (2006.01)
G06F 3/044 (2006.01)
G06F 3/041 (2006.01)
G02F 1/1368 (2006.01)
G02F 1/1333 (2006.01)
H10K 59/121 (2023.01)

(52) U.S. Cl.
CPC .. *H01L 21/02554* (2013.01); *H01L 21/02565* (2013.01); *H01L 21/02631* (2013.01); *H01L 27/0296* (2013.01); *H01L 27/127* (2013.01); *H01L 27/1225* (2013.01); *H01L 27/1259* (2013.01); *H01L 29/24* (2013.01); *H01L 29/66969* (2013.01); *H01L 29/7869* (2013.01); *H01L 29/78606* (2013.01); *H01L 29/78648* (2013.01); *G02F 1/1333* (2013.01); *G02F 1/1368* (2013.01); *G02F 1/13338* (2013.01); *G02F 1/13685* (2021.01); *H10K 59/1213* (2023.02)

(56) References Cited

U.S. PATENT DOCUMENTS

| | | | |
|---|---|---|---|
| 8,470,650 B2 | 6/2013 | Akimoto et al. |
| 8,624,237 B2 | 1/2014 | Yamazaki et al. |
| 8,878,172 B2 | 11/2014 | Ito et al. |
| 8,901,557 B2 | 12/2014 | Yamazaki |
| 8,946,097 B2 | 2/2015 | Yamazaki |
| 9,184,297 B2 | 11/2015 | Koezuka et al. |
| 9,281,408 B2 | 3/2016 | Yamazaki et al. |
| 9,431,547 B2 | 8/2016 | Yamazaki et al. |
| 9,437,831 B2 | 9/2016 | Yamazaki et al. |
| 9,490,369 B2 | 11/2016 | Yamazaki |
| 9,496,408 B2 | 11/2016 | Yamazaki et al. |
| 9,548,393 B2 | 1/2017 | Koezuka et al. |
| 9,559,316 B2 | 1/2017 | Yamazaki et al. |
| 9,559,317 B2 | 1/2017 | Yamazaki et al. |
| 9,780,219 B2 | 10/2017 | Koezuka et al. |
| 9,837,552 B2 | 12/2017 | Yamazaki et al. |
| 9,847,430 B2 | 12/2017 | Yamazaki |
| 9,905,696 B2 | 2/2018 | Koezuka et al. |
| 10,128,384 B2 | 11/2018 | Yamazaki et al. |
| 10,139,663 B2 | 11/2018 | Shishido et al. |
| 10,249,764 B2 | 4/2019 | Yamazaki |
| 10,312,315 B2 | 6/2019 | Yamazaki et al. |
| 10,347,768 B2 | 7/2019 | Koezuka et al. |
| 10,355,067 B2 | 7/2019 | Yamazaki et al. |
| 10,411,136 B2 | 9/2019 | Yamazaki et al. |
| 10,483,406 B2 | 11/2019 | Yamazaki |
| 10,693,010 B2 | 6/2020 | Koezuka et al. |
| 10,720,532 B2 | 7/2020 | Yamazaki et al. |
| 10,763,322 B2 | 9/2020 | Yamazaki et al. |
| 10,854,697 B2 | 12/2020 | Yamazaki et al. |
| 10,872,947 B2 | 12/2020 | Yamazaki et al. |
| 10,879,331 B2 | 12/2020 | Yamazaki et al. |
| 11,004,925 B2 | 5/2021 | Yamazaki et al. |
| 11,515,426 B2 | 11/2022 | Koezuka et al. |
| 11,672,148 B2 | 6/2023 | Yamazaki et al. |
| 2010/0283049 A1 | 11/2010 | Sato et al. |
| 2011/0140100 A1 | 6/2011 | Takata et al. |
| 2013/0207111 A1 | 8/2013 | Yamazaki |
| 2013/0320334 A1 | 12/2013 | Yamazaki et al. |
| 2013/0334523 A1* | 12/2013 | Yamazaki ............. H01L 29/512 257/43 |
| 2014/0008647 A1 | 1/2014 | Yamazaki |
| 2014/0034945 A1 | 2/2014 | Tokunaga et al. |
| 2014/0110707 A1 | 4/2014 | Koezuka et al. |
| 2014/0206133 A1 | 7/2014 | Koezuka et al. |
| 2014/0306221 A1 | 10/2014 | Yamazaki et al. |
| 2014/0339560 A1* | 11/2014 | Yamazaki ............... H01L 29/24 257/49 |
| 2015/0333088 A1 | 11/2015 | Yamazaki et al. |
| 2015/0340505 A1 | 11/2015 | Yamazaki et al. |
| 2016/0118502 A1 | 4/2016 | Yamazaki et al. |
| 2016/0155759 A1* | 6/2016 | Yamazaki ........... H01L 27/1225 257/43 |
| 2016/0190330 A1 | 6/2016 | Yamazaki |
| 2016/0225795 A1 | 8/2016 | Koezuka et al. |
| 2016/0240682 A1 | 8/2016 | Shimomura et al. |
| 2016/0260837 A1 | 9/2016 | Koezuka et al. |
| 2016/0276486 A1* | 9/2016 | Koezuka ........... H01L 29/78696 |
| 2016/0284854 A1 | 9/2016 | Okazaki. et al. |
| 2016/0299601 A1 | 10/2016 | Yamazaki et al. |
| 2018/0158956 A1 | 6/2018 | Koezuka et al. |
| 2021/0057582 A1 | 2/2021 | Koezuka et al. |
| 2021/0057586 A1 | 2/2021 | Yamazaki et al. |
| 2023/0044086 A1 | 2/2023 | Koezuka et al. |
| 2023/0263018 A1 | 8/2023 | Yamazaki et al. |

FOREIGN PATENT DOCUMENTS

| | | |
|---|---|---|
| JP | 2014-039019 A | 2/2014 |
| JP | 2015-026830 A | 2/2015 |
| JP | 2015-187701 A | 10/2015 |
| JP | 2016-106409 A | 6/2016 |
| JP | 2016-178324 A | 10/2016 |
| JP | 2016-224437 A | 12/2016 |
| KR | 2013-0141379 A | 12/2013 |
| KR | 2014-0136381 A | 11/2014 |
| WO | WO-2011/070892 | 6/2011 |
| WO | WO-2014/013959 | 1/2014 |
| WO | WO-2015/083029 | 6/2015 |
| WO | WO-2016/193849 | 12/2016 |

OTHER PUBLICATIONS

Taiwanese Office Action (Application No. 106112076) dated Nov. 24, 2020.

* cited by examiner

10nm

10nm

10nm

METHODS FOR MANUFACTURING A SEMICONDUCTOR DEVICE HAVING A METAL OXIDE LAYER WITH A CONCENTRATION GRADIENT OF OXYGEN AND AN INSULATING LAYER WITH EXCESS OXYGEN

BACKGROUND OF THE INVENTION

1. Field of the Invention

One embodiment of the present invention relates to a semiconductor device and a manufacturing method thereof. One embodiment of the present invention relates to a transistor and a manufacturing method thereof. One embodiment of the present invention relates to a display device and a manufacturing method thereof.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

Note that one embodiment of the present invention is not limited to the above technical field. Examples of the technical field of one embodiment of the present invention disclosed in this specification and the like include a semiconductor device, a display device, a light-emitting device, a lighting device, a power storage device, a memory device, a driving method thereof, and a manufacturing method thereof.

2. Description of the Related Art

As a semiconductor material that can be used in a transistor, an oxide semiconductor has been attracting attention. For example, Patent Document 1 discloses a semiconductor device whose field-effect mobility (in some cases, simply referred to as mobility or μFE) is improved, which is obtained by such a structure that a plurality of oxide semiconductor layers are stacked and among them, the oxide semiconductor layer serves as a channel contains indium and gallium where the proportion of indium is higher than the proportion of gallium.

An oxide semiconductor that can be used for a semiconductor layer can be formed by a sputtering method or the like, and thus can be used for a semiconductor layer of a transistor in a large display device. In addition, there is an advantage that capital investment can be reduced because part of production equipment for a transistor including amorphous silicon can be retrofitted and utilized. A transistor including an oxide semiconductor has high field-effect mobility; therefore, a high-performance display device where driver circuits are formed over the same substrate can be obtained.

REFERENCE

Patent Document

[Patent Document 1] Japanese Published Patent Application No. 2014-007399

SUMMARY OF THE INVENTION

With an increase in the resolution of display devices or an increase in the degree of integration of semiconductor devices, the miniaturization of transistors has been required. As the miniaturization of transistors, specifically, a reduction in channel length can be given. However, in a transistor with a short channel length, the electrical characteristics and reliability are significantly affected by the carrier density and defect states (defect level) in a channel region.

In view of the above, one object of one embodiment of the present invention is to provide a semiconductor device which has favorable electrical characteristics. Another object of the present invention is to provide a highly reliable semiconductor device. Another object of one embodiment of the present invention is to provide a semiconductor device with low power consumption. Another object is to provide a novel semiconductor device. Another object of one embodiment of the present invention is to provide a method for manufacturing a semiconductor device with high productivity. Another object of one embodiment of the present invention is to provide a method for manufacturing a semiconductor device with a high yield. Another object is to provide a method for manufacturing a novel semiconductor device.

Note that the descriptions of these objects do not disturb the existence of other objects. In one embodiment of the present invention, there is no need to achieve all the objects. Note that other objects can be derived from the description of the specification, the drawings, the claims, and the like.

One embodiment of the present invention is a semiconductor device including a gate electrode, a first insulating layer over the gate electrode, a metal oxide layer over the first insulating layer, a pair of electrodes over the metal oxide layer, and a second insulating layer over the pair of electrodes, where the metal oxide layer contains indium, a metal M (M is at least one of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, where the first insulating layer includes a first region and a second region, where the first region has a region being in contact with the metal oxide layer and containing more oxygen than the second region, where the second region has a region containing more nitrogen than the first region, where the metal oxide layer has at least a concentration gradient of oxygen in a thickness direction, and where the concentration gradient becomes high on a first region side and on a second insulating layer side.

In the above semiconductor device, the first region preferably has a region with a thickness greater than or equal to 1 nm and less than or equal to 10 nm.

In the above semiconductor device, the metal oxide layer preferably has an atomic ratio where, when an atomic ratio of In is 1, M is greater than or equal to 0.5 and less than or equal to 1.5 and Zn is greater than or equal to 0.1 and less than or equal to 2.

In the above semiconductor device, the metal oxide layer preferably has an atomic ratio where, when an atomic ratio of In is 4, M is greater than or equal to 1.5 and less than or equal to 2.5 and Zn is greater than or equal to 2 and less than or equal to 4.

In the above semiconductor layer, the metal oxide layer preferably has an atomic ratio where, when an atomic ratio of In is 5, M is greater than or equal to 0.5 and less than or equal to 1.5 and Zn is greater than or equal to 5 and less than or equal to 7.

In the above semiconductor device, the metal oxide layer preferably includes a first metal oxide layer and a second metal oxide layer over the first metal oxide layer, and the first metal oxide layer preferably includes a region with lower crystallinity than the second metal oxide layer.

In the above semiconductor device, the metal oxide layer preferably includes a first metal oxide layer, a second metal oxide layer over the first metal oxide layer, and a third metal oxide layer in contact with a bottom of the first metal oxide layer, and the first metal oxide layer preferably includes a region having lower crystallinity than one or both of the second metal oxide layer and the third metal oxide layer.

The above semiconductor device further includes a third insulating layer over the second insulating layer, and the third insulating layer preferably contains silicon and nitrogen.

The above semiconductor device further preferably includes a third insulating layer over the second insulating layer, and the third insulating layer preferably contains an element X (X is at least one of aluminum, indium, gallium, and zinc) and oxygen.

One embodiment of the present invention is a method for manufacturing a semiconductor device including a step of forming a gate electrode, a step of forming a first insulating layer over the gate electrode, a step of adding oxygen in the vicinity of a surface of the first insulating layer, a step of forming a metal oxide layer over the first insulating layer, a step of forming a pair of electrodes over the metal oxide layer, and a step of forming a second insulating layer over the pair of electrodes. The step of forming a metal oxide layer is divided into a first step and a second step, and the metal oxide layer is deposited in vacuum through the first step and the second step conducted continuously. The first step is conducted before the second step, and the second step has a higher flow ratio of oxygen in a whole deposition gas than the first step.

One embodiment of the present invention is a method for manufacturing a semiconductor device including a step of forming a gate electrode, a step of forming a first insulating layer over the gate electrode, a step of adding oxygen in the vicinity of a surface of the first insulating layer, a step of forming a metal oxide layer over the first insulating layer, a step of forming a pair of electrodes over the metal oxide layer, and a step of forming a second insulating layer over the pair of electrodes. The step of forming a metal oxide layer is divided into a first step to a third step, and the metal oxide layer is deposited in vacuum through the first step to the third step conducted continuously. The first step is conducted before the second step. The second step has a higher flow ratio of oxygen in a whole deposition gas than the first step. The third step is conducted before the first step and has a higher flow ratio of oxygen in a whole deposition gas than the first step.

With one embodiment of the present invention, a semiconductor device which has favorable electrical characteristics can be provided. Furthermore, a highly reliable semiconductor device can be provided. A semiconductor device with low power consumption can be provided. Alternatively, a novel semiconductor device can be provided. A method for manufacturing a semiconductor device with high productivity can be provided. A method for manufacturing a semiconductor device with a high yield can be provided. A method for manufacturing a novel semiconductor device can be provided.

Note that the description of these effects does not preclude the existence of other effects. One embodiment of the present invention does not necessarily achieve all the effects listed above. Other effects can be derived from the description of the specification, the drawings, the claims, and the like.

DETAILED DESCRIPTION OF THE INVENTION

Figure 1A:
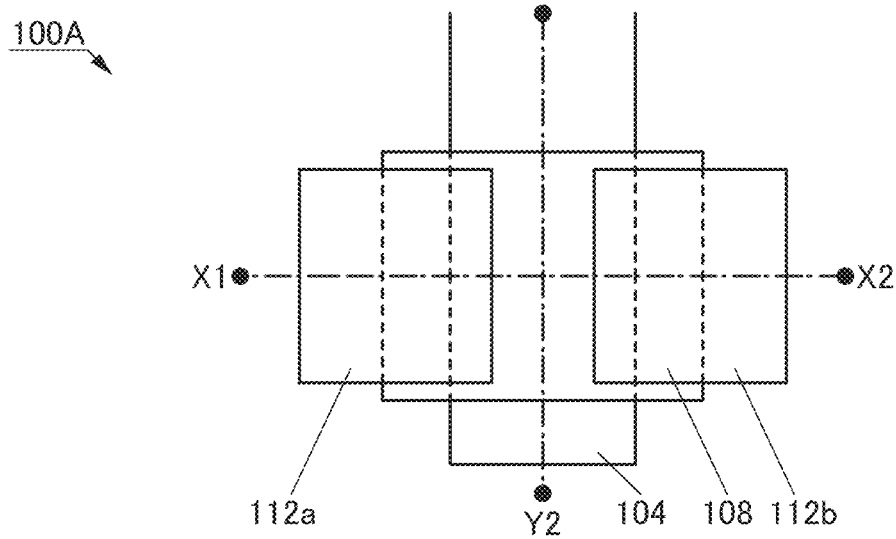
FIGS. 1A to 1C illustrate a structure example of a semiconductor device.

Hereinafter, embodiments will be described with reference to drawings. However, the embodiments can be implemented with various modes. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between the drain (a drain terminal, a drain region, or a drain electrode) and the source (a source terminal, a source region, or a source electrode), and current can flow between the source and the drain through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the term "electrically connected" includes the case where components are connected through an object having any electric function. There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "perpendicular" indicates that the angle formed between two straight lines is greater than or equal to $80°$ and less than or equal to $100°$. Thus, the case where the angle is greater than or equal to $85°$ and less than or equal to $95°$ is also included.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Unless otherwise specified, off-state current in this specification and the like refers to drain current of a transistor in an off state (also referred to as a non-conducting state and a cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, "the off-state current of a transistor is lower than or equal to I" may mean "there is Vgs with which the off-state current of the transistor becomes lower than or equal to I". Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage Vth is 0.5 V and the drain current is $1\times10^{-9}$ A at a voltage Vgs of 0.5 V, $1\times10^{-13}$ A at a voltage Vgs of 0.1 V, $1\times10^{-19}$ A at a voltage Vgs of $-0.5$ V, and $1\times10^{-22}$ A at a voltage Vgs of $-0.8$ V. The drain current of the transistor is $1\times10^{-19}$ A or lower at Vgs of $-0.5$ V or at Vgs in the range of $-0.8$ V to $-0.5$ V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value per channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is Vgs at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the required reliability of a semiconductor device or the like including the transistor is ensured or Vds at which the semiconductor device or the like including the transistor is used. The description "an off-state current of a transistor is lower than or equal to a current I" may mean that there is $V_{gs}$ at which the off-state current of the transistor is lower than or equal to the current I at a voltage Vas of 0.1 V, 0.8 V, 1 V, 1.2 V, 1.8 V, 2.5 V, 3 V, 3.3 V, 10 V, 12 V, 16 V, or 20 V, at a voltage $V_{ds}$ at which the reliability of a semiconductor device or the like including the transistor is ensured, or at a voltage Vas at which the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$-$\sqrt{I_d}$ characteristics). Alternatively, the threshold voltage of a transistor may refer to a gate voltage ($V_g$) at which the value of $I_d$ [A]×L [μm]/W [μm] is $1 \times 10^{-9}$ [A] where L is channel length and W is channel width.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases, and vice versa.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases, and vice versa.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, a metal oxide that has at least one of an amplifying function, a rectifying function, and a switching function can be called a metal oxide semiconductor, or OS for short. In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated in some cases. CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC-metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, CAC-OS or CAC-metal oxide can be called a matrix composite or a metal matrix composite.

An example of a crystal structure of a metal oxide is described. Note that a metal oxide deposited by a sputtering method using an In—Ga—Zn oxide target (In:Ga:Zn=4:2:4.1 in an atomic ratio) is described below as an example. A metal oxide formed by a sputtering method using the above-mentioned target at a substrate temperature higher than or equal to 100° C. and lower than or equal to 130° C. is referred to as sIGZO, and a metal oxide formed by a sputtering method using the above-mentioned target with the substrate temperature set at room temperature (R.T.) is referred to as tIGZO. For example, sIGZO has one or both crystal structures of nano crystal (nc) and CAAC. Furthermore, tIGZO has a crystal structure of nc. Note that room temperature (R.T.) herein also refers to a temperature of the time when a substrate is not heated intentionally. Note that the CAAC structure is a crystal structure in which a plurality of IGZO nanocrystals have c-axis alignment and are connected in the a-b plane direction without alignment.

Note that in this specification and the like, a display panel as one embodiment of the display device has a function of displaying (outputting) an image or the like on (to) a display surface; hence, the display panel is one embodiment of an output device. Thus, the display panel is one embodiment of an output device.

In this specification and the like, a structure in which a connector such as a flexible printed circuit (FPC) or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

In this specification and the like, a touch sensor has a function of sensing the contact, press, approach, or the like of an object such as a finger or a stylus. In addition, the touch sensor may have a function of sensing the positional information. Therefore, the touch sensor is one embodiment of an input device. For example, the touch sensor can include one or more sensor elements.

In this specification and the like, a substrate provided with a touch sensor is referred to as a touch sensor panel or simply referred to as a touch sensor or the like in some cases. Furthermore, in this specification and the like, a structure in which a connector such as an FPC or a TCP is attached to a substrate of a touch sensor panel, or a structure in which an IC is mounted on a substrate by a COG method or the like is referred to as a touch sensor panel module, a touch sensor module, or a sensor module, or simply referred to as a touch sensor or the like in some cases.

Note that in this specification and the like, a touch panel which is one embodiment of the display device has a function of displaying (outputting) an image or the like on (to) a display surface and a function as a touch sensor capable of sensing contact, press, approach, or the like of an object such as a finger or a stylus on or to the display surface. Therefore, the touch panel is an embodiment of an input/output device.

A touch panel can be referred to, for example, a display panel (or a display device) with a touch sensor or a display panel (or a display device) having a touch sensor function.

A touch panel can include a display panel and a touch sensor panel. Alternatively, a touch panel can have a function of a touch sensor inside a display panel or on a surface of the display panel.

In this specification and the like, a structure in which a connector such as an FPC or a TCP is attached to a substrate of a touch panel, or a structure in which an IC is mounted on a substrate by a COG method or the like is referred to as a touch panel module or a display module, or simply referred to as a touch panel or the like in some cases.

Embodiment 1

In this embodiment, a semiconductor device of one embodiment and a method for manufacturing the semiconductor device will be described. Here, a transistor is described as an example of the semiconductor device.

A transistor of one embodiment of the present invention includes the following components: a first conductive layer functioning as a gate electrode; a first insulating layer functioning as a gate insulating layer; a semiconductor layer; a second conductive layer and a third conductive layer functioning as a source electrode or a drain electrode; and a second insulating layer and a third insulating layer functioning as protective layers.

It is preferable to use a metal oxide film for the semiconductor layer. In particular, the semiconductor layer preferably contains indium, an element M (one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc. In particular, the element M is preferably aluminum, gallium, yttrium, or tin.

When the metal oxide film in which the impurity concentration is low and the density of defect states is low is used as the semiconductor layer, the transistor can have excellent electrical characteristics, which is preferable. The state in which the impurity concentration is low and the density of defect states is low is referred to here as highly purified intrinsic or substantially highly purified intrinsic. A highly purified intrinsic or substantially highly purified intrinsic oxide semiconductor layer has few carrier generation sources, and thus can have a low carrier density. Thus, a transistor in which a channel region is formed in the semiconductor layer rarely has a negative threshold voltage (is rarely normally on). A highly purified intrinsic or substantially highly purified intrinsic oxide semiconductor layer has a low density of defect states and accordingly has a low density of trap states in some cases. Furthermore, a highly purified intrinsic or substantially highly purified intrinsic oxide semiconductor layer has an extremely low off-state current.

The electrical characteristics and reliability of the transistor are affected by the carrier density and defect states in a channel region of the transistor. In particular, in a transistor with a short channel length, the electrical characteristics and reliability are significantly affected by the carrier density and the defect states in a channel region. Thus, the carrier density and the defect states in the channel region are reduced, whereby favorable electrical characteristics and reliability can be obtained even in the transistor with a short channel length.

In some cases, oxygen is released from the metal oxide film in the semiconductor layer, and accordingly, oxygen vacancy (hereinafter, referred to as Vo in some cases) is generated. When a large amount of oxygen vacancy exists in the semiconductor layer, the density of defect states in the semiconductor layer is increased, and accordingly the electrical characteristics and reliability of the transistor are affected in some cases. Thus, in a manufacturing process of the transistor, an enough amount of oxygen is added to the semiconductor layer to reduce the amount of oxygen vacancy, so that a transistor with favorable electrical characteristics and high reliability can be manufactured. Furthermore, it is important to suppress the generation of oxygen vacancy as well as to reduce the amount of oxygen vacancy in the manufacturing process of the transistor.

When the oxygen vacancy and hydrogen exist in the semiconductor layer, there is a case where a state in which hydrogen enters the oxygen vacancy (hereinafter, referred to as VoH in some cases) is generated. In some cases, VoH serves as a carrier generation source which advisory affects the electrical characteristics and the reliability of the transistor. Thus, the amount of hydrogen and VoH in the semiconductor layer is reduced, whereby the carrier density can be decreased, and a transistor with favorable electrical characteristics and high reliability can be manufactured. Furthermore, it is important to suppress the diffusion of impurities including hydrogen into the semiconductor layer from the outside, as well as to reduce the amount of oxygen vacancy. Examples of impurities including hydrogen include hydrogen and water, for example.

To reduce the amount of oxygen vacancy in the semiconductor layer, for example, a layer from which oxygen can be released by heating is provided in the vicinity of the semiconductor layer and subjected to heat treatment, whereby oxygen can be supplied from the layer to the semiconductor layer.

The second insulating film functioning as a protective layer is in contact with a top surface of the semiconductor layer. The second insulating layer preferably contains oxygen. The second insulating layer is further preferably an insulating film which contains oxygen at a higher proportion than that in a stoichiometric composition. For example, an insulating film containing silicon and oxygen, an insulating film containing silicon, oxygen, and nitrogen, or the like is preferably used.

In this specification and the like, oxygen whose contained amount exceeds the stoichiometric composition is referred to as excess oxygen (exO) in some cases. Alternatively, excess oxygen refers to oxygen released from a film or layer containing oxygen by heating, for example. Excess oxygen can move inside a film or a layer. Excess oxygen moves between atoms in a film or a layer, or replaces oxygen that is a constituent of a film or a layer and moves like a billiard ball, for example. In this specification and the like, excess oxygen (exO) is simply referred to as oxygen in some cases.

When heat treatment is performed after the second insulating film is provided over the semiconductor layer, oxygen is diffused from the second insulating layer to the semiconductor layer, so that oxygen is supplied to the semiconductor layer. When the oxygen supplied to the semiconductor layer approaches the oxygen vacancy in the semiconductor layer, the oxygen is trapped by the oxygen vacancy and compensates for the oxygen vacancy. When the oxygen approaches hydrogen in the semiconductor layer, the oxygen and the hydrogen react with each other and released from the semiconductor layer as water ($H_2O$) molecules. When the oxygen approaches VoH in the semiconductor layer, the oxygen compensates for the oxygen vacancy in the VoH. Furthermore, hydrogen in the VoH reacts with another oxygen to generate water, and is released from the semiconductor as the water. In such a manner, with the oxygen in the second insulating layer, the amounts of oxygen vacancy, hydrogen, and VoH in the semiconductor layer can be reduced.

The third insulating layer functioning as a protective layer is in contact with a top surface of the second insulating layer. The third insulating layer is preferably formed using a material with higher nitrogen concentration than the second insulating layer. For example, an insulating film containing silicon and nitrogen as main components is preferably used. The insulating film containing silicon and nitrogen as main components has such a feature that water, hydrogen, oxygen, and the like are less likely to diffuse in the insulating film. Thus, when the third insulating layer is provided over the second insulating layer, the diffusion (release) of oxygen from the semiconductor layer and the second insulating layer to the outside can be suppressed. Therefore, an increase in the oxygen vacancy in the semiconductor layer can be suppressed.

For the third insulating layer, an oxide including an element X (X is one or more of aluminum, indium, gallium, and zinc) can be used, for example. In particular, an insulating film containing metal and oxygen as main components is preferably used. For example, aluminum oxide or In—Ga—Zn oxide can be used for the third insulating layer.

Furthermore, there is a case where a void portion is generated in the above second insulating layer. When the void portion exists, the impurities such as water or hydrogen diffuse through the void portion from the outside to the semiconductor layer, and the amount of hydrogen in the semiconductor layer increases in some cases. When the third insulating layer is provided over the second insulating layer to cover the void portion, the diffusion of the impurities from the outside to the semiconductor layer can be suppressed, and an increase in the amount of hydrogen in the semiconductor layer can be suppressed.

When the third insulating layer is provided over the second insulating layer, the amounts of oxygen vacancy, hydrogen, and VoH in the semiconductor layer can be reduced. Thus, a transistor with favorable electrical characteristics and high reliability can be manufactured.

A more specific example of one embodiment of the present invention is described below with reference to drawings. A transistor is described below as an example of the semiconductor device.

Structural Example 1

Figure 1B:
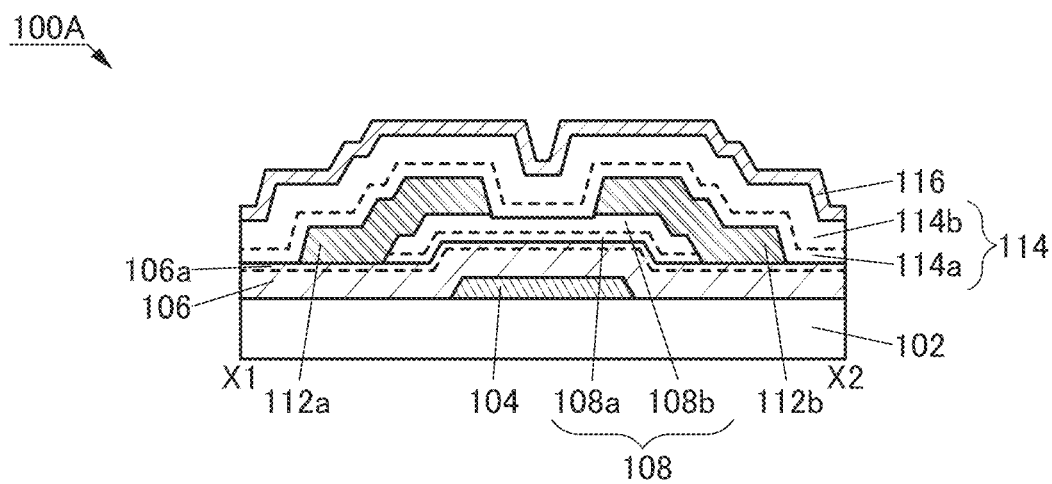
Figure 1C:
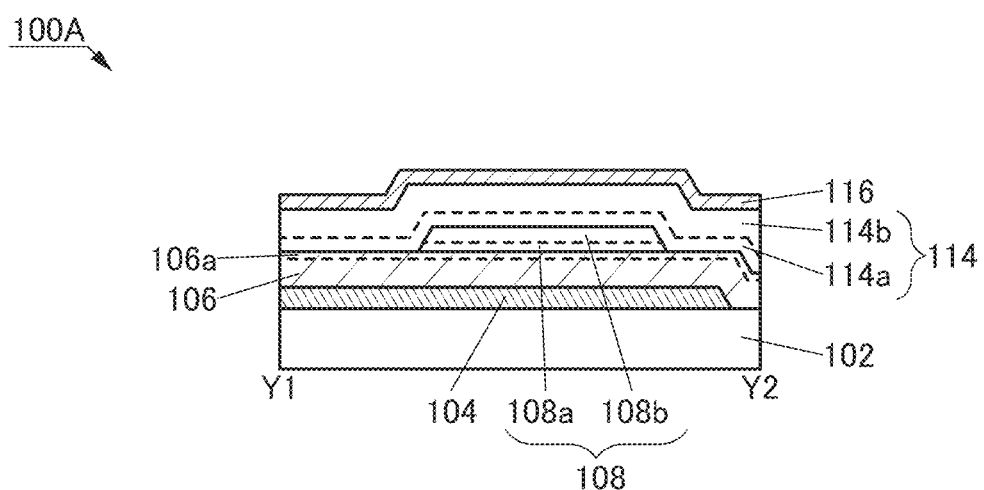

FIG. 1A is a top view of a transistor 100A that is a semiconductor device of one embodiment of the present invention, and FIGS. 1B and 1C are cross-sectional views thereof. FIG. 1B is a cross-sectional view taken along the dashed-dotted line X1-X2 in FIG. 1A, and FIG. 1C is a cross-sectional view taken along the dashed-dotted line Y1-Y2 in FIG. 1A. Note that in FIG. 1A, some components of the transistor 100A (e.g., an insulating layer and the like) are not illustrated to avoid complexity. The direction of the dashed-dotted line X1-X2 may be called a channel length direction, and the direction of the dashed-dotted line Y1-Y2 may be called a channel width direction. As in FIG. 1A, some components are not illustrated in some cases in top views of transistors described below.

The transistor 100A includes a conductive layer 104 over a substrate 102, an insulating layer 106 over the substrate 102 and the conductive layer 104, a metal oxide layer 108 over the insulating layer 106, and a conductive layer 112*a* and a conductive layer 112*b* which are provided over the metal oxide layer 108 to have a space therebetween and to be in contact with a top surface of the metal oxide layer 108. In addition, the transistor 100A includes an insulating layer 114 over the conductive layer 112*a*, the conductive layer 112*b*, and the metal oxide layer 108, and an insulating layer 116 over the insulating layer 114.

Part of the conductive layer 104 serves as a gate electrode. Part of the insulating layer 106 serves as a gate insulating layer. The conductive layer 112*a* serves as one of a source electrode and a drain electrode and the conductive layer 112*b* serves as the other of the source electrode and the drain electrode. The insulating layer 114 and the insulating layer 116 each serve as a protective layer.

Note that the transistor 100A is what is called a channel-etched transistor with a single gate structure.

As illustrated in FIGS. 1A to 1C, the metal oxide layer 108 preferably has a stacked structure of a first metal oxide layer 108a and a second metal oxide layer 108b over the first metal oxide layer 108a.

Each of the first metal oxide layer 108a and the second metal oxide layer 108b preferably includes a metal oxide. For each of the first metal oxide layer 108a and the second metal oxide layer 108b, the above-mentioned material can be used.

It is preferable that the metal oxide layers 108a and 108b each have a region where the atomic proportion of In is higher than the atomic proportion of M because the field-effect mobility of the transistor is increased in such a structure. For example, the atomic ratio of In to M and Zn in each of the metal oxide layers 108a and 108b is preferably In:M:Zn=4:2:3 or a neighborhood of In:M:Zn=4:2:3, or In:M:Zn=5:1:7 or a neighborhood of In:M:Zn=5:1:7. The term "neighborhood" includes the following: when In is 4, M is greater than or equal to 1.5 and less than or equal to 2.5, and Zn is greater than or equal to 2 and less than or equal to 4. Also the term "neighborhood" includes the following: when In is 5, M is greater than or equal to 0.5 and less than or equal to 1.5, and Zn is greater than or equal to 5 and less than or equal to 7. When the compositions of first metal oxide layer 108a and the second metal oxide layer 108b are substantially the same, they can be formed using the same sputtering target and the manufacturing cost can thus be reduced.

Furthermore, the atomic ratio of In to M and Zn in each of the metal oxide layers 108a and 108b can be In:M:Zn=1:1:1 or a neighborhood thereof. The term "neighborhood" includes the following: when In is 1, M is greater than or equal to 0.5 and less than or equal to 1.5, and Zn is greater than or equal to 0.1 and less than or equal to 2. It is preferable that the atomic proportions of In and M are substantially the same because with such an atomic ratio, it is possible to suppress the generation of oxygen vacancy in the metal oxide layers 108a and 108b. Thus, a transistor with favorable electrical characteristics and high reliability can be manufactured.

For the metal oxide layers 108a and 108b, it is particularly preferable to use stacked films deposited successively without exposure to the air using targets with the same compositions though it is also possible to use films deposited using targets with different compositions. When the layers are deposited successively, one deposition apparatus can be shared between a plurality of deposition steps, and remaining of impurities between the metal oxide layers 108a and 108b can be suppressed. The impurities in the metal oxide layer may serve as a carrier source. An increase in the amount of impurities is suppressed, whereby a transistor with favorable electrical characteristics and high reliability can be manufactured.

It is preferable that the second metal oxide layer 108b include a region having higher crystallinity than the first metal oxide layer 108a. Including such a high-crystallinity region, the second metal oxide layer 108b can have higher etching resistance than the first metal oxide layer 108a. Thus, it is possible to prevent the removal of the second metal oxide layer 108b due to etching when the conductive layer 112a and the conductive layer 112b are formed. As a result, a channel-etched transistor as illustrated in FIGS. 1A to 1C can be formed. Furthermore, when a high-crystallinity film is used for the second metal oxide layer 108b positioned on the back channel side of the transistor, the amount of impurities which may diffuse into the first metal oxide layer 108a positioned on the conductive layer 104 side. Thus, a transistor with favorable electrical characteristics and high reliability can be manufactured.

Furthermore, when the first metal oxide layer 108a includes a region having lower crystallinity than the second metal oxide layer 108b, oxygen easily diffuses into the first metal oxide layer 108a, and the proportion of oxygen vacancy in the first metal oxide layer 108a can be reduced. The first metal oxide layer 108a is positioned particularly closer to the conductive layer 104 and is a main layer in which a channel is easily formed. Thus, a film including a small amount of oxygen vacancy is used for the first metal oxide layer 108a, so that a transistor with favorable electrical characteristics and high reliability can be manufactured.

The first metal oxide layer 108a and the second metal oxide layer 108b can be independently formed, for example, with different deposition conditions. For example, the oxygen gas flow rate in the deposition gas can be varied between the first metal oxide layer 108a and the second metal oxide layer 108b.

In this case, as the deposition condition of the first metal oxide layer 108a, the proportion of oxygen gas flow rate (also referred to as oxygen gas flow rate ratio or oxygen partial pressure) in a whole deposition gas is higher than or equal to 0% and lower than or equal to 30%, preferably higher than or equal to 5% and lower than or equal to 15%. With the above oxygen flow rate ratio, the first metal oxide layer 108a can have low crystallinity.

On the other hand, as the deposition condition of the second metal oxide layer 108b, the oxygen flow rate ratio is higher than 30% and lower than or equal to 100%, preferably higher than or equal to 50% and lower than or equal to 100%, further preferably higher than or equal to 70% and lower than or equal to 100%. With the above oxygen flow rate ratio, the second metal oxide layer 108b can have high crystallinity.

Note that with the high oxygen flow rate ratio, a region with a spinel crystal structure is generated in the metal oxide layer in some cases. In the case where the metal oxide layer has a region with a spinel crystal structure, for example, the density of oxygen vacancies at the region and/or the interface between the region and another region might be high. Thus, as an oxygen flow rate ratio with which a region with a spinel crystal structure is not generated, for example, an oxygen flow rate ratio higher than 30% and lower than or equal to 50% may be used.

The substrate temperature at which the first metal oxide layer 108a or the second metal oxide layer 108b is formed is preferably higher than or equal to room temperature (25° C.) and lower than or equal to 200° C., further preferably higher than or equal to room temperature and lower than or equal to 130° C. With the substrate temperature in the above range, the bending or warpage of the substrate can be prevented in the case where the substrate is a large glass substrate. In the case where the metal oxide layers 108a and 108b are formed with the same substrate temperature, the productivity can be increased. In the case where the metal oxide layers 108a and 108b are formed with different substrate temperatures, for example, the substrate temperature in forming the second metal oxide layer 108b is higher than that in forming the first metal oxide layer 108a, the crystallinity of the second metal oxide layer 108b can be further increased.

For example, it is preferable that a CAC-OS film be used for the first metal oxide layer 108a and a CAAC-OS film be used for the second metal oxide layer 108b.

The crystallinity of the metal oxide layers 108a and 108b can be analyzed with X-ray diffraction (XRD), a transmission electron microscope (TEM), electron diffraction, or the like, for example.

The thickness of the first metal oxide layer 108a may be greater than or equal to 1 nm and less than or equal to 50 nm, preferably greater than or equal to 5 nm and less than or equal to 30 nm. The thickness of the second metal oxide layer 108b may be greater than 10 nm and less than or equal to 100 nm, preferably greater than or equal to 20 nm and less than or equal to 50 nm.

Note that there is a case in which boundaries (interfaces) between the first metal oxide layer 108a and the second metal oxide layer 108b are not clearly observed. Then, in the drawings illustrating one embodiment of the present invention, the boundaries are denoted by dashed lines.

When the oxygen vacancy and hydrogen included in the metal oxide layer 108 react with each other to generate VoH in the metal oxide layer 108, the carrier density increases in some cases. Thus, it is preferable that the amount of oxygen vacancy in the metal oxide layer 108 be as small as possible. Furthermore, it is preferable that the amount of impurities in the metal oxide layer 108 be as small as possible. In particular, it is preferable that the amount of impurities including hydrogen in the metal oxide layer 108 be as small as possible. When the amounts of oxygen vacancy and impurities are small, the generation of VoH in the metal oxide layer 108 can be suppressed. Therefore, a transistor with low carrier density, favorable electrical characteristics, and high reliability can be obtained.

The metal oxide layer 108 may have a single-layer structure. When the metal oxide layer 108 has a structure similar to that of the first metal oxide layer 108a, the amount of on-state current can be increased. Furthermore, when the metal oxide layer 108 has a structure similar to that of the second metal oxide layer 108b, the reliability of the transistor can be increased.

For the insulating layer 114, an insulating film containing oxygen, which is deposited in an atmosphere containing oxygen, can be used. The insulating film deposited in an atmosphere containing oxygen can easily release a large amount of oxygen by heating. Furthermore, the insulating layer 114 is preferably formed using a material with lower nitrogen concentration than the insulating layer 116. For example, an insulating film containing silicon and oxygen, an insulating film containing silicon, oxygen, and nitrogen, or the like is preferably used. In particular, a silicon oxide film or a silicon oxynitride film is further preferably used.

In this specification and the like, a silicon oxynitride film is a film containing silicon, oxygen, and nitrogen, in which the proportion of oxygen is higher than that of nitrogen. A silicon nitride oxide film is a film containing silicon, oxygen, and nitrogen, in which the proportion of nitrogen is higher than that of oxygen. Note that composition can be measured by Rutherford backscattering spectrometry (RBS) or the like, for example.

In the case where a silicon oxide film, a silicon oxynitride film, or the like is used as the insulating layer 114, it is preferably formed with a plasma-enhanced chemical vapor deposition (PECVD) apparatus. This is because the PECVD apparatus enables the deposition of an insulating film with high density, few defects, and preferable step coverage with a surface where the film is formed.

The insulating layer 114 may have a stacked structure including an insulating layer 114a and an insulating layer 114b over the insulating layer 114a. Each of the insulating layer 114a and the insulating layer 114b preferably has an excess oxygen region. When the insulating layer 114a and the insulating layer 114b each have an excess oxygen region, oxygen in the metal oxide layer 108 can be supplied. With the oxygen, the oxygen vacancy that may be generated in the metal oxide layer 108 can be filled, so that a transistor with favorable electrical characteristics and high reliability can be provided.

The insulating layer 114a in contact with part of the metal oxide layer 108 on the back channel side can be formed using an oxide film containing less nitrogen than the insulating layer 114b. The oxide film containing less nitrogen is used as the insulating layer 114a, which enables a structure in which a nitrogen oxide ($NO_x$ where x is greater than 0 and less than or equal to 2, preferably greater than or equal to 1 and less than or equal to 2, typically $NO_2$ or NO) which may cause formation of levels in the insulating layer 114a in contact with the metal oxide layer 108 is less likely to be formed. For formation of the insulating layer 114a, a PECVD apparatus can be used. As the deposition conditions of the insulating layer 114a, the power and the chamber pressure can be lower than those in formation of the insulating layer 114b as the.

Furthermore, the insulating layer 114a is an insulating film which can transmit oxygen. Note that the insulating layer 114a also serves as a film which alleviates damage to the metal oxide layer 108 at the time of forming the insulating layer 114b later.

The insulating layer 114b provided over the insulating layer 114a can be formed using an oxide film containing more excess oxygen (exO) than the insulating layer 114a. For formation of the insulating layer 114b, a PECVD apparatus can be used. In formation of the insulating layer 114b, the power and the chamber pressure can be higher than those in formation of the insulating layer 114a as deposition conditions. The substrate temperature at which the insulating layer 114b is formed is preferably higher than or equal to 180° C. and lower than or equal to 280° C. In the film formed at a substrate temperature within the above temperature range, a bond between silicon and oxygen is weak, and accordingly, part of oxygen in the film is released by heat treatment in a later step. Thus, it is possible to form a preferred insulating film which contains oxygen at a higher proportion than the stoichiometric composition and from which part of oxygen is released by heating.

In the case where the same kind of material is used for the insulating layer 114a and the insulating layer 114b, an interface between the insulating layer 114a and the insulating layer 114b is not clearly observed in some cases. For that reason, the interface between the insulating layer 114a and the insulating layer 114b is indicated by dashed lines in this embodiment. Although a two-layer structure of the insulating layer 114a and the insulating layer 114b is described in this embodiment, one embodiment of the present invention is not limited to this, and a single-layer structure of either the insulating layer 114a or the insulating layer 114b or a stacked-layer structure including three or more layers may be employed, for example.

Figure 2A:
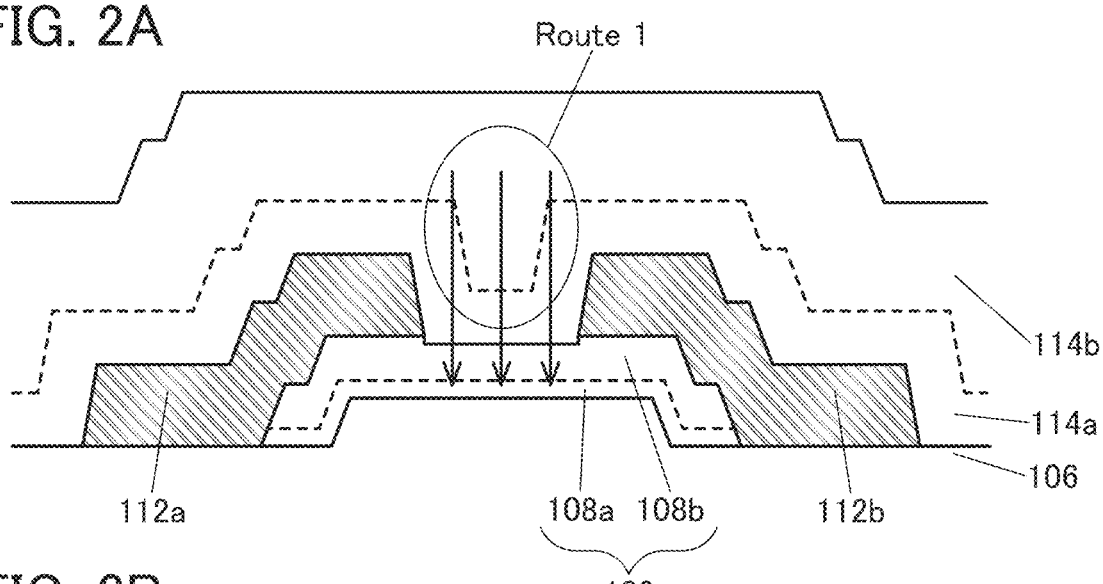
FIGS. 2A to 2C are conceptual diagrams showing paths of oxygen diffused into a semiconductor layer.
Figure 2B:
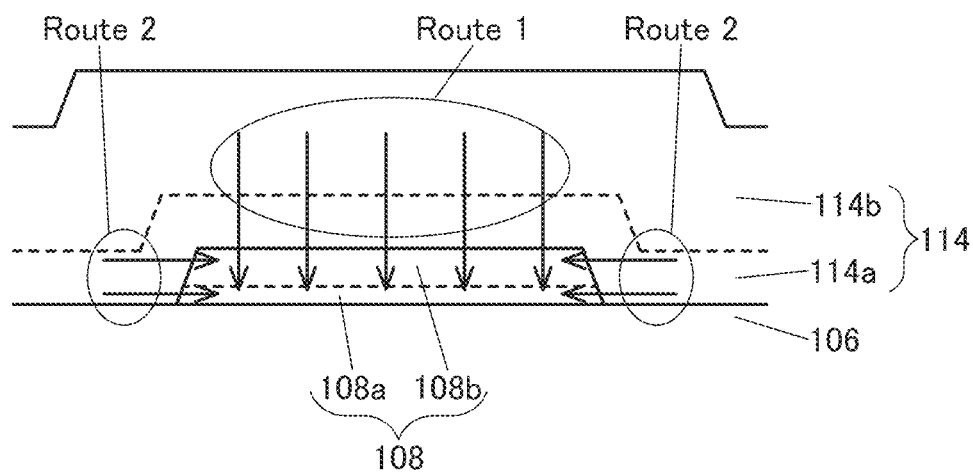

The path of oxygen diffused from the insulating layer 114 to the metal oxide layer 108 is described with reference to FIGS. 2A and 2B. FIGS. 2A and 2B are schematic views illustrating the paths of oxygen diffused into the metal oxide layer 108. FIG. 2A is the schematic view in the channel length direction and FIG. 2B is the schematic view in the channel width direction.

Oxygen in the insulating layers 114a and 114b is diffused to the first metal oxide layer 108a from above, i.e., through the second metal oxide layer 108b (Route 1 in FIGS. 2A and 2B).

Alternatively, oxygen in the insulating layers 114a and 114b is diffused into the metal oxide layer 108 from side surfaces of the metal oxide layers 108a and 108b (Route 2 in FIG. 2B).

For example, diffusion of oxygen by Route 1 shown in FIGS. 2A and 2B is sometimes prevented when the second metal oxide layer 108b has high crystallinity. In contrast, Route 2 in FIG. 2B enables oxygen to be diffused to the metal oxide layers 108a and 108b from the side surfaces of the metal oxide layers 108a and 108b.

When the first metal oxide layer 108a has a region with lower crystallinity than the second metal oxide layer 108b, the region serves as a diffusion path of oxygen. In that case, Route 2 in FIG. 2B enables oxygen to be diffused also to the second metal oxide layer 108b having higher crystallinity than the first metal oxide layer 108a. Although not illustrated in FIGS. 2A and 2B, when the insulating layer 106 and a region 106a include oxygen, the oxygen can be diffused to the metal oxide layer 108 also from the insulating layer 106 and the region 106a.

As described above, the metal oxide layer 108 has a stacked structure of films with different crystal structures, and a region with low crystallinity serves as a diffusion path of oxygen, whereby a transistor with favorable electrical characteristics and high reliability can be provided.

When the insulating layer 114 is provided over the metal oxide layer 108, the metal oxide layer 108 has a concentration gradient of oxygen in the thickness direction, and the oxygen concentration becomes higher on the insulating layer 114 side in some cases. Examples of an elementary analysis method include energy dispersive X-ray spectroscopy (EDX), secondary ion mass spectrometry (SIMS), X-ray photoelectron spectroscopy (XPS), and Auger electron spectroscopy (AES).

Figure 2C:
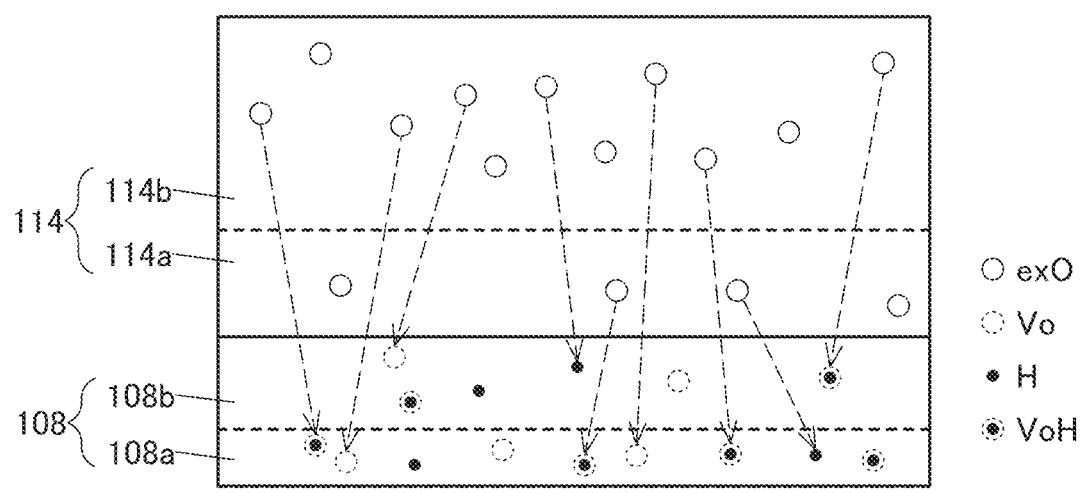

Oxygen diffused from the insulating layers 114a and 114b to the metal oxide layers 108a and 108b is described with reference to FIG. 2C. As shown in FIG. 2C, oxygen vacancy (Vo), hydrogen (H), and a state where hydrogen is bonded to oxygen vacancy (VoH) may exist in the metal oxide layers 108a and 108b. When oxygen in the insulating layers 114a and 114b approaches the oxygen vacancy in the metal oxide layers 108a and 108b, the oxygen vacancy traps the oxygen and is filled with the oxygen. When oxygen approaches the hydrogen, the oxygen and the hydrogen react with each other to be water ($H_2O$) and are released as water molecules from the metal oxide layers 108a and 108b. When oxygen approaches the VoH, the oxygen vacancy is filled with the oxygen. Furthermore, hydrogen in the VoH reacts with another oxygen to be water and is released as water from the metal oxide layers 108a and 108b. In the above manner, with the oxygen in the insulating layers 114a and 114b, the amounts of the oxygen vacancy, hydrogen, and VoH in the metal oxide layers 108a and 108b can be reduced. Thus, a transistor with favorable electrical characteristics and high reliability can be manufactured.

Here, the following case is considered: hydrogen is released from the metal oxide layers 108a and 108b in a state where the insulating layer 114 containing excess oxygen is not provided. In that case, hydrogen in the metal oxide layers 108a and 108b may be bonded to oxygen in the metal oxide layers 108a and 108b and released as water molecules. Such a case is not preferable because oxygen vacancy is generated by release of oxygen in the metal oxide layers 108a and 108b.

In contrast, the following case is considered: hydrogen is released from the metal oxide layers 108a and 108b in a state where the insulating layer 114 containing excess oxygen is provided as shown in this embodiment. Hydrogen in the metal oxide layers 108a and 108b reacts with oxygen supplied from the insulating layer 114 and is released as water molecules. When the hydrogen reacts with the oxygen supplied from the insulating layer 114, additional generation of oxygen vacancy in the metal oxide layers 108a and 108b can be suppressed; this case is preferable.

When oxygen is supplied from the insulating layers 114a and 114b to the metal oxide layers 108a and 108b, the amounts of oxygen vacancy, hydrogen, and VoH in the metal oxide layers 108a and 108b can be reduced. In addition, the generation of oxygen vacancy and VoH in the metal oxide layers 108a and 108b can be suppressed, which enables a transistor with favorable electrical characteristics and high reliability to be manufactured.

It is preferable that the insulating layer 114b be formed in vacuum successively after formation of the insulating layer 114a, without exposure of the surface of the insulating layer 114a to the air. With successive formation, attachment of impurities attributed to atmospheric components to the surface of the insulating layer 114a can be suppressed.

Over the insulating layer 114b, the insulating layer 116 is preferably formed using an insulating film through which oxygen is less likely to be diffused and transmitted. Furthermore, an insulating film used for the insulating layer 116 is preferably an insulating film from which the amount of released impurities is small and through which impurities are less likely to be diffused and transmitted. In particular, the insulating layer 116 is preferably an insulating film from which the amount of released impurities including hydrogen is small and through which impurities are less likely to be diffused and transmitted. With the insulating layer 116, the carrier density of the metal oxide layer 108 can be low, whereby a transistor with favorable electrical characteristics and high reliability can be obtained.

As the insulating layer 116, an insulating film including silicon and nitrogen can be used. In particular, an insulating film containing silicon and nitrogen as main components is preferably used. For example, a stacked layer or a single layer of a silicon nitride film, a silicon nitride oxide film, and/or the like can be used.

Alternatively, for the insulating layer 116, an oxide including an element X (X is one or more of aluminum, indium, gallium, and zinc) can be used. In particular, an insulating film containing a metal and oxygen as main components is preferably used. For example, aluminum oxide or an In—Ga—Zn oxide can be used for the insulating layer 116. It is further preferable to use a gas containing oxygen for formation of the insulating layer 116. With the gas containing oxygen, oxygen can be supplied to the insulating layer 114b over which the insulating layer 116 is formed. As described above, the oxygen supplied from the insulating layer 114b enables a reduction in the amounts of oxygen vacancy, hydrogen, and VoH in the metal oxide layer 108. Thus, a transistor with favorable electrical characteristics and high reliability can be provided.

Heat treatment is performed in a state where an insulating film (the insulating layers 114a and 114b) from which oxygen is released and an insulating film (the insulating layer 116) through which oxygen is less likely to be diffused and transmitted are stacked, whereby oxygen can be supplied to the metal oxide layer 108 effectively. As a result, oxygen vacancy in the metal oxide layer 108 can be filled and defects at the interface between the metal oxide layer 108 and the insulating layer 114 can be repaired, leading to a reduction in defect states. Thus, a transistor with favorable electrical characteristics and high reliability can be manufactured.

Figure 3A:
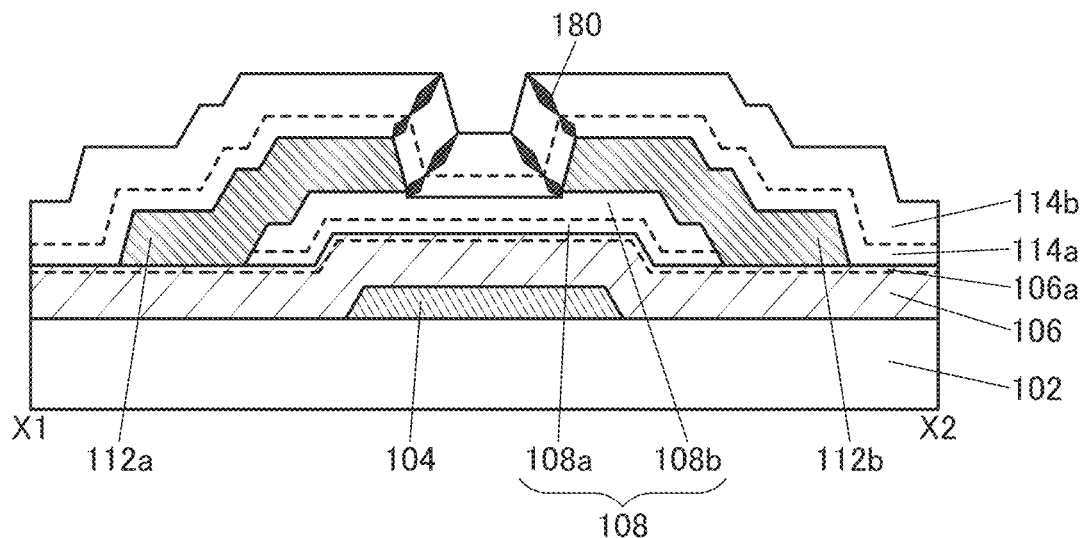
FIGS. 3A and 3B are cross-sectional views each illustrating an example of a void portion.
Figure 3B:
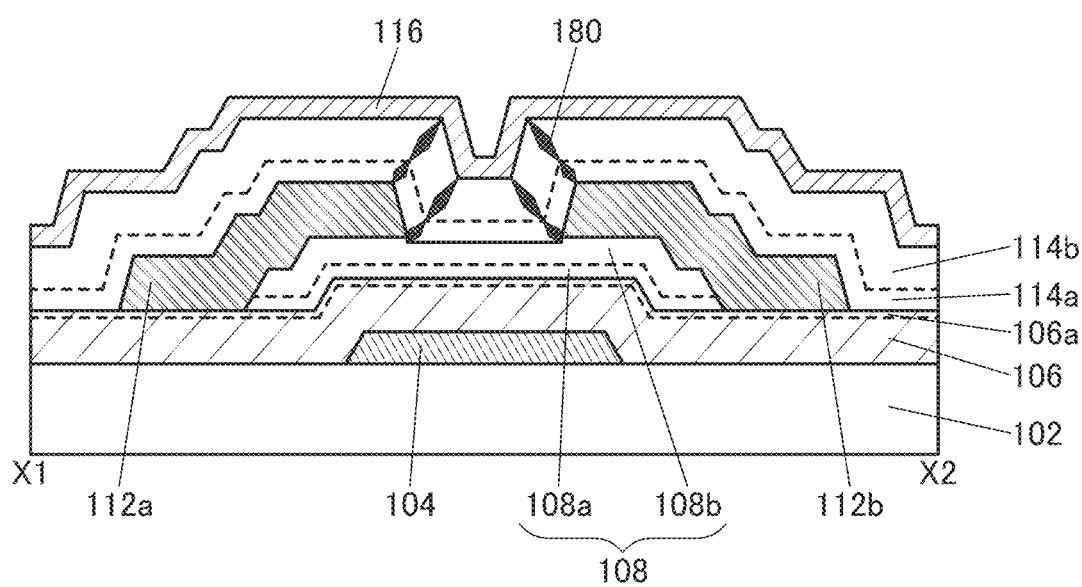

In the case of the insulating layers 114a and 114b described above, a void portion 180 is generated in the insulating layers 114a and 114b in some cases. As illustrated in FIG. 3A, the void portions 180 are likely to be generated particularly in step portions of the insulating layers 114a and 114b. The step portions are caused by the conductive layer 112a and the conductive layer 112b. When the void portions 180 exist in the insulating layers 114a and 114b, impurities diffuse from the outside or a layer formed in a later step to the metal oxide layer 108 in some cases. As illustrated in FIG. 3B, when the insulating layer 116 is provided over the insulating layers 114a and 114b, diffusion of the impurities to the metal oxide layer 108 can be suppressed. Furthermore, a release of oxygen from the metal oxide layer 108 and diffusion of the oxygen to the outside can be suppressed. The diffusion of oxygen to the outside is suppressed, which enables an increase in the amounts of oxygen vacancy, hydrogen, and VoH in the metal oxide layer 108 to be suppressed. Thus, a transistor with favorable electrical characteristics and high reliability can be manufactured.

After the insulating layer 114b is formed, the insulating layer 116 is preferably formed in vacuum successively without exposure of the surface of the insulating layer 114b to the air. With successive formation, attachment of impurities attributed to atmospheric components to the surface of the insulating layer 114b can be suppressed. It is further preferable that the insulating layer 114a, the insulating layer 114b, and the insulating layer 116 be successively formed in vacuum because attachment of impurities attributed to atmospheric components to the surfaces of the insulating layers 114a and 114b can be suppressed.

For the insulating layer 106, an insulating film through which impurities such as hydrogen or oxygen are less likely to be diffused can be used. For example, an insulating film with high barrier properties, such as a nitride insulating film, can be used. In particular, an insulating film containing silicon and nitrogen as main components is preferably used.

The insulating layer 106 includes the region 106a in the vicinity of a top surface of the insulating layer 106. In FIGS. 1B and 1C, an interface of the region 106a is indicated by a dashed line. The region 106a is a region having a higher oxygen concentration than the other region in the insulating layer 106. Note that it is preferable the region other than the region 106a in the insulating layer 106 not contain oxygen as a main component. Furthermore, it is preferable that the region 106a be a region having lower hydrogen concentration than the other region in the insulating layer 106. The metal oxide layer 108 is provided to be in contact with the region 106a.

The region 106a can have a thickness greater than or equal to 1 nm and less than or equal to 10 nm.

In a structure where the region 106a containing a large amount of oxygen is in contact with the metal oxide layer 108, formation of defect states at an interface between the region 106a and the metal oxide layer 108 can be suppressed. Thus, with the stacked structure of the region 106a and the metal oxide layer 108, the transistor 100A can have favorable electrical characteristics.

When the metal oxide layer 108 is provided over the region 106a, the metal oxide layer 108 has a concentration gradient of oxygen in the thickness direction, and the oxygen concentration becomes higher on the region 106a side in some cases. Furthermore, as described above, in the metal oxide layer 108, the oxygen concentration becomes higher on the insulating layer 114 side in some cases. In other words, the metal oxide layer 108 has a concentration gradient of oxygen in the thickness direction, and the oxygen concentration on the region 106a side and the oxygen concentration on the insulating layer 114 side become higher in some cases. Examples of an elementary analysis method include energy dispersive X-ray spectroscopy (EDX), secondary ion mass spectrometry (SIMS), X-ray photoelectron spectroscopy (XPS), and Auger electron spectroscopy (AES).

Furthermore, in the transistor 100A, the stacked structure of the region 106a, the metal oxide layer 108, and the insulating layer 114 are sandwiched between the insulating layer 106 and the insulating layer 116. Each of the insulating layer 106 and the insulating layer 116 is a layer through which water, hydrogen, oxygen, and the like are less likely to be diffused. Thus, the insulating layer 106 and the insulating layer 116 prevent the diffusion of water and hydrogen from the outside to the metal oxide layer 108 and the diffusion (release) of oxygen from the metal oxide layer 108 to the outside. As a result, the transistor 100A can have high reliability as well as favorable electrical characteristics.

The presence of the region 106a can be confirmed by elementary analysis of a region including an interface between the insulating layer 106 and the metal oxide layer 108, for example. At this time, a large amount of oxygen is detected in a region in the insulating layer 106 closer to the metal oxide layer 108. Furthermore, a region with higher oxygen concentration is observed in the vicinity of the interface between the insulating layer 106 and the metal oxide layer 108 in some cases. Moreover, a region with lower hydrogen concentration than the other part may be observed in a region in the insulating layer 106 closer to the metal oxide layer 108. Examples of an elementary analysis method include energy dispersive X-ray spectroscopy (EDX), secondary ion mass spectrometry (SIMS), X-ray photoelectron spectroscopy (XPS), and Auger electron spectroscopy (AES). Furthermore, in some cases, the region 106a can be observed in a cross-sectional image of a transmission electron microscope (TEM) as a region with a different contrast from the other parts.

The above is the description of Structural Example 1.

A structure example of a transistor partly different from Structural Example 1 described above will be described below. Note that description of the same portions as those in Structural Example 1 described above is skipped or simplified in some cases. In the drawings that are referred to later, the same hatching pattern is applied to portions having functions similar to those in Structural Example 1 described above, and the portions are not denoted by reference numerals in some cases.

Structural Example 2

Figure 4A:
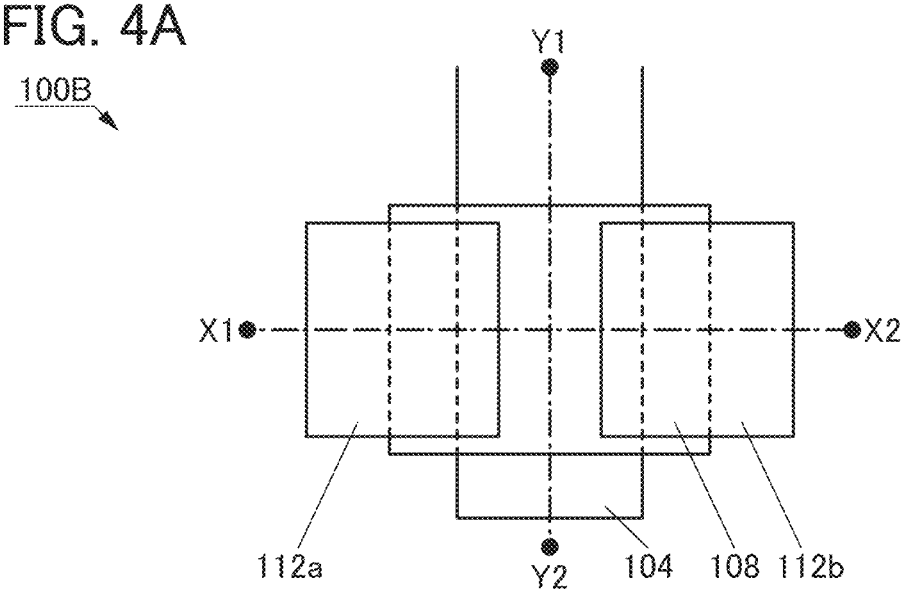
FIGS. 4A to 4C illustrate a structure example of a semiconductor device.
Figure 4B:
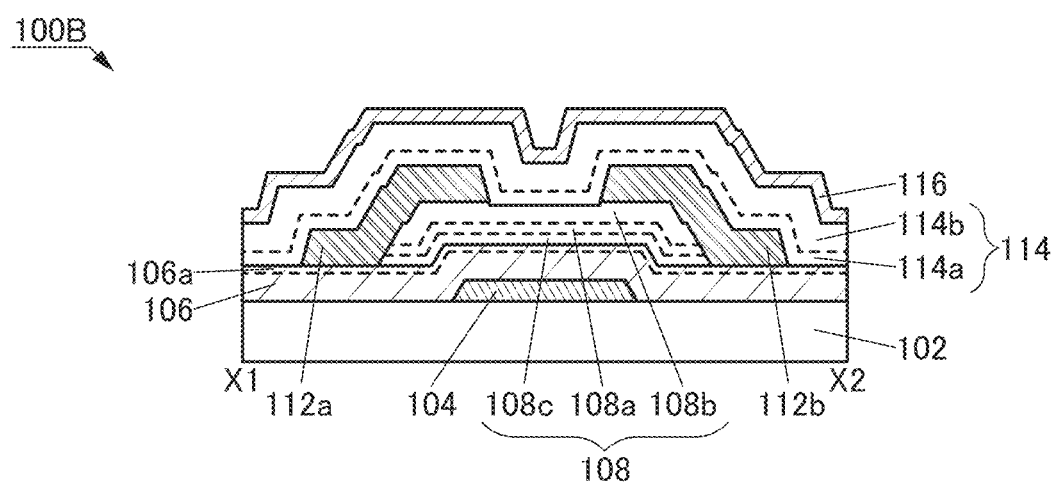
Figure 4C:
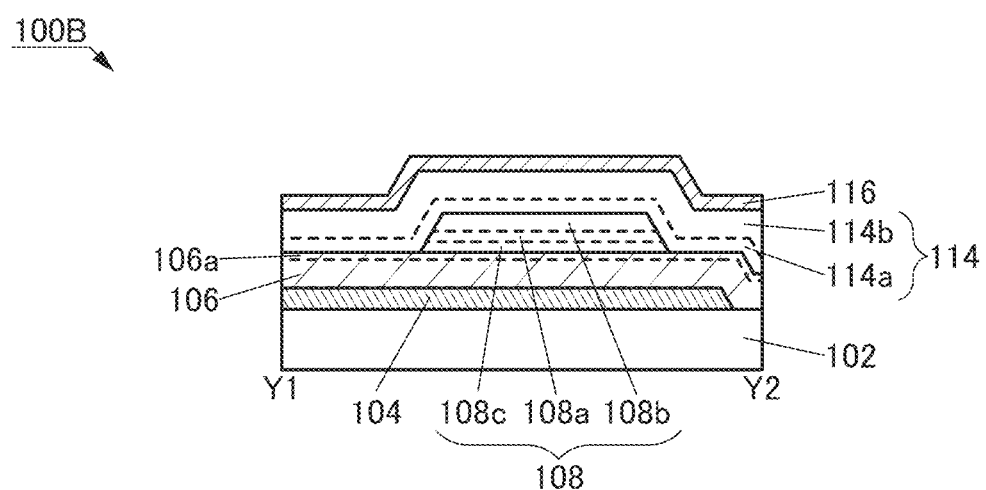

A top view of a transistor 100B that is a semiconductor device of one embodiment of the present invention is illustrated in FIG. 4A, and cross-sectional views thereof are illustrated in FIGS. 4B and 4C. FIG. 4B is the cross-sectional view taken along the dashed-dotted line X1-X2 in FIG. 4A, and FIG. 4C is the cross-sectional view taken along the dashed-dotted line Y1-Y2 in FIG. 4A.

The transistor 100B has differs from the transistor 100A described in Structural Example 1 in that the metal oxide layer 108 includes the first metal oxide layer 108a, the second metal oxide layer 108b, and a third metal oxide layer 108c.

As illustrated in FIGS. 4A to 4C, the metal oxide layer 108 preferably has a stacked structure of the third metal oxide layer 108c, the first metal oxide layer 108a over the third metal oxide layer 108c, and the second metal oxide layer 108b over the first metal oxide layer 108a.

Each of the first metal oxide layer 108a, the second metal oxide layer 108b, and the third metal oxide layer 108c preferably includes a metal oxide. For the third metal oxide layer 108c, a material that can be used for the first and second metal oxide layers 108a and 108b can be used.

For the first metal oxide layer 108a, the second metal oxide layer 108b and the third metal oxide layer 108c, it is particularly preferable to use stacked films deposited successively without exposure to the air using targets with the same composition, although it is also possible to use films deposited using targets with different compositions. When the layers are deposited successively, one deposition apparatus can be shared between a plurality of deposition steps, remaining of impurities between the third metal oxide layer 108c and the first metal oxide layer 108a and between the first metal oxide layer 108a and the second metal oxide layer 108b can be suppressed. The impurities in the metal oxide layer may serve as a carrier source. An increase in the amount of impurities is suppressed, whereby a transistor with favorable electrical characteristics and high reliability can be manufactured.

It is preferable that the third metal oxide layer 108c and the second metal oxide layer 108b include a region having higher crystallinity than the first metal oxide layer 108a. When the third metal oxide layer 108c has a high crystallinity region, the diffusion of impurities from the layers below the third metal oxide layer 108c (e.g., the insulating layer 106, the conductive layer 104, or the substrate 102) to the first metal oxide layer 108a can be suppressed.

The first metal oxide layer 108a, the second metal oxide layer 108b, and the third metal oxide layer 108c can be independently formed, for example, with different deposition conditions. For example, the oxygen gas flow rate in the deposition gas can be varied between the first metal oxide layer 108a, the second metal oxide layer 108b, and the third metal oxide layer 108c.

In this case, as the deposition condition of the first metal oxide layer 108a, the proportion of oxygen gas flow rate (also referred to as oxygen gas flow rate ratio or oxygen partial pressure) in a whole deposition gas is higher than or equal to 0% and lower than or equal to 30%, preferably higher than or equal to 5% and lower than or equal to 15%. With the above oxygen flow rate ratio, the first metal oxide layer 108a can have low crystallinity.

On the other hand, as the deposition condition of each of the second metal oxide layer 108b and the third metal oxide layer 108c, the oxygen flow rate ratio is higher than 30% and lower than or equal to 100%, preferably higher than or equal to 50% and lower than or equal to 100%, further preferably higher than or equal to 70% and lower than or equal to 100%. With the above oxygen flow rate ratio, the second metal oxide layer 108b and the third metal oxide layer 108c can have high crystallinity. Note that the oxygen flow rate ratios of the second metal oxide layer 108b and the third metal oxide layer 108c may be the same as each other or different from each other.

With the above oxygen flow rate ratio, oxygen can be added into the insulating layer 106 over which the third metal oxide layer 108c is formed while the third metal oxide layer 108c is being formed. The oxygen added into the insulating layer 106 may diffuse through the metal oxide layer 108 as excess oxygen. Thus, the amounts of oxygen vacancy, hydrogen, and VoH in the metal oxide layer can be reduced.

The substrate temperature at which the first metal oxide layer 108a, the second metal oxide layer 108b, or the third metal oxide layer 108c is formed is preferably higher than or equal to room temperature (25° C.) and lower than or equal to 200° C., further preferably higher than or equal to room temperature and lower than or equal to 130° C. With the substrate temperature in the above range, the bending or warpage of the substrate can be prevented in the case where the substrate is a large glass substrate. In the case where the first metal oxide layer 108a, the second metal oxide layer 108b, and the third metal oxide layer 108c are formed with the substrate temperature, the productivity can be increased. In the case where the first metal oxide layer 108a, the second metal oxide layer 108b, and the third metal oxide layer 108c are formed with different substrate temperatures, the substrate temperatures in forming the second metal oxide layer 108b and the third metal oxide layer 108c are higher than that in forming the first metal oxide layer 108a, whereby the crystallinity of the second metal oxide layer 108b and the third metal oxide layer 108c can be further increased.

For example, it is preferable that a CAC-OS film be used for the first metal oxide layer 108a and a CAAC-OS film be used for the second metal oxide layer 108b and the third metal oxide layer 108c.

The thickness of the third metal oxide layer 108c is greater than or equal to 1 nm and less than or equal to 50 nm, preferably greater than or equal to 1 nm and less than or equal to 10 nm. The thickness of the first metal oxide layer 108a is greater than or equal to 1 nm and less than or equal to 50 nm, preferably greater than or equal to 5 nm and less than or equal to 20 nm. The thickness of the second metal oxide layer 108b is greater than 5 nm and less than or equal to 100 nm, preferably greater than or equal to 5 nm and less than or equal to 30 nm.

Note that boundaries (interfaces) of the first metal oxide layer 108a, the second metal oxide layer 108b, and the third metal oxide layer 108c are not clearly observed in some cases. Then, in the drawings illustrating one embodiment of the present invention, the boundaries are denoted by dashed lines.

Structural Example 3

Figure 5A:
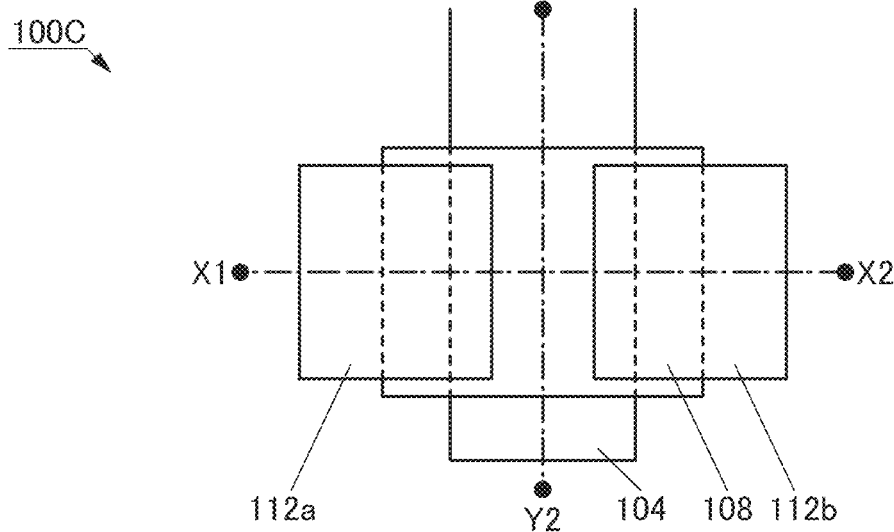
FIGS. 5A to 5C illustrate a structure example of a semiconductor device.
Figure 5B:
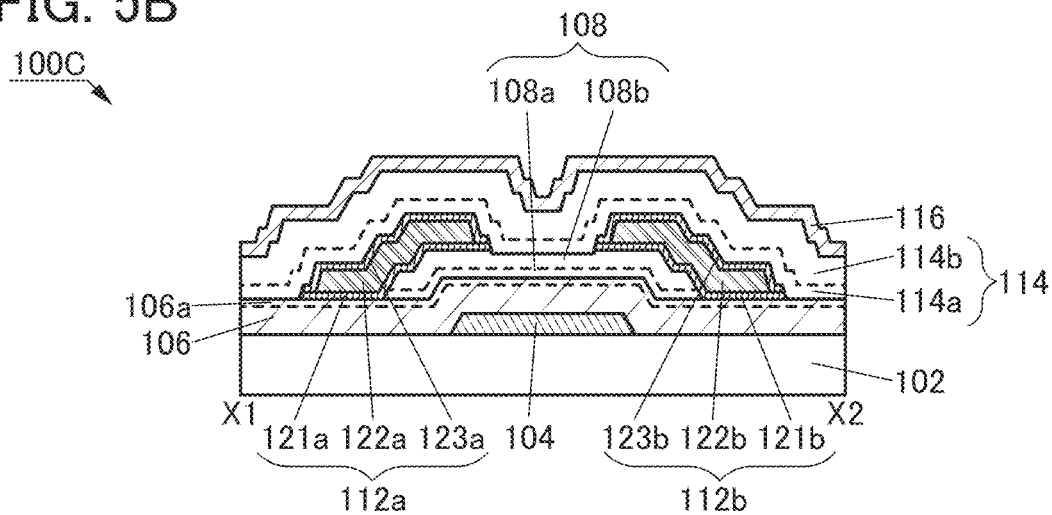
Figure 5C:
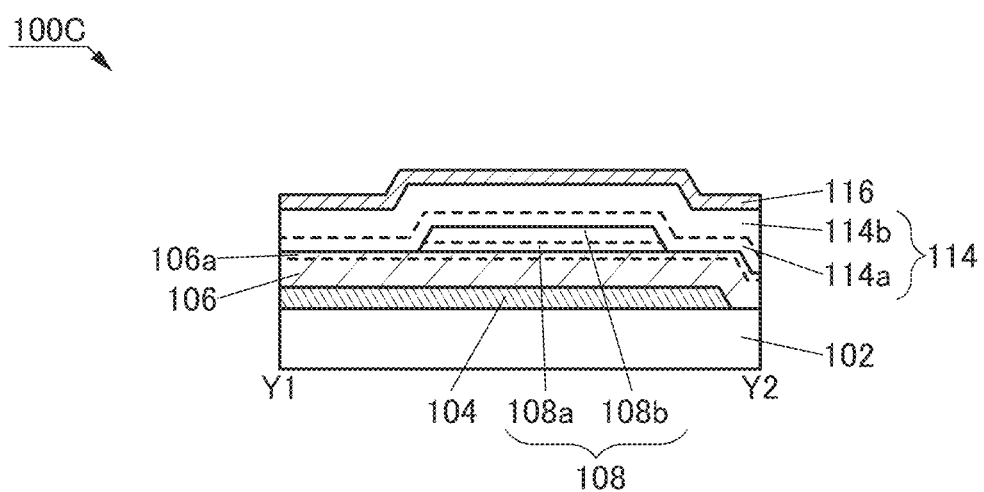

A top view of a transistor 100C that is a semiconductor device of one embodiment of the present invention is illustrated in FIG. 5A, and cross-sectional views thereof are illustrated in FIGS. 5B and 5C. FIG. 5B is the cross-sectional view taken along the dashed-dotted line X1-X2 in FIG. 5A, and FIG. 5C is the cross-sectional view taken along the dashed-dotted line Y1-Y2 in FIG. 5A.

The transistor 100C is different from the transistor 100A described in Structural Example 1 in that each of the conductive layer 112a and the conductive layer 112b has a stacked structure.

The conductive layer 112a has a structure in which a conductive layer 121a, a conductive layer 122a, and a conductive layer 123a are stacked in this order. The conductive layer 112b has a structure in which a conductive layer 121b, a conductive layer 122b, and a conductive layer 123b are stacked in this order.

The conductive layer 121a and the conductive layer 121b are provided to cover side surfaces of the first metal oxide layer 108a and a top surface and side surfaces of the second metal oxide layer 108b. Furthermore, the conductive layer 121a and the conductive layer 121b are provided to be over and in contact with the region 106a in the insulating layer 106. The conductive layer 122a and the conductive layer 122b are provided over the conductive layer 121a and the conductive layer 121b, respectively. In a plane view, the conductive layer 122a and the conductive layer 122b are located on an inner side than the conductive layer 121a and the conductive layer 121b are. The conductive layer 123a and the conductive layer 123b are provided over the conductive layer 122a and the conductive layer 122b, respectively. The conductive layer 123a and the conductive layer 123b are provided to cover top surfaces and side surfaces of the conductive layer 122a and the conductive layer 122b. Furthermore, part of the conductive layer 123a and part of the conductive layer 123b are provided to be over and in contact with the conductive layer 121a and the conductive layer 121b, respectively. In the plan view, end portions of the conductive layer 121a and the conductive layer 123a are aligned with each other. In the plan view, end portions of the conductive layer 121b and the conductive layer 123b are aligned with each other.

In such a structure, the conductive layer 122a can be surrounded by the conductive layer 121a and the conductive layer 123a, and the conductive layer 122b can be surrounded by the conductive layer 121b and the conductive layer 123b. In other words, the surfaces of the conductive layer 122a and the conductive layer 122b are not exposed. A material that can be likely to diffuse to the metal oxide layer 108 can be used for the conductive layer 122a and the conductive layer 122b.

Each of the conductive layer 122a and the conductive layer 122b is preferably formed using a material with lower resistance than those of the conductive layers 121a and 121b and the conductive layers 123a and 123b. Furthermore, each of the conductive layers 121a and 121b and the conductive layers 123a and 123b can be formed using a material that is less likely to diffuse in the metal oxide layer 108 than the material used for each of the conductive layers 122a and 122b.

Each of the conductive layer 122a and the conductive layer 122b can be formed using at least a conductive material different from those of the conductive layers 121a and 121b and the conductive layers 123a and 123b. Note that the conductive material used for the conductive layers 121a and 121b can be different from the conductive material used for the conductive layers 123a and 123b. It is particularly preferable that the conductive layers 121a and 121b and the conductive layers 123a and 123b be formed using the same conductive material because the same manufacturing apparatus can be used and the contact resistance at the end portions can be reduced.

For example, for each of the conductive layers 121a and 121b and the conductive layers 123a and 123b, a titanium film or a molybdenum film is preferably used. For each of the conductive layers 122a and 122b, an aluminum film or a copper film is preferably used. With such a structure, wiring resistance of the conductive layers 112a and 112b can be lowered, and a transistor with favorable electrical characteristics can be provided.

The above is the description of Structural Example 3.

Structural Example 4

Figure 6A:
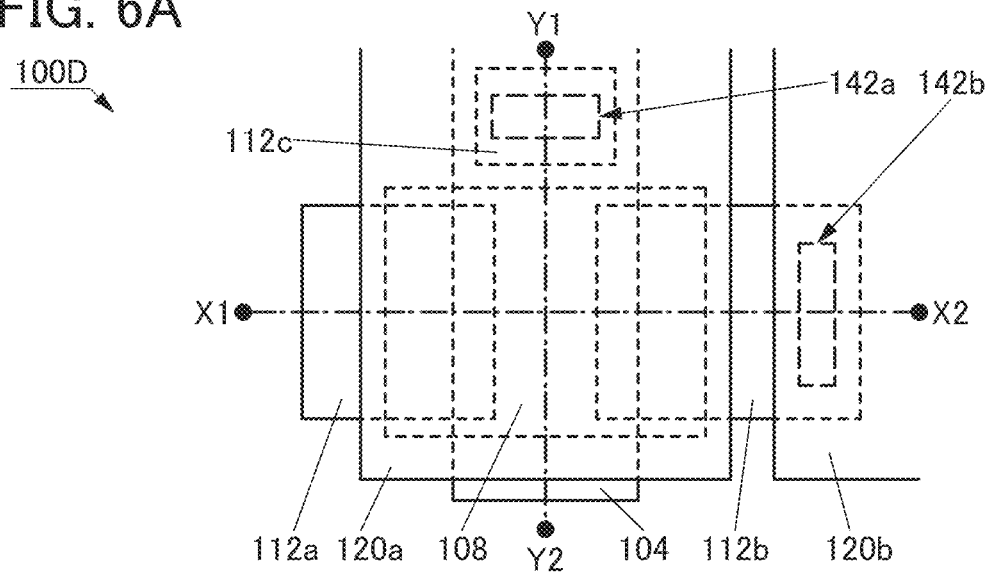
FIGS. 6A to 6C illustrate a structure example of a semiconductor device.
Figure 6B:
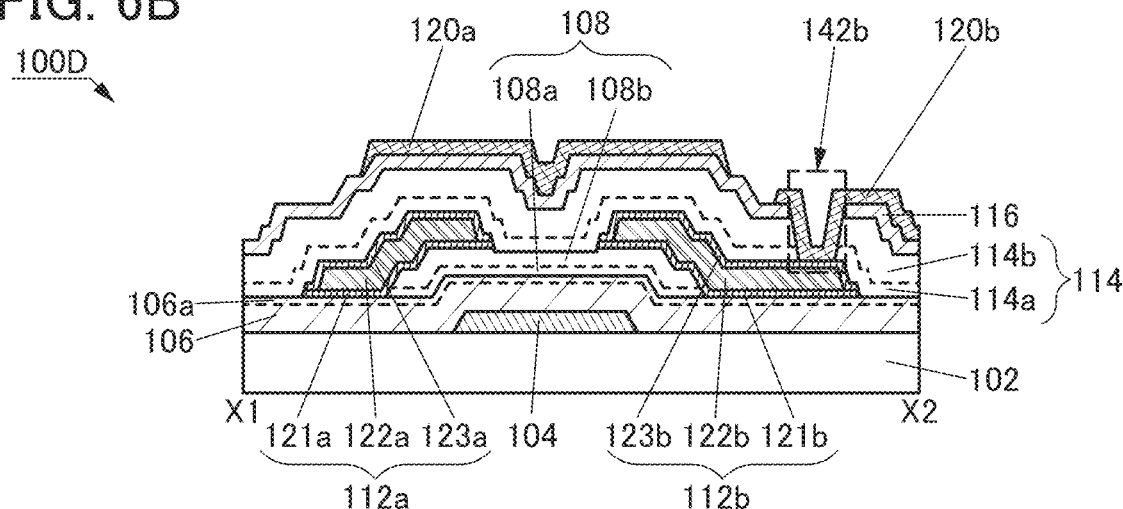
Figure 6C:
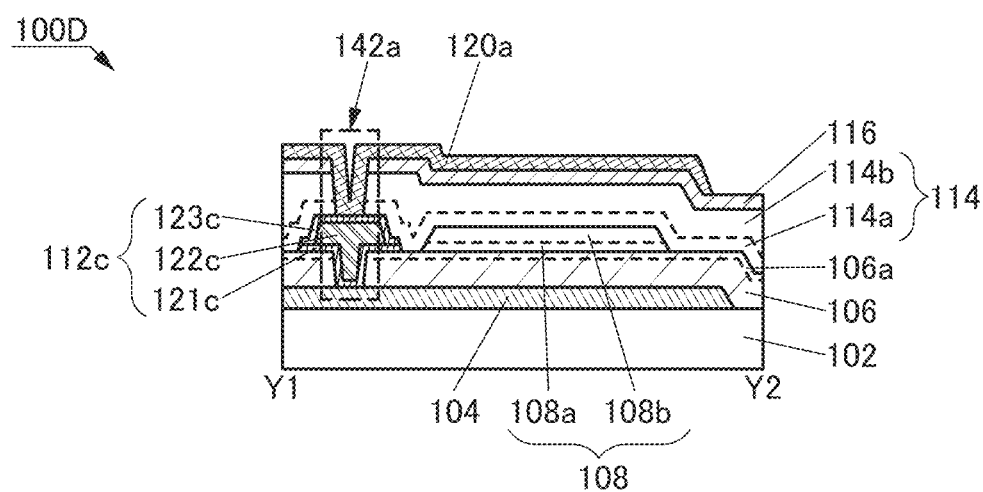

A top view of a transistor 100D that is a semiconductor device of one embodiment of the present invention is illustrated in FIG. 6A, and cross-sectional views thereof are illustrated in FIGS. 6B and 6C. FIG. 6B is the cross-sectional view taken along the dashed-dotted line X1-X2 in FIG. 6A, and FIG. 6C is the cross-sectional view taken along the dashed-dotted line Y1-Y2 in FIG. 6A.

The transistor 100D has differs from the transistor 100C described in Structural Example 3 in that a conductive layer 120a, a conductive layer 120b, and a conductive layer 112c are provided.

The conductive layer 120a has a region that is provided over the insulating layer 116 and overlaps with the metal oxide layer 108. The conductive layer 104 serves as a first gate, and the conductive layer 120a serves as a second gate. Part of the insulating layer 106 serves as a first gate insulating layer, and part of the insulating layer 114 and part of the insulating layer 116 serve as a second gate insulating layer. The transistor 100D is a transistor including a pair of gate electrodes.

The transistor 100D is what is called a channel-etched dual-gate transistor.

The conductive layer 120b is electrically connected to the conductive layer 123b in the conductive layer 112b through a connection portion 142b. In the connection portion 142b, the conductive layer 120b is electrically connected to the conductive layer 123b in the conductive layer 112b through an opening provided in the insulating layer 116 and the insulating layer 114.

It is preferable that the conductive layer 120a and the conductive layer 104 be electrically connected through a connection portion 142a as illustrated in FIG. 6C. In the connection portion 142a, a conductive layer 121c, a conductive layer 122c, and a conductive layer 123c are provided. In the connection portion 142a, the conductive layer 120a is electrically connected to the conductive layer 123c through an opening provided in the insulating layer 114 and the insulating layer 116, and the conductive layer 121c is electrically connected to the conductive layer 104 through an opening provided in the insulating layer 106.

The metal oxide layer 108 in the transistor 100D is sandwiched between the conductive layer 104 and the conductive layer 120a. Each of the conductive layer 104 and the conductive layer 120a has a larger length in the channel length direction and a larger length in the channel width direction than the metal oxide layer 108. Accordingly, the metal oxide layer 108 is covered with the conductive layer 104 and the conductive layer 120a with the insulating layer 106, the insulating layer 114, and the insulating layer 116 provided between the metal oxide layer 108 and the conductive layers 104 and 120a. In other words, the conductive layer 104 and the conductive layer 120a surround the metal oxide layer 108 in the channel width direction of the transistor 100D.

In such a structure, the metal oxide layer 108 included in the transistor 100D can be electrically surrounded by electric fields of the conductive layers 104 and 120a. A device structure of a transistor like that of the transistor 100D, in which electric fields of the conductive layers 104 and 120a electrically surround a metal oxide layer where a channel region is formed can be referred to as a surrounded channel (s-channel) structure.

Since the transistor 100D has an s-channel structure, an electric field for inducing a channel can be effectively applied to the metal oxide layer 108 from the conductive layers 104 and 120a. Accordingly, the driving capability of the transistor 100D is increased, so that high on-state current characteristics can be obtained. Owing to a high on-state current, it is possible to reduce the size of the transistor

100D. Furthermore, since the transistor 100D has a structure in which the metal oxide layer 108 is surrounded by the conductive layers 104 and 120a, the mechanical strength of the transistor 100D can be increased.

In the above-described structure, regions where carriers flow in the metal oxide layer 108 are formed on both the conductive layer 104 side of the metal oxide layer 108 and the conductive layer 120a side of the metal oxide layer 108, so that carriers flow in a wide region and the amount of moving carriers in the transistor 100D increases. The on-state current of the transistor 100D can be higher than that when a predetermined potential is applied to any one of the conductive layer 104 and the conductive layer 120a.

Figure 7A:
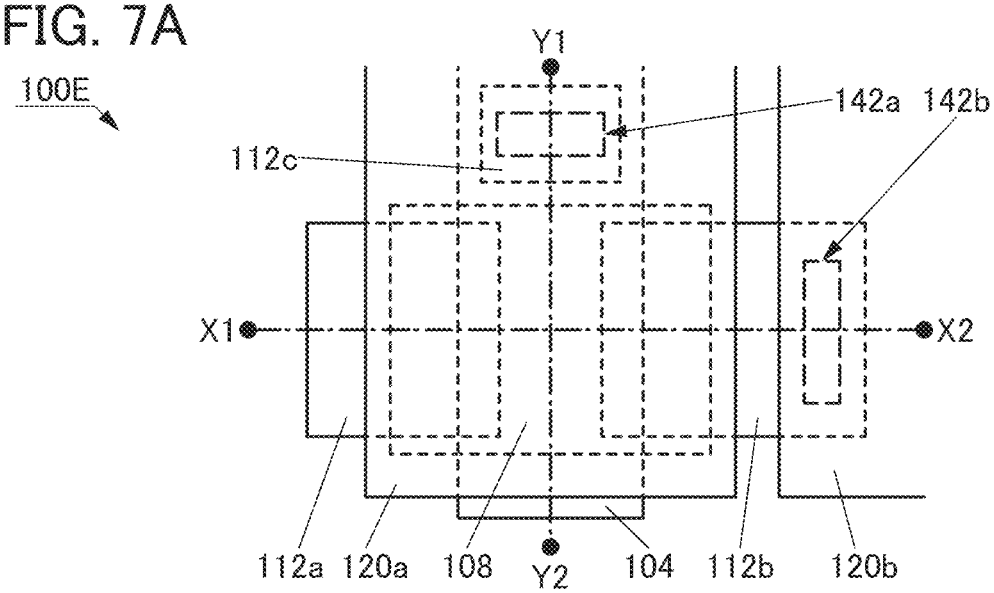
FIGS. 7A to 7C illustrate a structure example of a semiconductor device.
Figure 7B:
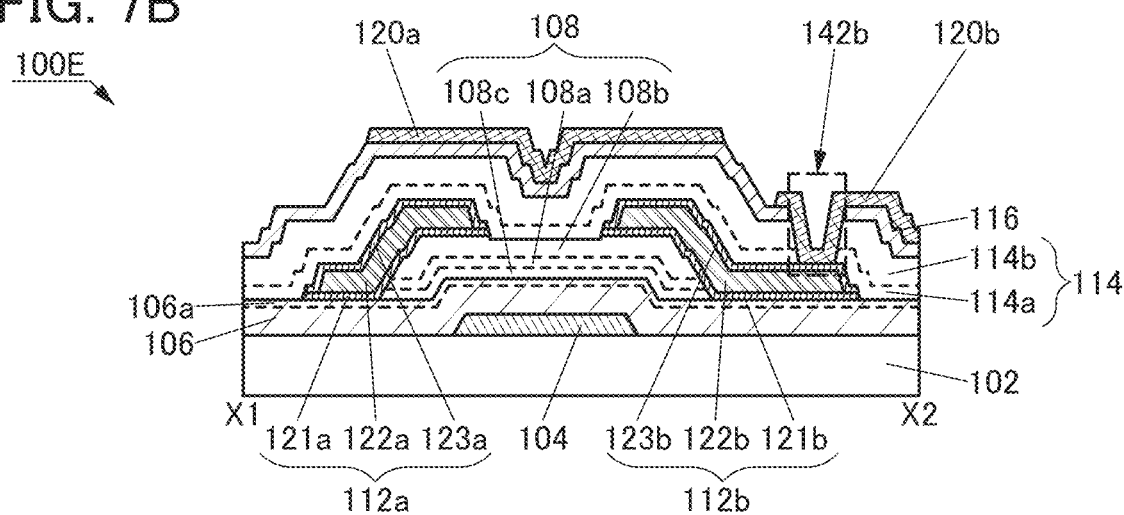
Figure 7C:
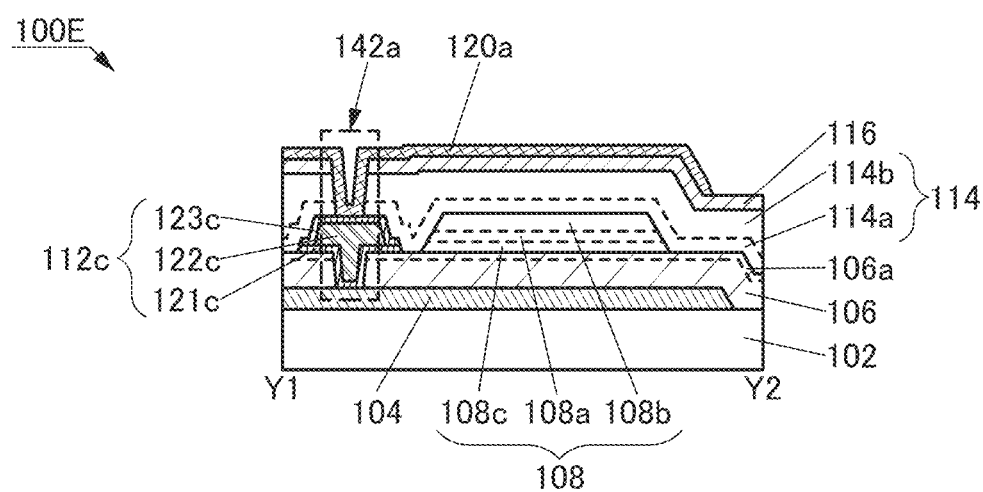

As a transistor 100E illustrated in FIGS. 7A to 7C, the metal oxide layer 108 may have a stacked structure including the third metal oxide layer 108c, the first metal oxide layer 108a over the third metal oxide layer 108c, and the second metal oxide layer 108b over the first metal oxide layer 108a.

Figure 8A:
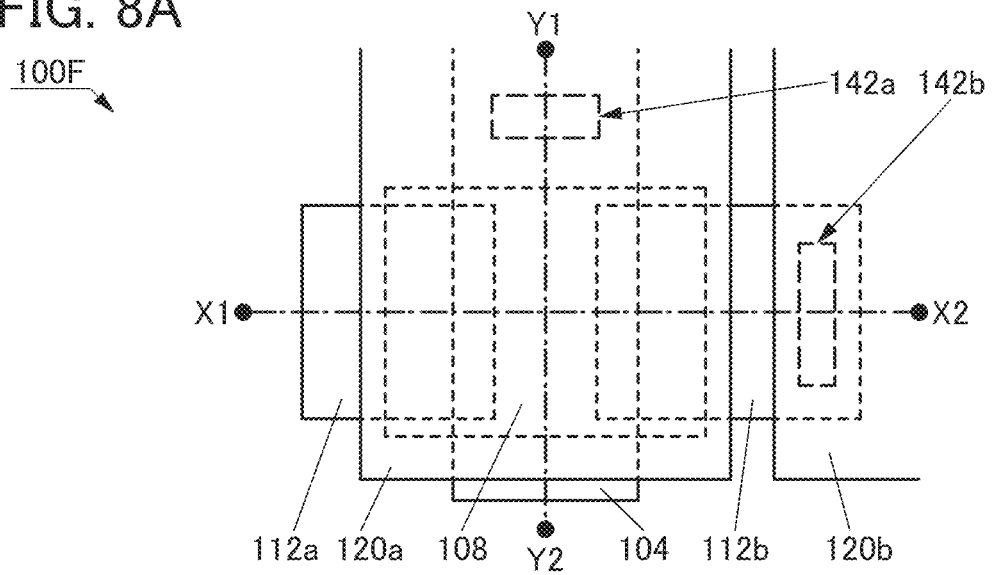
FIGS. 8A to 8C illustrate a structure example of a semiconductor device.
Figure 8B:
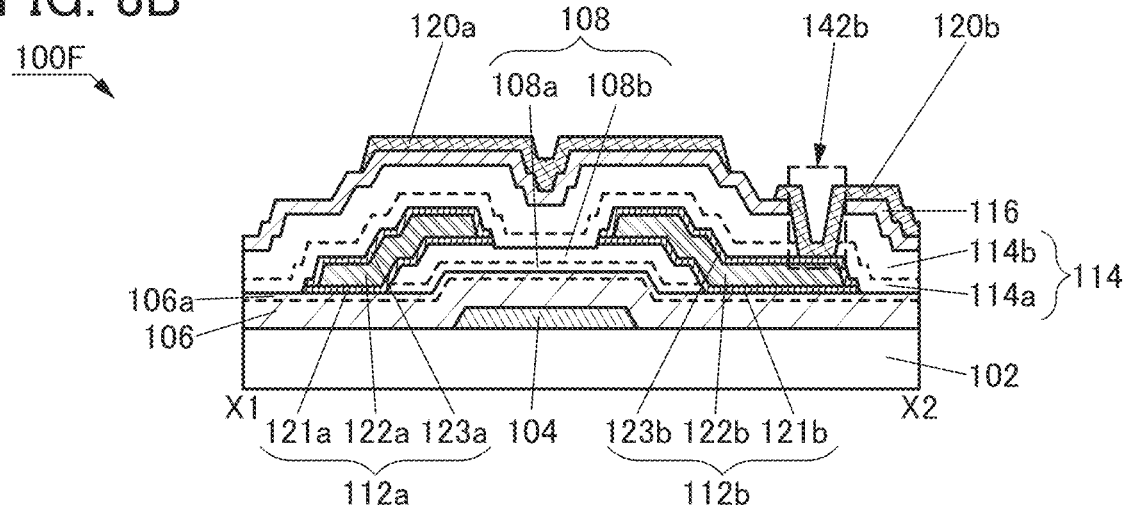
Figure 8C:
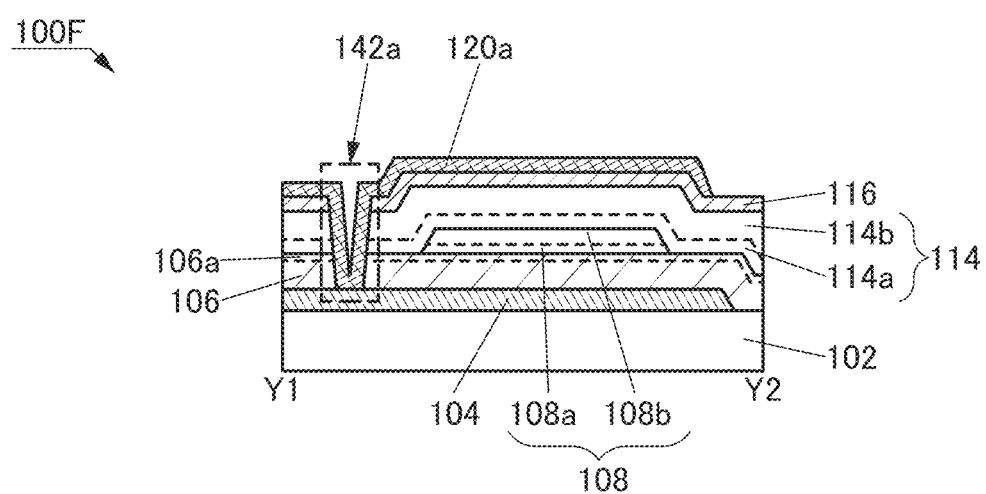

As a transistor 100F illustrated in FIGS. 8A to 8C, a structure without the conductive layer 112c may be employed. In the connection portion 142a, the conductive layer 120a is electrically connected to the conductive layer 104 through an opening provided in the insulating layer 106, the insulating layer 114, and the insulating layer 116.

The above is the description of Structural Example 4.

Structural Example 5

Figure 9A:
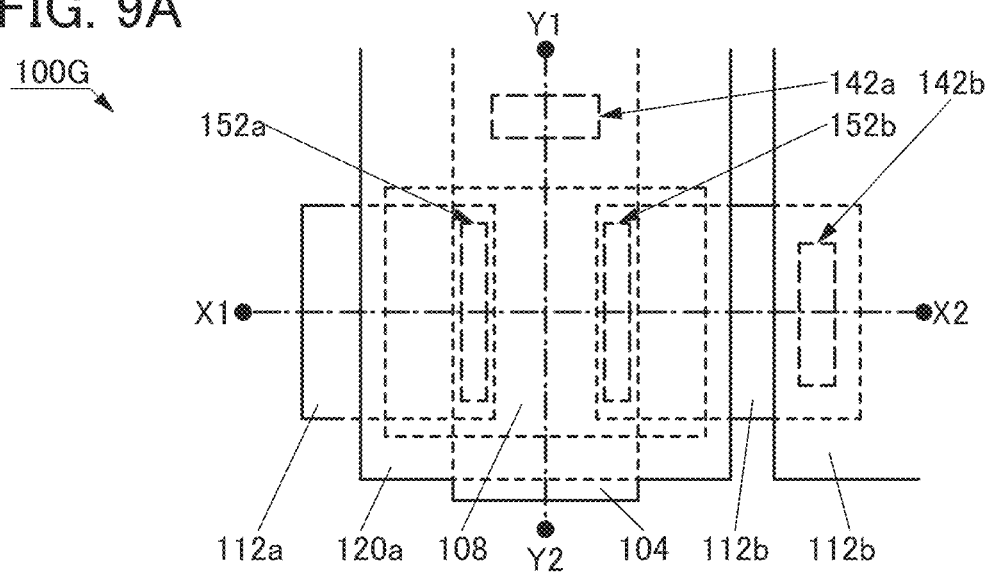
FIGS. 9A to 9C illustrate a structure example of a semiconductor device.
Figure 9B:
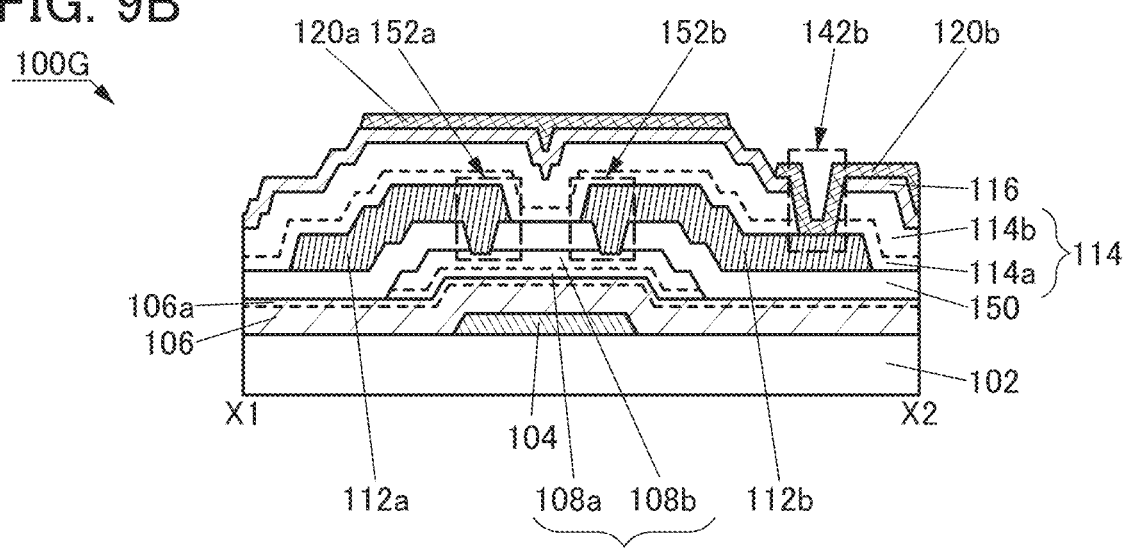
Figure 9C:
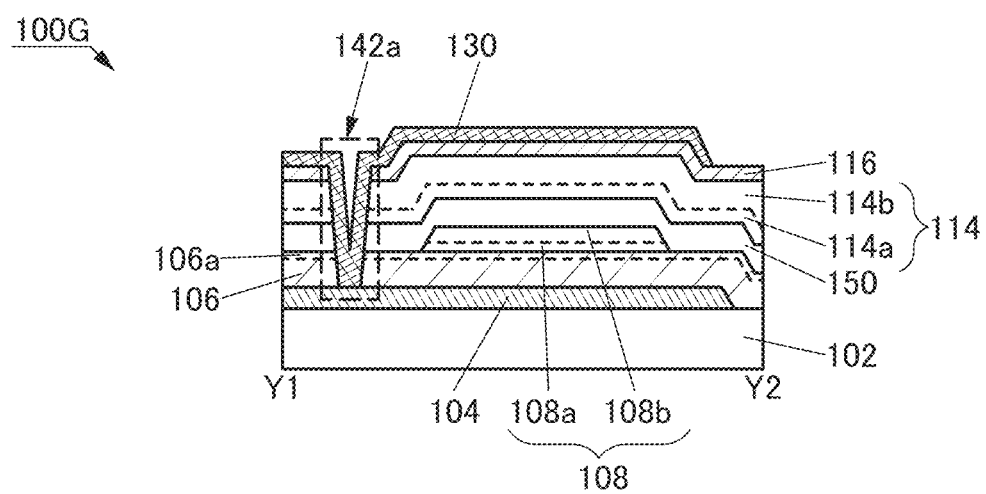

A top veil of a transistor 100G that is a semiconductor device of one embodiment of the present invention is illustrated in FIG. 9A, and cross-sectional views thereof are illustrated in FIGS. 9B and 9C. FIG. 9B is the cross-sectional view taken along the dashed-dotted line X1-X2 in FIG. 9A, and FIG. 9C is the cross-sectional view taken along the dashed-dotted line Y1-Y2 in FIG. 9A.

The transistor 100G has differs from the transistor 100F described in Structural Example 4 in that an insulating layer 150 is provided between the metal oxide layer 108 and the conductive layers 120a and 120b.

The insulating layer 150 is provided to cover the insulating layer 106 and the top surface and side surfaces of the metal oxide layer 108. The insulating layer 150 serves as a channel protective layer to protect the metal oxide layer 108 when the conductive layer 112a and the conductive layer 112b are processed.

The transistor 100G is what is called a channel-protective dual-gate transistor.

For the insulating layer 150, a material the same as that of the above-described insulating layer 114a can be used.

The conductive layer 112a and the conductive layer 112b are provided over the insulating layer 150. The conductive layer 112a is electrically connected to the metal oxide layer 108 through a connection portion 152a. In the connection portion 152a, the conductive layer 112a is electrically connected to the metal oxide layer 108 through an opening provided in the insulating layer 150. The conductive layer 112b is electrically connected to the metal oxide layer 108 through a connection portion 152b. In the connection portion 152b, the conductive layer 112b is electrically connected the metal oxide layer 108 through an opening provided in the insulating layer 150.

In such a structure, an etching step for processing the conductive layer 112a and the conductive layer 112b is conducted in a state where the metal oxide layer 108 is covered with the insulating layer 150. Thus, the metal oxide layer 108 is less likely to be damaged by the etching.

Furthermore, such a structure is preferable because the range of choices for materials for the conductive layer 112a and the conductive layer 112b is widened.

Although the structure in which the insulating layer 150 covers the side surfaces of the metal oxide layer 108 as well as the top surface thereof is described, the structure of one embodiment of the present invention is not limited to the above. For example, such a structure that the insulating layer 150 is processed into an island shape and located over the channel formation region of the metal oxide layer 108 may be employed.

The above is the description of Structural Example 5.

<Components of Semiconductor Device>

Components of the semiconductor device of this embodiment will be described below in detail.

[Substrate]

Although there is no particular limitation on a material and the like of the substrate 102, it is necessary that the substrate have heat resistance high enough to withstand at least heat treatment performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor may be formed directly on the flexible substrate. Alternatively, a separation layer may be provided between the substrate 102 and the transistor. The separation layer can be used when part or the whole of a semiconductor device formed over the separation layer is separated from the substrate 102 and transferred onto another substrate. In such a case, the transistor can be transferred to a substrate having low heat resistance or a flexible substrate as well.

[Conductive Layer]

The conductive layer 104, the conductive layer 112a, the conductive layer 112b, the conductive layer 120a, and the conductive layer 120b can each be formed using a metal element selected from chromium, copper, aluminum, gold, silver, zinc, molybdenum, tantalum, titanium, tungsten, manganese, nickel, iron, and cobalt; an alloy including any of these metal elements as its component; an alloy including a combination of any of these metal elements; or the like.

Furthermore, the conductive layer 104, the conductive layer 112a, the conductive layer 112b, the conductive layer 120a, and the conductive layer 120b can be each formed using an oxide conductor or an oxide semiconductor, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, the oxide conductor is obtained in the following manner. Oxygen vacancy is formed in a metal oxide having semiconductor characteristics, and then hydrogen is added to the oxygen vacancy, so that a donor level is formed in the vicinity of the conduction band. As a result, the conductivity of the metal oxide is increased, so that the metal oxide becomes a conductor. The metal oxide having become a conductor can be referred to as an oxide conductor. Metal oxides having semiconductor characteristics generally transmit visible light because of their large energy gap. Since an oxide conductor is a metal oxide having a donor level in the vicinity of the conduction band, the influence of absorption due to the donor level is small in an oxide conductor, and an oxide conductor has a visible light transmitting property comparable to that of a metal oxide having semiconductor characteristics.

A Cu—X alloy film (X is Mn, Ni, Cr, Fe, Co, Mo, Ta, or Ti) may be used for the conductive layer 104, conductive layer 112a, and the conductive layer 112b. Use of a Cu—X alloy film enables the manufacturing cost to be reduced because wet etching process can be used in the processing.

Among the above-mentioned metal elements, any one or more elements selected from copper, titanium, tungsten, tantalum, and molybdenum are preferably included in the conductive layers 112a and 112b. It is favorable to use a copper film or an aluminum film for the conductive layers 112a and 112b because the resistance of the conductive layers 112a and 112b can be reduced.

[Insulating Layer]

The insulating layer 106 functioning as the gate insulating layer can be formed using one or more kinds of insulating films of a silicon nitride oxide film, a silicon nitride film, an aluminum nitride film, an aluminum nitride oxide film, and the like by a plasma enhanced chemical vapor deposition (PECVD) method, a sputtering method, or the like. Note that the insulating layer 106 may have a stacked structure of two or more layers.

The insulating layer 114a and the insulating layer 114b provided over the metal oxide layer 108 can be each formed using one or more kinds of insulating layers of a silicon oxide film, a silicon oxynitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, and the like by a PECVD method, a sputtering method, an atomic layer deposition (ALD) method, or the like. It is particularly preferable to use a silicon oxide film or a silicon oxynitride film formed by a PECVD method.

As the preferred insulating layer 114a, an insulating film with a thickness greater than or equal to 5 nm and less than or equal to 150 nm, preferably greater than or equal to 5 nm and less than or equal to 50 nm can be used.

Further, it is preferable that the number of defects in the insulating layer 114a be small and typically, the spin density corresponding to a signal that appears at g=2.001 due to a dangling bond of silicon be lower than or equal to $3\times10^{17}$ spins/cm$^3$ by electron spin resonance (ESR) measurement. This is because if the density of defects in the insulating layer 114a is high, oxygen is bonded to the defects and the property of transmitting oxygen of the insulating layer 114a is lowered.

Note that all oxygen entering the insulating layer 114a from the outside does not move to the outside of the insulating layer 114a and some oxygen remains in the insulating layer 114a. Furthermore, movement of oxygen occurs in the insulating layer 114a in some cases in such a manner that oxygen enters the insulating layer 114a and oxygen included in the insulating layer 114a move to the outside of the insulating layer 114a. When an insulating film that can transmit oxygen is formed as the insulating layer 114a, oxygen released from the insulating layer 114b provided over the insulating layer 114a can be moved to the first metal oxide layer 108a and the second metal oxide layer 108b through the insulating layer 114a.

Note that the insulating layer 114a can be formed using an insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the metal oxide film. A silicon oxynitride film that releases less nitrogen oxide, an aluminum oxynitride film that releases less nitrogen oxide, or the like can be used as the insulating film.

Note that a silicon oxynitride film that releases less nitrogen oxide is a film which releases ammonia more than nitrogen oxide in thermal desorption spectroscopy (TDS) analysis; the amount of released ammonia is typically greater than or equal to $1\times10^{18}$/cm$^3$ and less than or equal to $5\times10^{19}$/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating layer 114a, for example. The level is positioned in the energy gap of the first metal oxide layer 108a and the second metal oxide layer 108b. Therefore, when nitrogen oxide is diffused to the interface between the insulating layer 114a and the second metal oxide layer 108b, an electron is in some cases trapped by the level on the insulating layer 114a side. As a result, the trapped electron remains in the vicinity of the interface between the insulating layer 114a and the second metal oxide layer 108b; thus, the threshold voltage of the transistor is shifted in the positive direction.

Nitrogen oxide reacts with ammonia and oxygen in heat treatment. Since nitrogen oxide contained in the insulating layer 114a reacts with ammonia contained in the insulating layer 114b in heat treatment, the nitrogen oxide contained in the insulating layer 114a is reduced. Therefore, an electron is hardly trapped at the interface between the insulating layer 114a and the second metal oxide layer 108b.

By using the above insulating film as the insulating layer 114a, a shift in the threshold voltage of the transistor can be reduced, which leads to reduction of fluctuations in the electrical characteristics of the transistor.

The concentration of nitrogen of the above insulating film measured by SIMS is lower than or equal to $6\times10^{20}$ atoms/cm$^3$.

The insulating film is formed by a PECVD method at a substrate temperature higher than or equal to 220° C. and lower than or equal to 350° C. using silane and dinitrogen monoxide, whereby a dense and hard film can be formed.

The insulating layer 114b is an insulating film which contains oxygen at a higher proportion than the stoichiometric composition. Part of oxygen is released from the above insulating film by heating. The amount of oxygen released from the insulating film in TDS is more than or equal to $1.0 \times 10^{19}$ atoms/cm$^3$, preferably more than or equal to $3.0 \times 10^{20}$ atoms/cm$^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used as the oxide insulating layer 114b.

The amount of defects in the insulating layer 114b is preferably small; as a typical example, the spin density corresponding to a signal that appears at g=2.001 due to a dangling bond of silicon is preferably lower than $1.5 \times 10^{18}$ spins/cm$^3$, further preferably lower than or equal to $1 \times 10^{18}$ spins/cm$^3$ by ESR measurement. Note that the insulating layer 114b is provided more apart from the first metal oxide layer 108a and the second metal oxide layer 108b than the insulating layer 114a is; thus, the insulating layer 114b may have higher density of defects than the insulating layer 114a.

For the insulating layer 116 functioning as the protective film, the above-described material can be used. Furthermore, the insulating layer 116 may have a stacked-layer structure of two or more layers. It is preferable for the insulating layer 116 to use an insulating film through which oxygen is less likely to be diffused and transmitted. Furthermore, it is preferable for the insulating layer 116 to use an insulating film from which a small amount of impurities is released and through which the impurities are less likely to be diffused and transmitted. It is particularly preferable for the insulating layer 116 to use an insulating film from which a small amount of impurities including hydrogen is released and through which the impurities are less likely to be diffused and transmitted.

As the preferred insulating layer 116, an insulating film with a thickness greater than or equal to 5 nm and less than or equal to 200 nm, preferably greater than or equal to 10 nm and less than or equal to 150 nm can be used.

[Semiconductor Layer]

For the first metal oxide layer 108a, the second metal oxide layer 108b, and the third metal oxide layer 108c, the above-described material can be used.

In the case where each of the first metal oxide layer 108a, the second metal oxide layer 108b, and the third metal oxide layer 108c is an In-M-Zn oxide, the atomic ratio of metal elements in a sputtering target used for forming the In-M-Zn oxide preferably satisfies In>M. The atomic ratio of metal elements in such a sputtering target is, for example, In:M:Zn=1:1:1, In:M:Zn=1:1:1.2, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, or In:M:Zn=5:2:5.

In the case where each of the first metal oxide layer 108a, the second metal oxide layer 108b, and the third metal oxide layer 108c is an In-M-Zn oxide, it is preferable to use a target including polycrystalline In-M-Zn oxide as the sputtering target. The use of the target including polycrystalline In-M-Zn oxide facilitates formation of the metal oxide layer 108 having crystallinity. Note that the atomic ratio of elements in the metal oxide layer 108 varies from the above atomic ratios of metal elements of the sputtering targets in a range of ±40%. For example, when a sputtering target used for the metal oxide layer 108 has an atomic ratio of In:Ga: Zn=4:2:4.1, the atomic ratio of the metal oxide layer 108 may be 4:2:3 or in the neighborhood thereof.

Furthermore, each of the first metal oxide layer 108a, the second metal oxide layer 108b, and the third metal oxide layer 108c has an energy gap greater than or equal to 2 eV, preferably greater than or equal to 2.5 eV. With use of a metal oxide having such a wide energy gap, the off-state current of the transistor can be reduced.

It is preferable that the each of the first metal oxide layer 108a, the second metal oxide layer 108b, and the third metal oxide layer 108c have an non-single crystal structure. The non-single crystal structure includes a c-axis aligned crystalline oxide semiconductor (CAAC-OS), a polycrystalline structure, a microcrystalline structure, or an amorphous structure, for example. Among the non-single crystal structure, the amorphous structure has the highest density of defect states, whereas CAAC-OS has the lowest density of defect states.

<Method 1 for Manufacturing Transistor>

A manufacturing method example of a transistor of one embodiment of the present invention will be described below. Here, description will be made using the transistor 100C described in Structural example 3.

Note that the thin films included in the semiconductor device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As an example of the thermal CVD method, a metal organic CVD (MOCVD) method can be given.

The thin films included in the semiconductor device (i.e., the insulating film, the semiconductor film, the conductive film, and the like) can be formed by a method such as spin coating, dipping, spray coating, a droplet discharge method (such as an ink-jet method), or a printing method (such as screen printing or offset printing), or with a tool (equipment) such as a doctor knife, a roll coater, a curtain coater, or a knife coater.

When thin films included in the semiconductor device are processed, a photolithography method or the like can be used for the processing. Besides, a nanoimprinting method, a sandblasting method, a lift-off method, or the like may be used for the processing of thin films. Alternatively, island-shaped thin films may be formed by a film formation method using a blocking mask such as a metal mask.

There are two typical examples of photolithography methods. In one of the methods, a resist mask is formed over a thin film that is to be processed, and the thin film is processed by etching, so that the resist mask is removed. In the other method, after a photosensitive thin film is deposited, exposure and development is performed, so that the thin film is processed into a desired shape.

As light for exposure in a photolithography method, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed.

For etching of the thin film, dry etching, wet etching, a sandblast method, or the like can be used.

FIGS. 10A to 10C, FIGS. 11A to 11C, FIGS. 12A and 12B, and FIGS. 13A and 13B illustrate a method for manufacturing the transistor 100C. In each of the drawings, a cross section in the channel length direction is shown on the left side, and a cross section in the channel width direction is shown on the right side.

[Formation of Conductive Layer 104]

First, a conductive film is formed over the substrate 102 and processed through a lithography process and an etching process, whereby the conductive layer 104 functioning as the gate electrode is formed.

[Formation of Insulating Layer 106]

Figure 10A:
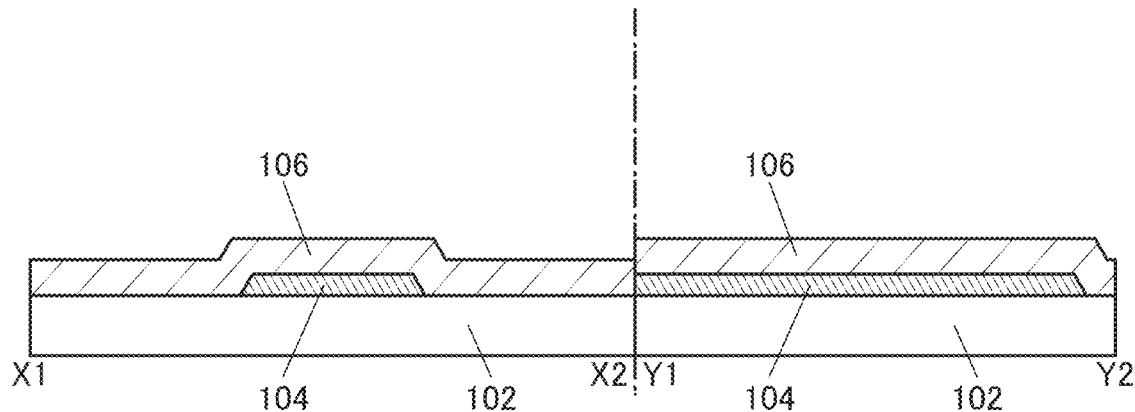
FIGS. 10A to 10C illustrate a method for manufacturing a semiconductor device.

The insulating layer 106 is formed to cover the conductive layer 104 and the substrate 102 (FIG. 10A). The insulating layer 106 can be formed, for example, by a PECVD method, or the like.

In this embodiment, a silicon nitride film with a thickness of 400 nm can be used as the insulating layer 106. Note that the above-described silicon nitride film has a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film was formed to have a thickness of 50 nm under conditions similar to those used for formation of the first silicon nitride film.

Note that the first silicon nitride film, the second silicon nitride film, and the third silicon nitride film can each be formed at a substrate temperature of 350° C. or lower.

The silicon nitride film with the above-described three-layer structure brings about the following effect, for example, in the case where a conductive film including copper is used as the conductive layer 104. The first silicon nitride film can inhibit diffusion of copper from the conductive layer 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

[Formation of Region 106a]

Figure 10B:
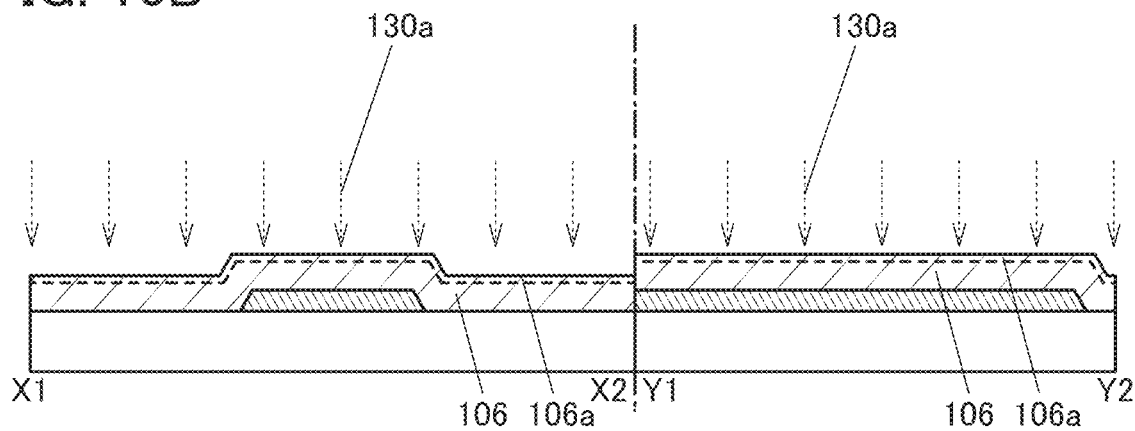

Next, oxygen 130a is added to the insulating layer 106, so that the region 106a containing oxygen is preferably formed in the vicinity of the surface of the insulating layer 106 (FIG. 10B).

As the oxygen 130a added to the insulating layer 106, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating layer 106, and then, the oxygen 130a may be added to the insulating layer 106 through the film. It is preferable to remove the film after addition of the oxygen 130a.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where the oxygen 130a is added by plasma treatment in which oxygen is excited by a microwave to generate high-density oxygen plasma, the amount of oxygen added to the insulating layer 106 can be increased. When plasma treatment is performed in an atmosphere containing oxygen, water, hydrogen, or the like adsorbed on the surface of the insulating layer 106 can be removed. Thus, the amount of hydrogen or water which may exist in the metal oxide layer 108 formed later or at an interface between the metal oxide layer 108 and the insulating layer 106 can be reduced.

When a silicon nitride, silicon nitride oxide, or the like is used as the insulating layer 106, hydrogen may be contained in the insulating layer 106. In this case, with plasma treatment as described above, or the like, the hydrogen concentration at least in the region 106a in contact with the metal oxide layer 108 can be reduced.

Before the oxygen 130a is added, heat treatment for releasing water or hydrogen from the surface of the insulating layer 106 or the inside thereof may be performed. For example, heat treatment is performed in a nitrogen atmosphere at a temperature higher than or equal to 300° C. and lower than the heat resistant temperature of the conductive layer 104, preferably higher than or equal to 300° C. and lower than or equal to 450° C.

[Formation of Metal Oxide Layer 108]

Figure 10C:
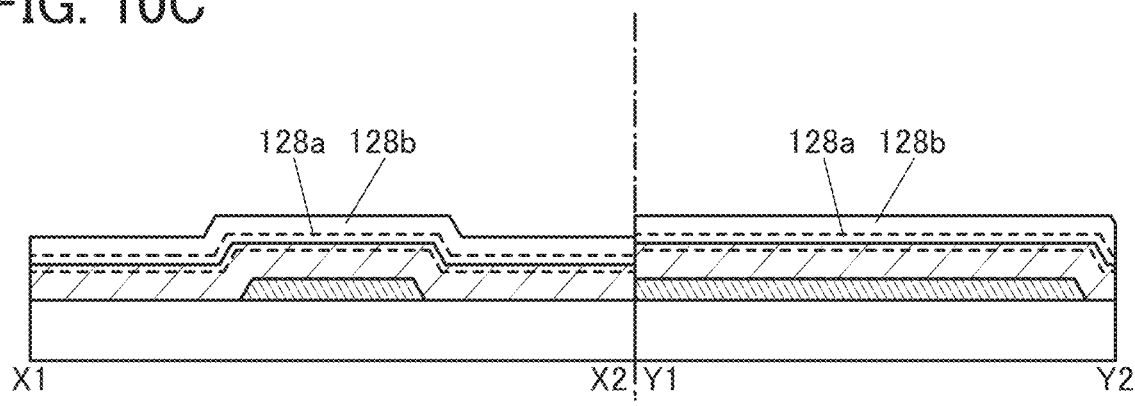

Next, a metal oxide film 128a and a metal oxide film 128b are formed over the insulating layer 106 (FIG. 10C).

The metal oxide film 128a and the metal oxide film 128b are preferably formed by a sputtering method using a metal oxide target.

In forming the metal oxide film 128a and the metal oxide film 128b, an inert gas (such as a helium gas, an argon gas, or a xenon gas) may be mixed in addition to the oxygen gas. Note that the proportion of the oxygen gas in the whole deposition gas (hereinafter also referred to as an oxygen flow rate ratio) in forming the metal oxide film is higher than or equal to 0% and lower than or equal to 100%, preferably higher than or equal to 5% and lower than or equal to 20%.

When a metal oxide film with relatively low crystallinity is formed with low oxygen flow rate ratio, the metal oxide film can have high conductivity. In contrast, when a metal oxide film with relatively high crystallinity is formed with high oxygen flow rate ratio, the metal oxide film can have resistance to etching and electrical stability.

For example, the metal oxide film 128a and the metal oxide film 128b are formed at a substrate temperature higher than or equal to room temperature and lower than or equal to 180° C., preferably higher than or equal to room temperature and lower than or equal to 140° C. The substrate temperature when the metal oxide film is formed is preferably, for example, higher than or equal to room temperature and lower than 140° C. because the productivity is increased.

More specifically, the oxygen flow rate ratio for formation of the metal oxide film 128a is higher than or equal to 0% and lower than 50%, preferably higher than or equal to 0% and lower than or equal to 30%, further preferably higher than or equal to 0% and lower than or equal to 20%, typically 10%. The thickness of the metal oxide film 128a is greater than or equal to 1 nm and less than or equal to 50 nm, preferably greater than or equal to 5 nm and less than or equal to 30 nm.

The oxygen flow rate ratio for formation of the metal oxide film 128b is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Furthermore, although the film formation condition such as pressure, temperature, or power may vary between the metal oxide film 128a and the metal oxide film 128b, it is preferable to employ the same condition other than the oxygen flow rate ratio because the time taken for film formation can be shortened. The thickness of the metal oxide film 128b is greater than 10 nm and less than or equal to 100 nm, preferably greater than or equal to 20 nm and less than or equal to 50 nm.

Note that the film composition may differ between the metal oxide film 128a and the metal oxide film 128b. In that case, if In—Ga oxide is used in both the metal oxide film 128a and the metal oxide film 128b, an oxide target used for formation of the metal oxide film 128a preferably has higher In proportion than that for formation of the metal oxide film 128b.

Figure 11A:
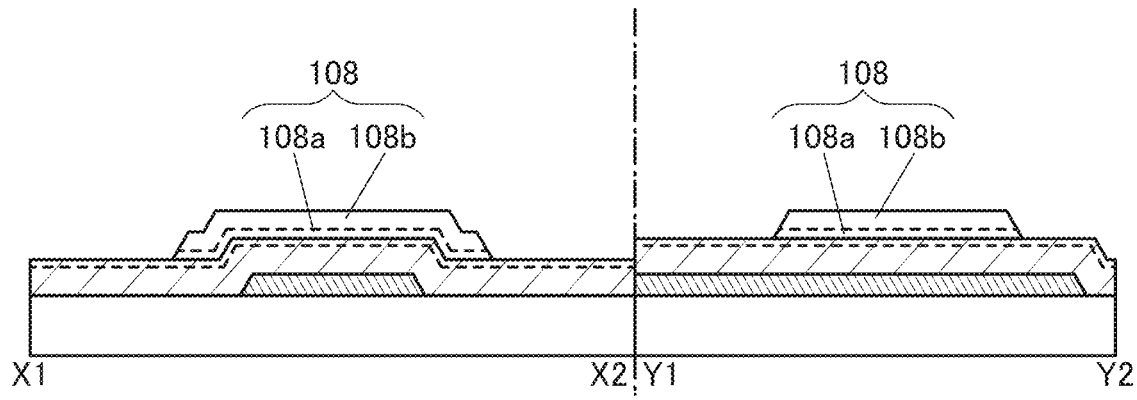
FIGS. 11A to 11C illustrate a method for manufacturing a semiconductor device.

Next, a resist mask is formed over the metal oxide film 128b, the metal oxide film 128a and the metal oxide film 128b are processed by etching, and the resist mask is removed, whereby the first metal oxide layer 108a and the second metal oxide layer 108b are formed (FIG. 11A).

After the first metal oxide layer 108a and the second metal oxide layer 108b are formed, heat treatment (hereinafter, referred to as first heat treatment) may be performed. By the first heat treatment, hydrogen, water, or the like contained in the first metal oxide layer 108a and the second metal oxide layer 108b can be reduced. The heat treatment for the purpose of reducing hydrogen, water, or the like may be performed before the metal oxide film 128a and the metal oxide film 128b are processed into island shapes. Note that the first heat treatment is one kind of treatment for increasing the purity of the metal oxide layer.

The first heat treatment can be performed at a temperature of, for example, higher than or equal to 150° C. and lower than the strain point of the substrate, preferably higher than or equal to 200° C. and lower than or equal to 450° C., further preferably higher than or equal to 250° C. and lower than or equal to 350° C.

Moreover, an electric furnace, an RTA apparatus, or the like can be used for the first heat treatment. With use of the RTA apparatus, only in a short time, the heat treatment can be performed at a temperature higher than or equal to the strain point of the substrate. Therefore, the heat treatment time can be shortened. The first heat treatment may be performed in an atmosphere of nitrogen, oxygen, ultra-dry air (air with a water content of 20 ppm or less, preferably 1 ppm or less, further preferably 10 ppb or less), or a rare gas (e.g., argon, helium). The atmosphere of nitrogen, oxygen, ultra-dry air, or a rare gas preferably does not contain hydrogen, water, or the like. Furthermore, after heat treatment performed in a nitrogen atmosphere or a rare gas atmosphere, heat treatment may be additionally performed in an oxygen atmosphere or an ultra-dry air atmosphere. As a result, hydrogen, water, or the like can be released from the metal oxide layer, and oxygen can be supplied to the metal oxide layer at the same time. Consequently, oxygen vacancy in the metal oxide layer can be reduced.

[Formation of Conductive Layer 112a and Conductive Layer 112b]

Next, a conductive film 121 that is to be the conductive layer 121a and the conductive layer 121b is formed, and a conductive film 122 that is to be the conductive layer 122a and the conductive layer 122b is stacked thereover.

Figure 11B:
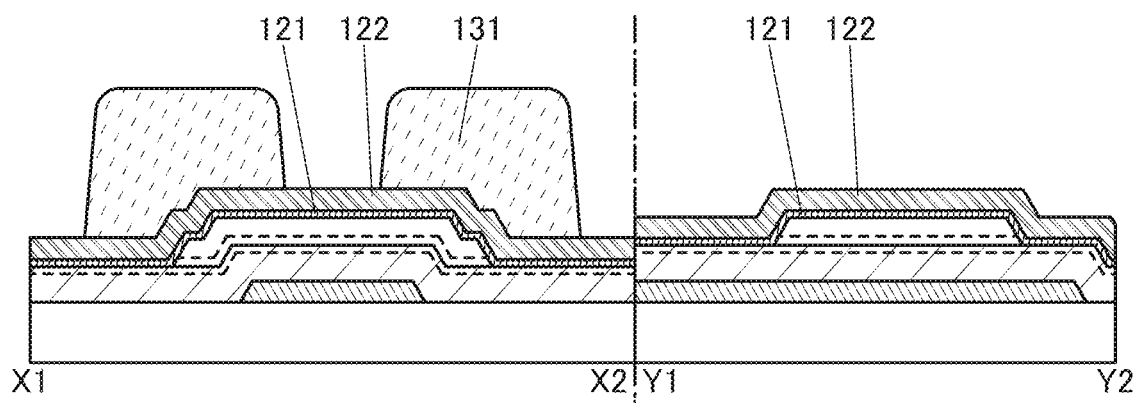

Then, a resist mask 131 is formed over the conductive film 122 (FIG. 11B). The resist mask 131 is formed to have a gap over a region where a channel of the metal oxide layer 108 is formed.

Figure 11C:
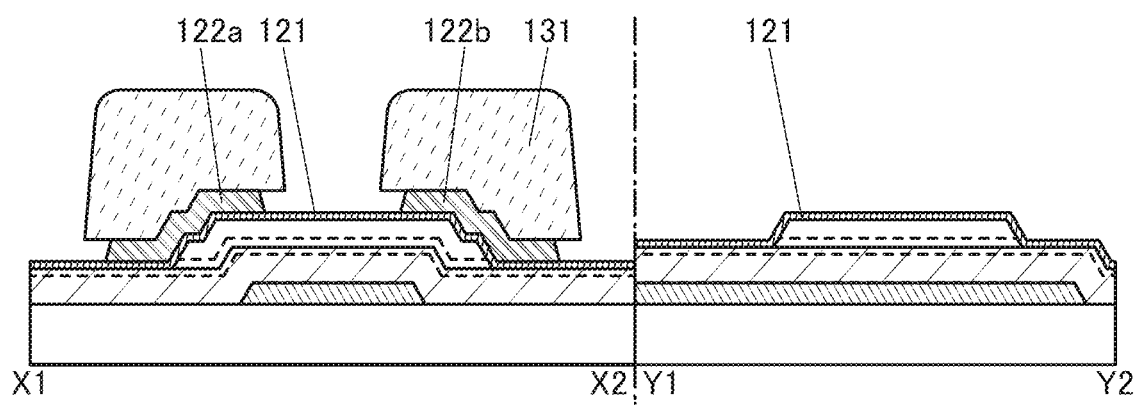

Next, the conductive film 122 is processed by etching, so that the conductive layer 122a and the conductive layer 122b are formed (FIG. 11C). At this time, the conductive layer 122a and the conductive layer 122b are preferably processed to have end portions that are positioned on an inner side than the end portions of the resist mask For the etching of the conductive film 122, an isotropic etching method is preferably used. A wet etching method can be suitably used. Thus, the conductive film 122 can be etched so that the end portions of the conductive layer 122a and the conductive layer 122b are recessed.

After formation of the conductive layer 122a and the conductive layer 122b, the resist mask 131 is removed.

Next, a conductive film 123 is formed to cover the conductive layer 121a, the conductive layer 122a, and the conductive layer 122b. The conductive film 123 is to be the conductive layer 123a and the conductive layer 123b later.

Figure 12A:
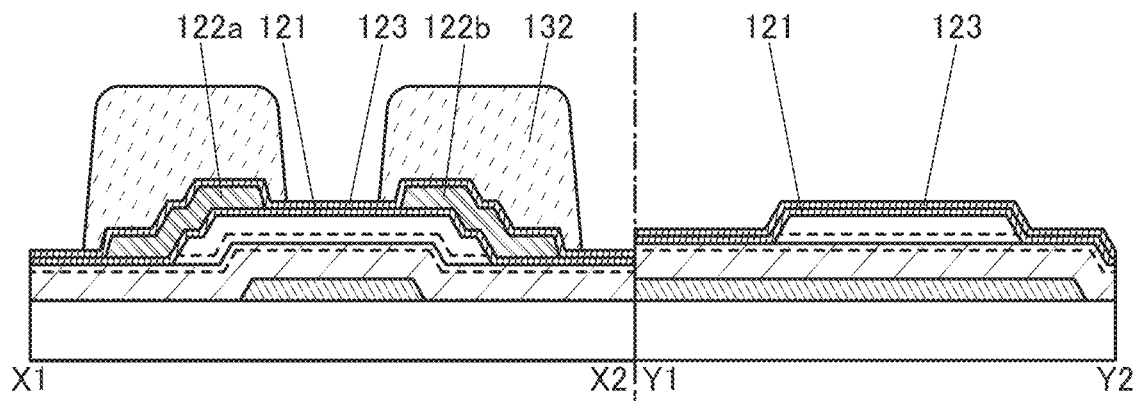
FIGS. 12A and 12B illustrate a method for manufacturing a semiconductor device.

Next, a resist mask 132 is formed over the conductive film 123 (FIG. 12A). The resist mask 132 can be formed using the same photomask as that of the resist mask 131. Thus, the photomask can be shared, and the manufacturing cost can be suppressed.

Then, the conductive film 121 and the conductive film 123 are processed by etching, whereby the conductive layer 121a, the conductive layer 121b, the conductive layer 123a, and the conductive layer 123b are formed. By this process, it is preferable that end portions of the conductive layer 121a and the conductive layer 123a be in contact with each other and the conductive layer 122a be not exposed. Furthermore, it is preferable that end portions of the conductive layer 121b and the conductive layer 123b be in contact with each other and the conductive layer 122b be not exposed.

For the etching of the conductive film 121 and the conductive film 123, an anisotropic etching is preferably used. A dry etching method can be suitably used. Thus, the process can be performed so that end portions of the conductive layer 121a, the conductive layer 121b, the conductive layer 123a, and the conductive layer 123b are not recessed. Consequently, the conductive layer 121a and the conductive layer 123a can be formed to surround the conductive layer 122a. The conductive layer 121b and the conductive layer 123b can be formed to surround the conductive layer 122b. Moreover, a variation in channel length of transistors can be suppressed.

When the same conductive film is used for the conductive layer 121a, the conductive layer 121b, the conductive layer 123a, and the conductive layer 123b, the etching can be easily carried out. In addition, the end portions conductive layer 121a, the conductive layer 121b, the conductive layer 123a, and the conductive layer 123b are less likely to have unevenness. Thus, it is preferable to use the same conductive film.

Figure 12B:
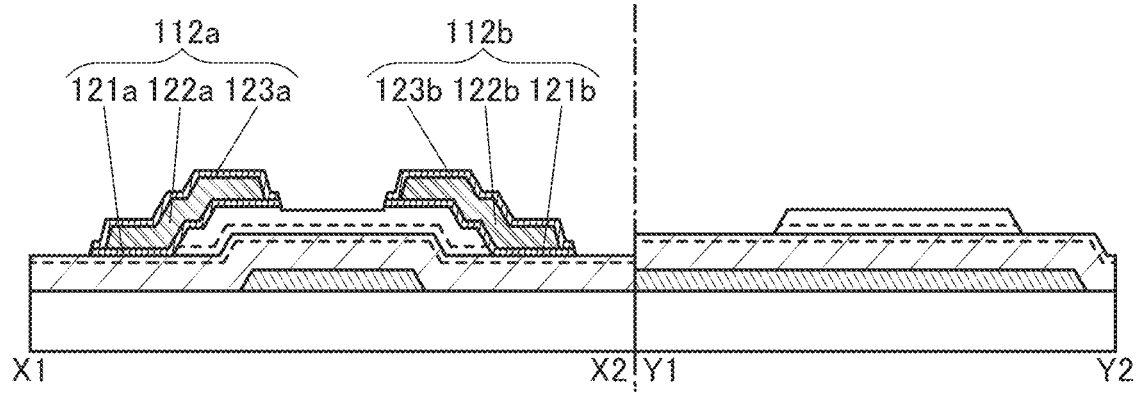

After that, the resist mask 132 is removed. Through the above steps, the conductive layers 112a and 112b can be formed (FIG. 12B).

[Formation of Insulating Layer 114 and Insulating Layer 116]

Next, the insulating layer 114 and the insulating layer 116 are formed to cover the conductive layer 112a, the conductive layer 112b, and the metal oxide layer 108.

For example, the insulating layer 114 is preferably formed in an atmosphere containing oxygen. In particular, the insulating layer 114 is preferably formed by a PECVD method.

As the insulating layer 114, for example, an oxide film such as a silicon oxide film or a silicon oxynitride film is preferably formed in an atmosphere containing oxygen with a PECVD apparatus. Thus, the insulating layer 114 with few defects can be formed. In this case, a deposition gas including silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide. The insulating layer 114 can have a stacked structure including the insulating layer 114a and the insulating layer 114b over the insulating layer 114a.

In formation of the insulating layer 114a, the flow rate of oxidizing gas is higher than 20 times and lower than 100 times that of the deposition gas, preferably higher than or equal to 40 times and lower than or equal to 80 times that of the deposition gas, and the pressure in a treatment chamber is lower than 100 Pa, preferably lower than or equal to 50 Pa.

In this embodiment, a silicon oxynitride film is formed as the insulating layer 114a by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm² as the power density) is supplied to a parallel-plate electrode.

As the insulating layer 114b, a silicon oxide film or a silicon oxynitride film is formed under the conditions where the substrate placed in a treatment chamber of the PECVD apparatus, which is vacuum-evacuated, is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa, with introduction of a source gas into the treatment chamber, and a high-frequency power greater than or equal to 0.17 W/cm² and less than or equal to 0.5 W/cm², preferably greater than or equal to 0.25 W/cm² and less than or equal to 0.35 W/cm², is supplied to an electrode provided in the treatment chamber.

As the film formation conditions of the insulating layer 114b, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating layer 114b becomes higher than that in the stoichiometric composition. At the same time, in the film formed at a substrate temperature within the above temperature range, the bond between silicon and oxygen is weak, and accordingly, part of oxygen in the film is released by heat treatment in a later step. Thus, an insulating film that contains oxygen at a higher proportion than oxygen in the stoichiometric composition and from which part of oxygen is released by heating can be formed.

Note that the insulating layer 114a serves as a protective film of the metal oxide layer 108 in the step of forming the insulating layer 114b. Therefore, the insulating layer 114b can be formed using the high-frequency power having a high power density while damage to the metal oxide layer 108 is reduced.

Note that in the deposition conditions of the insulating layer 114b, when the flow rate of the deposition gas containing silicon with respect to the oxidizing gas is increased, the amount of defects in the insulating layer 114b can be reduced. As a result, the reliability of the transistor can be improved.

Although the structure in which the insulating layer 114 has the two-layer structure of the insulating layer 114a and the insulating layer 114b is described, one embodiment of the present invention is not limited to this structure. For example, the insulating layer 114 may have a single-layer structure of the insulating layer 114a or the insulating layer 114b. It is preferable that the insulating layer 114 have a single-layer structure because in such a case, the productivity can be improved. Alternatively, the insulating layer 114 may have a stacked structure including three layers or more.

Next, the insulating layer 116 is formed to cover the insulating layer 114b. The insulating layer 116 can be formed in a manner similar to that of the insulating layer 106.

As the insulating layer 116, a silicon nitride film is preferably used, for example. The insulating layer 116 can be formed by a sputtering method or a PECVD method, for example. In the case where the insulating layer 116 is formed by a PECVD method, for example, the substrate temperature is lower than 400° C., preferably lower than 375° C., and further preferably higher than or equal to 180° C. and lower than or equal to 350° C. The substrate temperature at which the insulating layer 116 is formed is preferably within the above range because a dense film can be formed. Furthermore, when the substrate temperature at which the insulating layer 116 is formed is within the above range, oxygen or excess oxygen in the insulating layers 114a and 114b can be moved to the metal oxide layer 108.

In the case where a silicon nitride film is formed by a PECVD method as the insulating layer 116, a deposition gas containing silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen which are included in a deposition gas including silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to nitrogen is large, decomposition of a deposition gas including silicon and decomposition of nitrogen are not promoted, so that a sparse silicon nitride film in which bonds between silicon and hydrogen remain and defects and hydrogen are increased is formed. Therefore, in the source gas, the flow rate of nitrogen is set to be preferably 5 times or more and 50 times or less, further preferably 10 times or more and 50 times or less the flow rate of ammonia. With this flow rate, the amounts of hydrogen and defects are decreased as compared with the case of using the above flow rate, and thus a dense silicon nitride film can be formed.

In this embodiment, with use of a PECVD apparatus, a 100-nm-thick silicon nitride film is formed as the insulating layer 116 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to a parallel-plate electrode with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

The deposition temperature of the insulating layer 116 can be set higher than the deposition temperature of the insulating layers 114a and 114b. When the deposition temperature is high, the amount of impurities such as hydrogen in the insulating layer 116 can be reduced. Furthermore, the substrate temperature at which the insulating layer 116 is formed can be set to the same as those at which the insulating layers 114a and 114b are formed. With the same temperature, the productivity can be improved.

After the insulating layer 114a is formed, the insulating layer 114b is preferably formed successively in vacuum without exposure of the surface of the insulating layer 114a to the air. With successive formation, attachment of impurities attributed to atmospheric components to the surface of the insulating layer 114a can be suppressed. After the insulating layer 114b is formed, the insulating layer 116 is preferably formed successively in vacuum without exposure of the surface of the insulating layer 114b to the air. With successive formation, attachment of impurities attributed to atmospheric components to the surface of the insulating layer 114b can be suppressed. It is further preferable that the insulating layer 114a, the insulating layer 114b, and the insulating layer 116 be successively formed in vacuum because attachment of impurities attributed to atmospheric components to the surfaces of the insulating layers 114a and 114b can be suppressed.

Heat treatment (hereinafter referred to as second heat treatment) is preferably performed after the insulating layer 114a, the insulating layer 114b, and the insulating layer 116 are formed. The second heat treatment can reduce nitrogen oxide included in the insulating layer 114a, the insulating layer 114b, and the insulating layer 116. By the second heat treatment, part of oxygen contained in the insulating layers 114a and 114b can be transferred to the metal oxide layer 108, so that the amount of oxygen vacancy and VoH included in the metal oxide layer 108 can be reduced.

The temperature of the second heat treatment is typically lower than 400° C., preferably lower than 375° C., further preferably higher than or equal to 150° C. and lower than or equal to 350° C., for example.

The second heat treatment may be performed under an atmosphere of nitrogen, oxygen, ultra-dry air (air with a water content of 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like. An electric furnace, RTA, or the like can be used for the heat treatment.

Through the above-described steps, the transistor 100C can be manufactured.

<Method 2 for Manufacturing Transistor>

A method for manufacturing the transistor 100C, which is different from the manufacturing method described in Method 1 for manufacturing transistor, is described below. The manufacturing steps up to formation of the conductive layers 112a and 112b are the same as those in Method 1 for manufacturing transistor described above (see FIG. 12B).

[Formation of Insulating Layer 114]

Figure 13A:
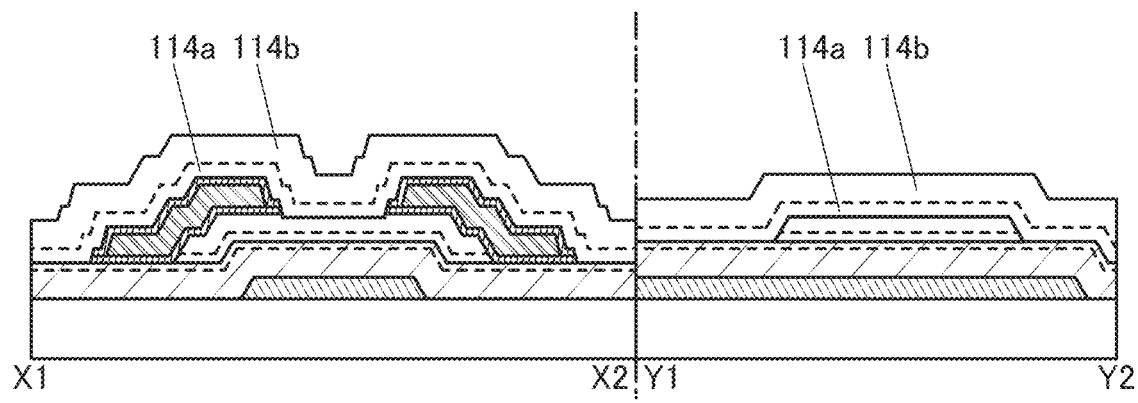
FIGS. 13A and 13B illustrate a method for manufacturing a semiconductor device.

Next, the insulating layer 114 is formed to cover the conductive layer 112a, the conductive layer 112b, the metal oxide layer 108, and the like (FIG. 13A). For a method for formation of the insulating layer 114, the description in Method 1 for manufacturing transistor can be referred to, and thus the detailed description is omitted. Note that the insulating layer 114 may have a two-layer structure of the insulating layer 114a and the insulating layer 114b. However, the one embodiment of the present invention is not limited to this structure, and for example, one of the insulating layer 114a and the insulating layer 114b may have a single-layer structure. It is preferable that the insulating layer 114 have a single layer structure because in such a case, the productivity can be improved. Alternatively, the insulating layer 114 may have a stacked structure including three or more layers.

[Heat Treatment]

After the formation of the insulating layer 114, heat treatment is performed. With the heat treatment after the formation of the insulating layer 114, nitrogen oxide included in the insulating layer 114 can be reduced. By the heat treatment, part of oxygen contained in the insulating layer 114 can be transferred to the metal oxide layer 108, so that the amount of oxygen vacancy and VoH included in the metal oxide layer 108 can be reduced.

The temperature of the heat treatment is typically lower than 400° C., preferably lower than 375° C., further preferably higher than or equal to 150° C. and lower than or equal to 350° C., for example.

The heat treatment may be performed in an atmosphere of nitrogen, oxygen, ultra-dry air (air in which the water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like. An electric furnace, RTA, or the like can be used for the heat treatment.

[Formation of Insulating Layer 116]

Next, the insulating layer 116 is formed to cover the insulating layer 114. For formation of the insulating layer 116, the description in Method 1 for manufacturing transistor can be referred to, and thus the detailed description is omitted.

For the heat treatment performed after the formation of the insulating layer 116, the description in Method 1 for manufacturing transistor can be referred to, and thus the detailed description is omitted.

Through the above-described steps, the transistor 100C can be manufactured.

<Method 3 for Manufacturing Transistor>

A method for manufacturing the transistor 100C, which is different from the manufacturing method described in Method 1 for manufacturing transistor, is described below. The manufacturing steps up to formation of the conductive layers 112a and 112b are the same as those in Method 1 for manufacturing transistor described above (see FIG. 12B).

[Formation of Insulating Layer 114]

Next, the insulating layers 114a and 114b are formed to cover the conductive layer 112a, the conductive layer 112b, the metal oxide layer 108, and the like (FIG. 13A). For formation of the insulating layers 114a and 114b, the description in Method 1 for manufacturing transistor can be referred to, and thus the detailed description is omitted.

After the insulating layer 114a is formed, the insulating layer 114b is preferably formed in vacuum successively without exposure of the surface of the insulating layer 114a to the air. With successive formation, attachment of impurities attributed to atmospheric components to the surface of the insulating layer 114a can be suppressed.

[Formation of Insulating Layer 116]

Next, the insulating layer 116 is formed to cover the insulating layer 114.

Figure 13B:
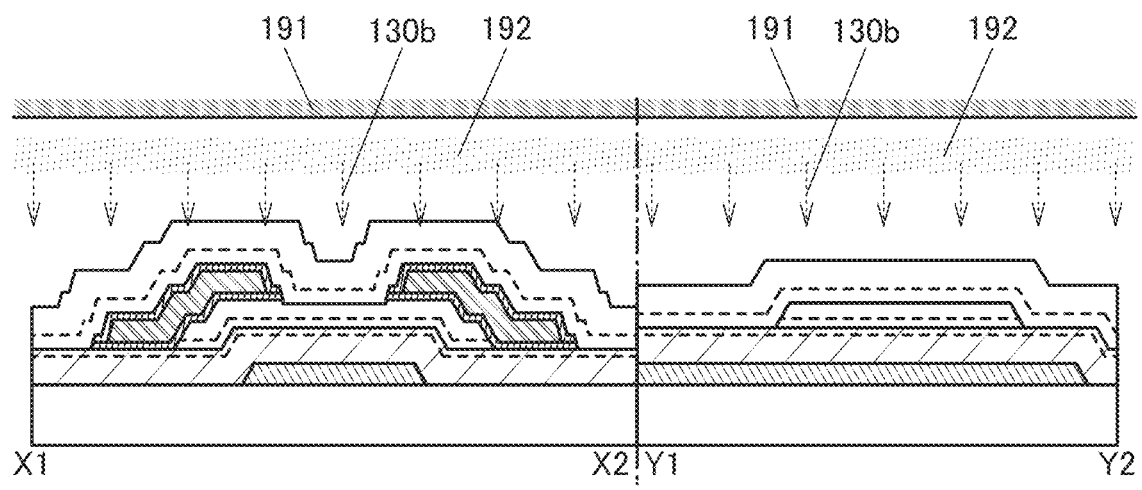

For the insulating layer 116, the above-described material can be used. For example, aluminum oxide can be used for the insulating layer 116. Alternatively, for example, an In—Ga—Zn oxide can be used for the insulating layer 116. When the proportion of gallium is higher than that of indium in the In—Ga—Zn oxide (for example, In:Ga:Zn=1:3:2 at an atomic ratio), the bandgap of the insulating layer 116 is increased. This atomic ratio is preferable. For formation of the insulating layer 116, a sputtering apparatus can be used. FIG. 13B is a schematic cross-sectional view of an inside of a deposition apparatus when the insulating layer 116 is formed over the insulating layer 114b. In FIG. 13B, a target 191 placed inside the sputtering apparatus and plasma 192 formed under the target 191 are schematically illustrated.

First, in formation of the insulating layer 116, plasma is discharged in an atmosphere containing an oxygen gas. At that time, oxygen 130b is added into the insulating layer 114b over which the insulating layer 116 is formed. In forming the insulating layer 116, an inert gas (such as a helium gas, an argon gas, or a xenon gas) may be mixed into the oxygen gas. The oxygen 130b is supplied to the insulating layers 114a and 114b in some cases.

For example, the proportion of the oxygen gas in a deposition gas for forming the insulating layer 116 is higher than 0% and lower than or equal to 100%, preferably higher than or equal to 10% and lower than or equal to 100%, further preferably higher than or equal to 30% and lower than or equal to 100%.

After the insulating layer 114a is formed, the insulating layer 114b is preferably formed in vacuum successively without exposure of the surface of the insulating layer 114a to the air. With successive formation, attachment of impurities attributed to atmospheric components to the surface of the insulating layer 114a can be suppressed. After the insulating layer 114b is formed, the insulating layer 116 is preferably formed in vacuum successively without exposure of the surface of the insulating layer 114b to the air. With successive formation, attachment of impurities attributed to atmospheric components to the surface of the insulating layer 114b can be suppressed. It is further preferable that the insulating layer 114a, the insulating layer 114b, and the insulating layer 116 be successively formed in vacuum because attachment of impurities attributed to atmospheric components to the surfaces of the insulating layers 114a and 114b can be suppressed.

Heat treatment is preferably performed after the insulating layer 114a, the insulating layer 114b, and the insulating layer 116 are formed. This heat treatment can reduce nitrogen oxide included in the insulating layer 114a, the insulating layer 114b, and the insulating layer 116. By the heat treatment, part of oxygen contained in the insulating layers 114a and 114b can be transferred to the metal oxide layer 108, so that the amount of oxygen vacancy and VoH included in the metal oxide layer 108 can be reduced.

For the heat treatment performed after the insulating layer 116, the description in Method 1 for manufacturing transistor can be referred to, and thus the detailed description is omitted.

Through the above-described steps, the transistor 100C can be manufactured.

<Method 4 for Manufacturing Transistor>

A method for manufacturing the transistor 100C, which is different from the manufacturing method described in Method 1 and Method 3 for manufacturing transistor, is described below. The manufacturing steps up to formation of the conductive layers 112a and 112b are the same as those in Method 1 for manufacturing transistor described above (see FIG. 12B).

[Formation of Insulating Layer 114]

Next, the insulating layers 114a and 114b are formed to cover the conductive layer 112a, the conductive layer 112b, the metal oxide layer 108, and the like (FIG. 13A). For the formation of the insulating layers 114a and 114b, the description in Method 1 for manufacturing transistor can be referred to, and thus the detailed description is omitted.

After the insulating layer 114a is formed, the insulating layer 114b is preferably formed in vacuum successively without exposure of the surface of the insulating layer 114a to the air. With successive formation, attachment of impurities attributed to atmospheric components to the surface of the insulating layer 114a can be suppressed.

Heat treatment may be performed after the insulating layer 114b is formed. This heat treatment can reduce nitrogen oxide included in the insulating layers 114a and 114b. By the heat treatment, part of oxygen contained in the insulating layers 114a and 114b can be transferred to the metal oxide layer 108, so that the amount of oxygen vacancy and VoH included in the metal oxide layer 108 can be reduced.

The heat treatment is performed typically at a temperature higher than or equal to 150° C. and lower than or equal to 400° C., preferably higher than or equal to 300° C. and lower than or equal to 400° C., further preferably higher than or equal to 320° C. and lower than or equal to 370° C. The heat treatment may be performed in an atmosphere of nitrogen, oxygen, ultra-dry air (air in which the water content is less than or equal to 20 ppm, preferably less than or equal to 1 ppm, and further preferably less than or equal to 10 ppb), or a rare gas (e.g., argon or helium). The atmosphere of nitrogen, oxygen, ultra-dry air, or a rare gas preferably does not contain hydrogen, water, and the like. An electric furnace, an RTA apparatus, or the like can be used for the heat treatment.

[Oxygen Supply Treatment]

Figure 14A:
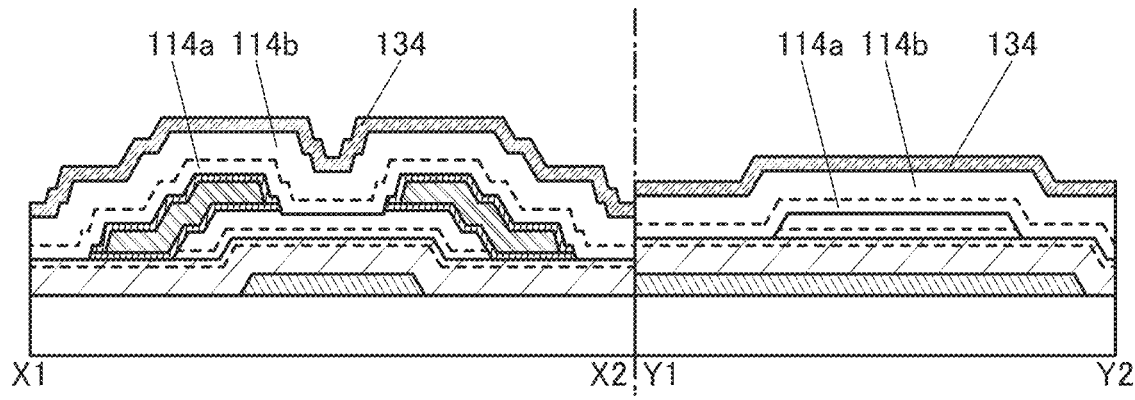
FIGS. 14A to 14C illustrate a method for manufacturing a semiconductor device.

Next, a conductive film 134 is formed to cover the insulating layer 114b (FIG. 14A).

As the conductive film 134, a metal oxide film, a metal film, or an alloy film can be used. An extremely thin film is preferable for the conductive film 134, and the thickness can be, for example, greater than or equal to 1 nm and less than or equal to 20 nm, preferably greater than or equal to 2 nm and less than or equal to 15 nm, further preferably greater than or equal to 3 nm and less than or equal to 10 nm, typically about 5 nm.

Examples of the metal oxide that can be used for the conductive film 134 include an In—Sn oxide, an In—W oxide, an In—W—Zn oxide, an In—Ti oxide, an In—Ti—Sn oxide, an In—Zn oxide, an In—Sn—Si oxide, and an In—Ga—Zn oxide.

Alternatively, as the conductive film 134, a metal film or an alloy film containing one or more of aluminum, titanium, chromium, iron, cobalt, nickel, copper, zinc, gallium, molybdenum, silver, indium, tin, tantalum, tungsten, and the like can be used.

Note that as the conductive film 134, a semiconductor film may be used. Such a semiconductor film includes silicon, germanium, or the like, a compound semiconductor thereof, an oxide semiconductor, or the like.

When the conductive film 134 is formed using a metal oxide in an atmosphere containing oxygen by a sputtering method or the like, oxygen can be supplied into the insulating layers 114a and 114b while the conductive film 134 is being formed. Thus, the metal oxide is preferably used.

The highest temperature in formation of the conductive film 134 is lower than or equal to 350° C., preferably lower than or equal to 340° C., further preferably lower than or equal to 330° C., still further preferably lower than or equal to 300° C.

Figure 14B:
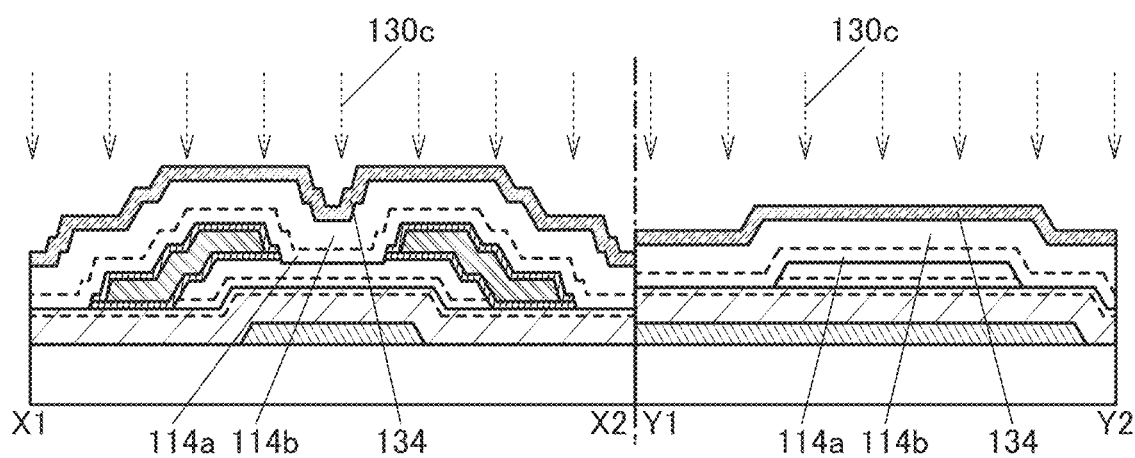

Then, treatment for supplying oxygen 130c to the insulating layers 114a and 114b through the conductive film 134 (hereinafter, referred to as oxygen supply treatment) is performed (FIG. 14B).

As the oxygen supply treatment, plasma treatment in an oxygen atmosphere (also referred to as oxygen plasma treatment) is preferably performed. When oxygen is made to be plasma, an oxygen radical, an oxygen atom, or an oxygen ion can be added to the insulating layers 114a and 114b through the conductive film 134. The oxygen flow rate ratio in a gas introduced into an apparatus is preferably high, for example, higher than or equal to 50% and lower than or equal to 100%, preferably higher than or equal to 60% and lower than or equal to 100%, further preferably higher than or equal to 80% and lower than or equal to 100%, still further preferably 100%.

In particular, a treatment apparatus including parallel-plate electrodes (a pair of electrodes) is preferably used for the plasma treatment. In this case, by performing plasma treatment in a state where a bias voltage is applied between the pair of electrodes, a larger amount of oxygen can be supplied to the insulating layers 114a and 114b. The bias voltage is applied so that the oxygen ion in the oxygen plasma easily transfers on the substrate side, for example. The oxygen ion in the oxygen plasma is easily charged positively to be $O^+$, $O^{2+}$, or the like, for example. Thus, when a bias voltage is applied so that the electrode positioned on the substrate side has a negative potential, the oxygen ion easily transfers toward the substrate side.

If oxygen is supplied directly to the insulating layers 114a and 114b in a structure without the conductive film 134, part of the oxygen supplied to the insulating layers 114a and 114b is released to the outside in some cases. However, in this manufacturing method, the conductive film 134 is provided over the insulating layers 114a and 114b, and thus the oxygen supplied to the insulating layers 114a and 114b can be prevented from being released to the outside. Furthermore, with the conductive film 134, the damage to the insulating layers 114a and 114b can be alleviated.

The conductive film 134 over the insulating layers 114a and 114b brings an effect of drawing the ionized oxygen easily when a bias voltage is applied between the pair of electrodes in the oxygen supply treatment. Thus, with the conductive film 134, the effect obtained by application of the bias voltage is synergistically increased.

As the treatment apparatus, a dry etching apparatus, an ashing apparatus, a PECVD apparatus, or the like is preferably used because the above apparatus can also be used in other treatment. In particular, an ashing apparatus is preferably used.

The oxygen supply treatment is, for example, higher than or equal to room temperature and lower than or equal to 350° C., preferably higher than or equal to 150° C. and lower than 350° C., further preferably higher than or equal to 200° C. and lower than or equal to 340° C.

When a bias voltage is applied between a pair of electrodes in the treatment chamber, the bias voltage may be higher than or equal to 10 V and lower than or equal to 1 kV, for example. The power density of bias voltage may be higher than or equal to 1 W/cm$^2$ and lower than or equal to 5 W/cm$^2$, for example.

The oxygen supply treatment is not limited to the above, and a method enabling the supply of oxygen to the insulating layers 114a and 114b through the conductive film 134 can be used. For example, oxygen may be supplied to the insulating film through the conductive film by an ion implantation method, an ion doping method, a plasma immersion ion implantation method, or the like. Alternatively, heat treatment may be performed in an oxygen atmosphere. Even with such treatment, the conductive film 134 can serve as a cap film for preventing the release of the oxygen supplied to the insulating layers 114a and 114b and also serve as a relieving layer for alleviating the damage to the insulating layers 114a and 114b.

The conductive film 134 is embrittled through the oxygen supply treatment in some cases. In particular, when a metal or an alloy is used for the conductive film 134, the conductive film 134 is oxidized through the oxygen supply treatment and has high resistance in some cases. Furthermore, the conductive film 134 is partly etched and thus thinned in some cases. In such a case, it is preferable that the conductive film 134 be removed by etching.

Figure 14C:
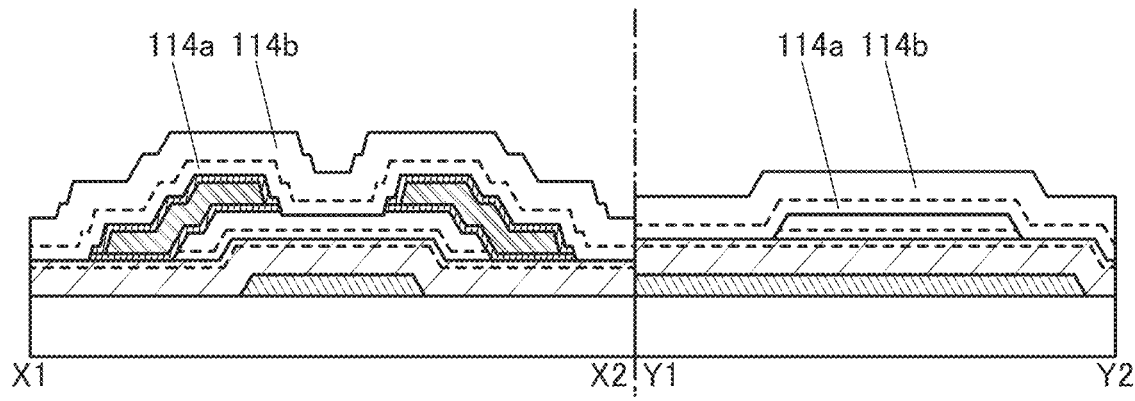

FIG. 14C is a cross-sectional view illustrating a state after the conductive film 134 is etched.

The highest temperature in etching of the conductive film 134 is lower than or equal to 350° C., preferably lower than or equal to 340° C., further preferably lower than or equal to 330° C., still further preferably lower than or equal to 300° C.

As the oxygen supply treatment, plasma treatment in an atmosphere containing oxygen may be performed on a structure without the conductive film 134. Without the conductive film 134, the productivity can be improved.

[Formation of Insulating Layer 116]

Next, the insulating layer 116 is formed to cover the insulating layer 114. For the formation of the insulating layer 116, Method 1 for manufacturing transistor can be referred to, and thus the detailed description is omitted.

Through the above-described steps, the transistor 100C can be manufactured.

The above is the description of the manufacturing method example of the transistor.

At least part of any of the structural examples, the manufacturing method examples, the drawings corresponding thereto, and the like described in this embodiment can be implemented in combination with any of the other structural examples, the other manufacturing method examples, the other drawings corresponding thereto, and the like as appropriate.

At least part of this embodiment can be implemented in combination with any of the other embodiments and the other examples described in this specification as appropriate.

Embodiment 2

In this embodiment, an example of a display device that includes any of the transistors described in the above embodiment will be described.

Structural Example

Figure 15A:
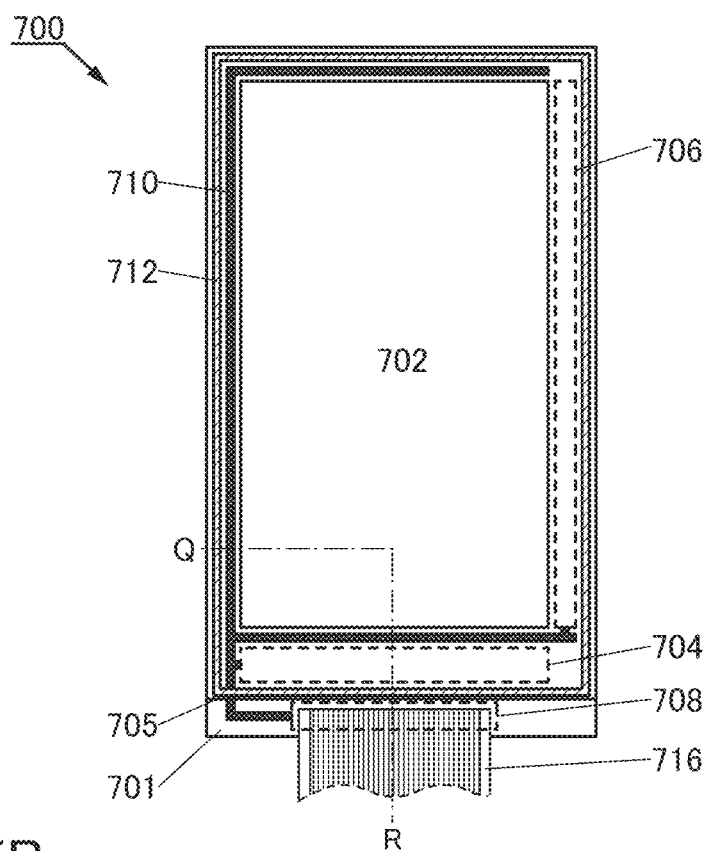
FIGS. 15A and 15B each illustrate a structure example of a display device.

FIG. 15A is a top view of an example of a display device. A display device 700 in FIG. 15A includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 15A, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. The variety of signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of a variety of elements. As examples of the elements, electroluminescent (EL) element (e.g., an EL element containing organic and inorganic materials, an organic EL element, an inorganic EL element, or an LED), a light-emitting transistor element (a transistor which emits light depending on current), an electron emitter, a liquid crystal element, an electronic ink display, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used to obtain a full-color display device in which white light (W) is used for a backlight (e.g., an organic EL element, an inorganic EL element, an LED, or a fluorescent lamp). As the coloring layer, red (R), green (G), blue (B), yellow (Y), or the like may be combined as appropriate, for example. With use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W.

By using a self-luminous element, power consumption can be further reduced as compared to the case of using the coloring layer in some cases.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 15B:
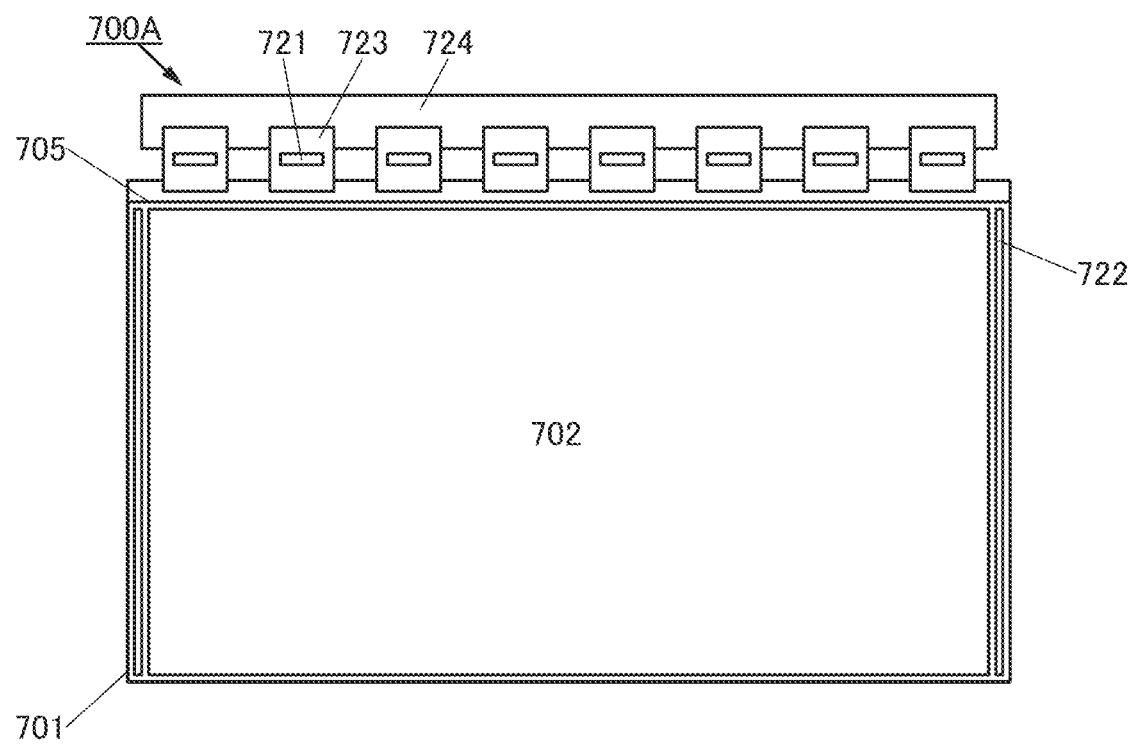

A display device 700A illustrated in FIG. 15B is a display device favorably used for an electronic device with a large screen. For example, the display device 700A can be suitably used for a television device, a monitor, a digital signage, or the like.

The display device 700A includes a plurality of source driver ICs 721 and a pair of gate driver circuits 722.

The plurality of source driver ICs 721 are attached to respective FPCs 723. In each of the plurality of FPCs 723, one of terminals is connected to the first substrate 701, and the other terminal is connected to the print circuit board 724. The printed circuit board can be mounted on the electronic device in such a manner that the FPCs 723 are bent so that the printed circuit board 724 is located on the back side of the pixel portion 702.

On the other hand, a gate driver circuit 722 is provided over the first substrate 701. Thus, an electronic device with narrow frame can be fabricated.

With such a structure, a large-size and high-resolution display device can be provided. For example, such a structure can be adopted to a display device whose screen size (diagonal) is more than 30 inches or more, 40 inches or more, 50 inches or more, or 60 inches or more. Furthermore, a display device with extremely high resolution such as full high definition, 4K2K, or 8K4K can be provided.

<Cross-Sectional Structure Example>

Figure 16:
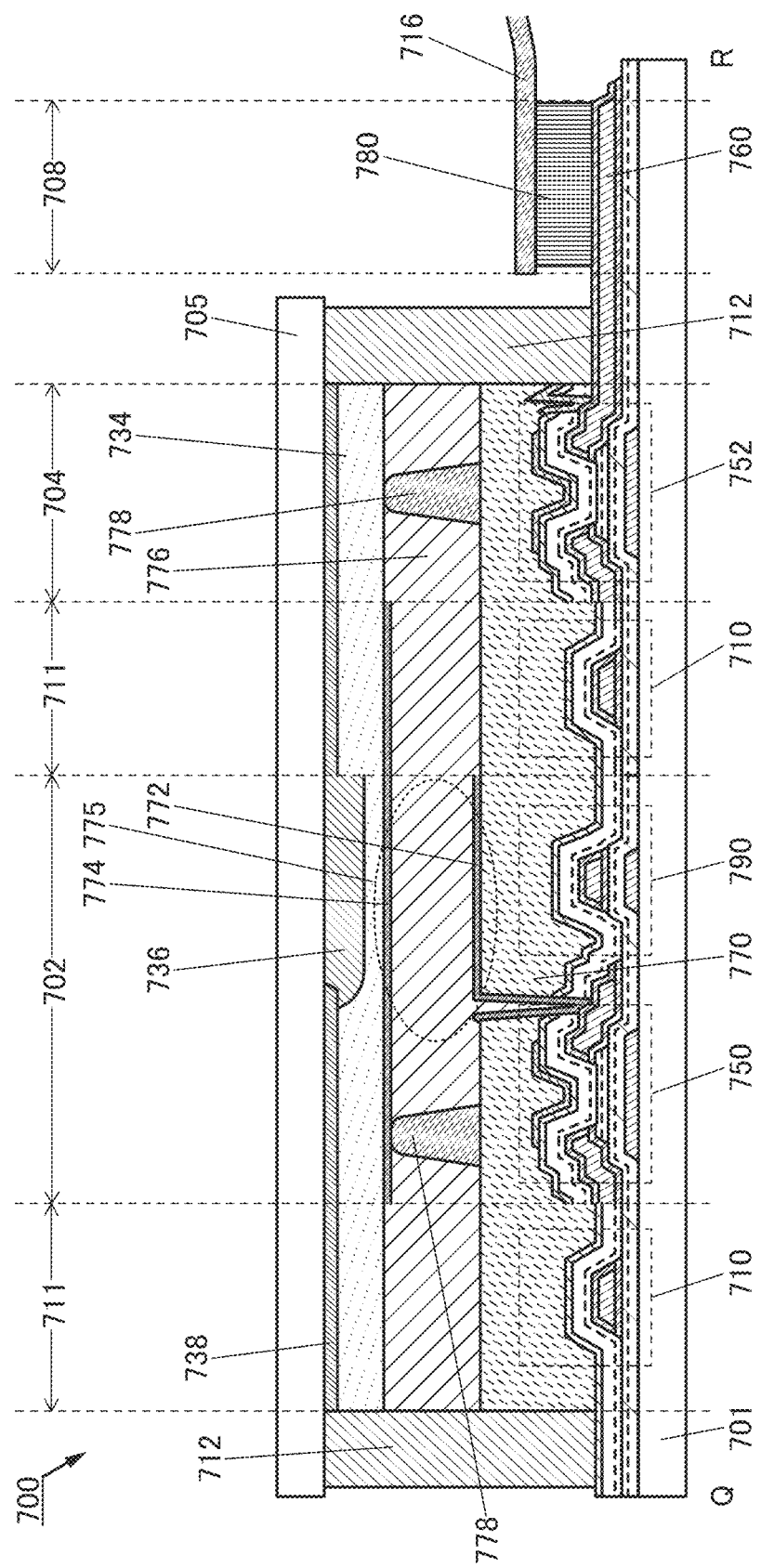
FIG. 16 illustrates a structure example of a display device.
Figure 17:
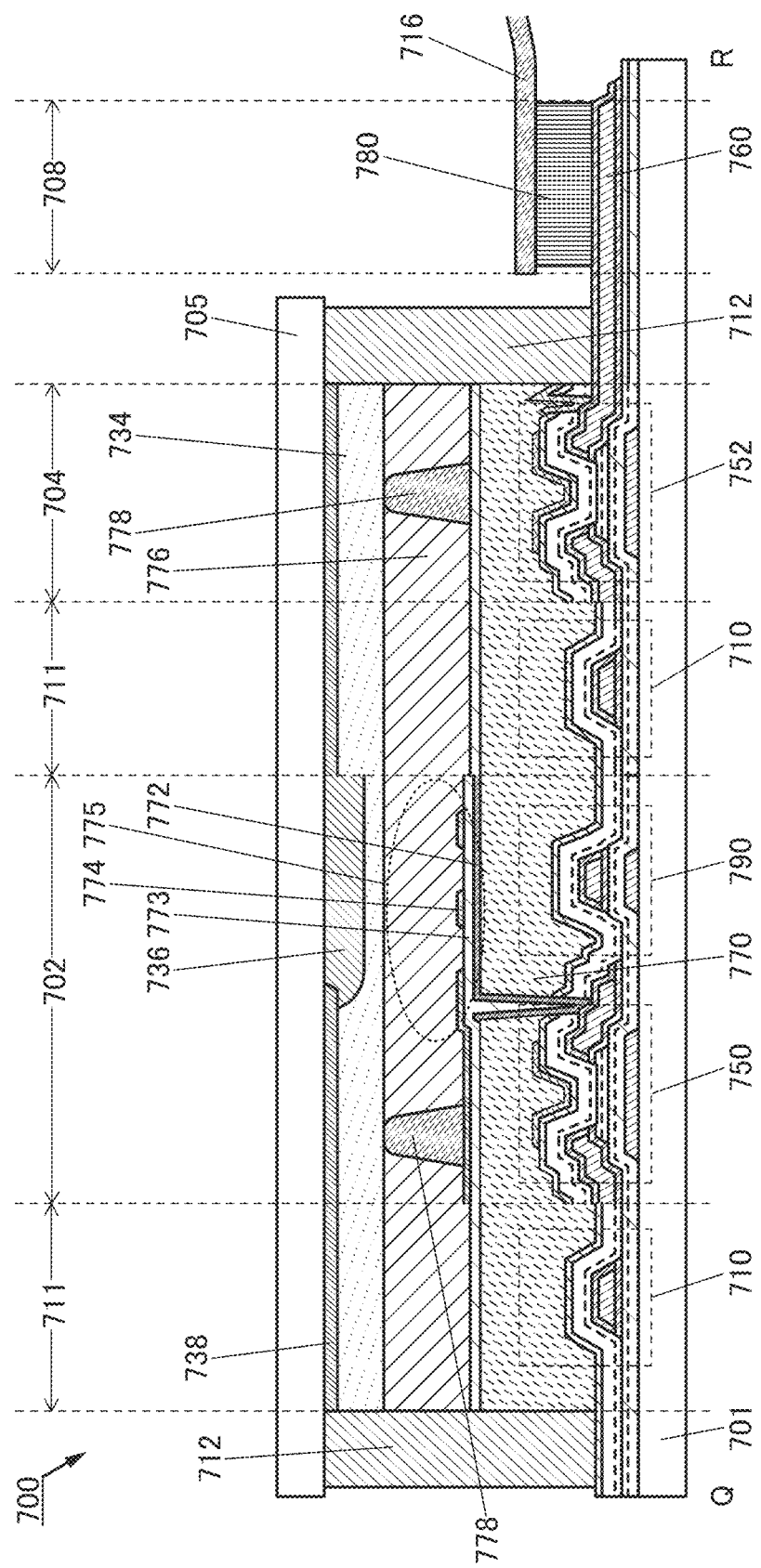
FIG. 17 illustrates a structure example of a display device.
Figure 18:
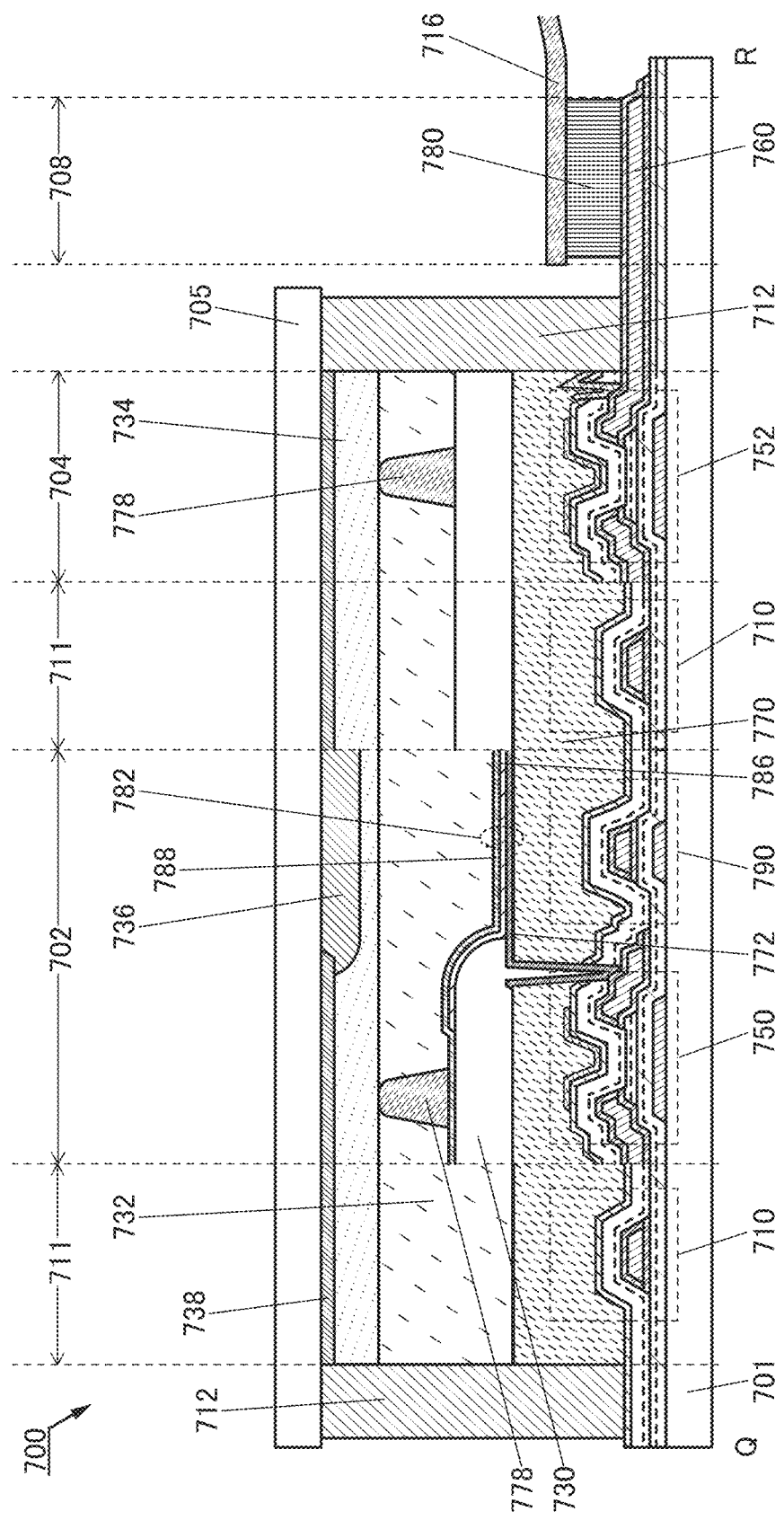
FIG. 18 illustrates a structure example of a display device.

Below, a structure including a liquid crystal element as a display element and a structure including an EL element as a display element are described with reference to FIG. 16, FIG. 17, and FIG. 18. FIG. 16 and FIG. 17 are each a cross-sectional view taken along a dashed-dotted line Q-R in FIG. 15A and illustrate the structure including a liquid crystal element as a display element. FIG. 18 is a cross-sectional view taken along the dashed-dotted line Q-R in FIG. 15 and illustrates the structure including an EL element as a display element.

Portions common to FIG. 16, FIG. 17, and FIG. 18 will be described first, and then, different portions will be described.

[Common Portions in Display Devices]

The display device 700 in FIG. 16, FIG. 17, and FIG. 18 includes a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

As the transistors 750 and 752, any of the transistors described in Embodiment 1 can be used.

The transistors used in this embodiment each include an oxide semiconductor film which is highly purified and in which formation of oxygen vacancies is suppressed. The transistor can have low off-state current. Accordingly, an electrical signal such as an image signal can be held for a longer period, and a writing interval can be set longer in an on state. Accordingly, the frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 includes a lower electrode and an upper electrode. The lower electrode is formed through a step of processing a conductive film to be a conductive film functioning as a first gate electrode of the transistor 750. The upper electrode is formed through a step of processing a conductive film to be a conductive film functioning as a second gate electrode of the transistor 750. Between the lower electrode and the upper electrode, an insulating film formed through a step of forming an insulating film to be an insulating film functioning as a first gate insulating film of the transistor 750 and insulating films formed through a step of forming insulating films to be insulating films functioning as protective insulating films over the transistor 750 are provided. That is, the capacitor 790 has a stacked-layer structure in which the insulating films functioning as a dielectric film are positioned between a pair of electrodes.

In FIG. 16, FIG. 17, and FIG. 18, a planarization insulating film 770 is provided over the transistor 750, the transistor 752, and the capacitor 790.

Although FIG. 16, FIG. 17, and FIG. 18 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, or a structure in which a bottom-gate transistor is used in the pixel portion 702 and a top-gate transistor is used in the source driver circuit portion 704 may be employed. Note that the term "source driver circuit portion 704" can be replaced by the term "gate driver circuit portion".

The signal line 710 is formed through the same process as the conductive films functioning as source electrodes and drain electrodes of the transistors 750 and 752. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is provided to control the thickness (cell gap) between the first substrate 701 and the second substrate 705. Note that a spherical spacer may be used as the structure body 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

Structure Example of Display Device Using Liquid Crystal Element

The display device 700 in FIG. 16 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 16 is capable of displaying an image in such a manner that transmission or non-transmission is controlled by change in the alignment state of the liquid crystal layer 776 depending on a voltage applied to the conductive film 772 and the conductive film 774.

The conductive film 772 is electrically connected to the conductive film functioning as a source electrode or a drain electrode included in the transistor 750. The conductive film 772 is formed over the planarization insulating film 770 to function as a pixel electrode, i.e., one electrode of the display element.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light.

In the case where a conductive film that reflects visible light is used as the conductive film 772, the display device 700 is a reflective liquid crystal display device. In the case where a conductive film that transmits visible light is used as the conductive film 772, the display device 700 is a transmissive liquid crystal display device. In the case of a reflective liquid crystal display device, a polarizing plate is provided in the viewer side. In the case of a transmissive liquid crystal display device, a pair of polarizing plates between which a liquid crystal element is sandwiched is provided.

When a structure over the conductive film 772 is changed, a driving method of a liquid crystal element can vary. FIG. 17 illustrates an example of this structure. The display device 700 illustrated in FIG. 17 is an example of employing a horizontal electric field mode (e.g., an FFS mode) as a driving mode of the liquid crystal element. In the structure illustrated in FIG. 17, an insulating film 773 is provided over the conductive film 772, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 16 and FIG. 17, the conductive film 772 and/or the conductive film 774 may be provided with an alignment film on a side in contact with the liquid crystal layer 776. Although not illustrated in FIG. 16 and FIG. 17, an optical member (optical substrate) or the like, such as a polarizing member, a retardation member, or an anti-reflection member, may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition which includes liquid crystal exhibiting a blue phase and a chiral material has a short response time and optical isotropy, which makes the alignment process unneeded. An alignment film does not need to be provided and rubbing treatment is thus not necessary; accordingly, electrostatic discharge damage caused by the rubbing treatment can be prevented and the defects and damage of the liquid crystal display device in the manufacturing process can be reduced. Moreover, the liquid crystal material which exhibits a blue phase has a small viewing angle dependence.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

Structure Example of Display Device Using Light-Emitting Element

The display device 700 illustrated in FIG. 18 includes a light-emitting element 782. The light-emitting element 782 includes a conductive film 772, an EL layer 786, and a conductive film 788. The display device 700 illustrated in FIG. 18 can display an image by utilizing light emission from the EL layer 786 of the light-emitting element 782 provided in each pixel. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. The quantum dot containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 in FIG. 18, the insulating film 730 is provided over the planarization insulating film 770 and the conductive film 772. The insulating film 730 covers part of the conductive film 772. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 772 side, or a dual-emission structure in which light is emitted to both the conductive film 772 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. The structure of the display device 700 is not limited to the example in FIG. 18, in which the coloring film 736 is provided. For example, a structure without the coloring film 736 may also be employed in the case where the EL layer 786 is formed by separate coloring, i.e., formed into an island shape per pixel.

Structure Example of Display Device Provided with Input/Output Device

An input/output device may be provided in the display device 700 illustrated in FIG. 16, FIG. 17, and FIG. 18. As an example of the input/output device, a touch panel or the like can be given.

Figure 19:
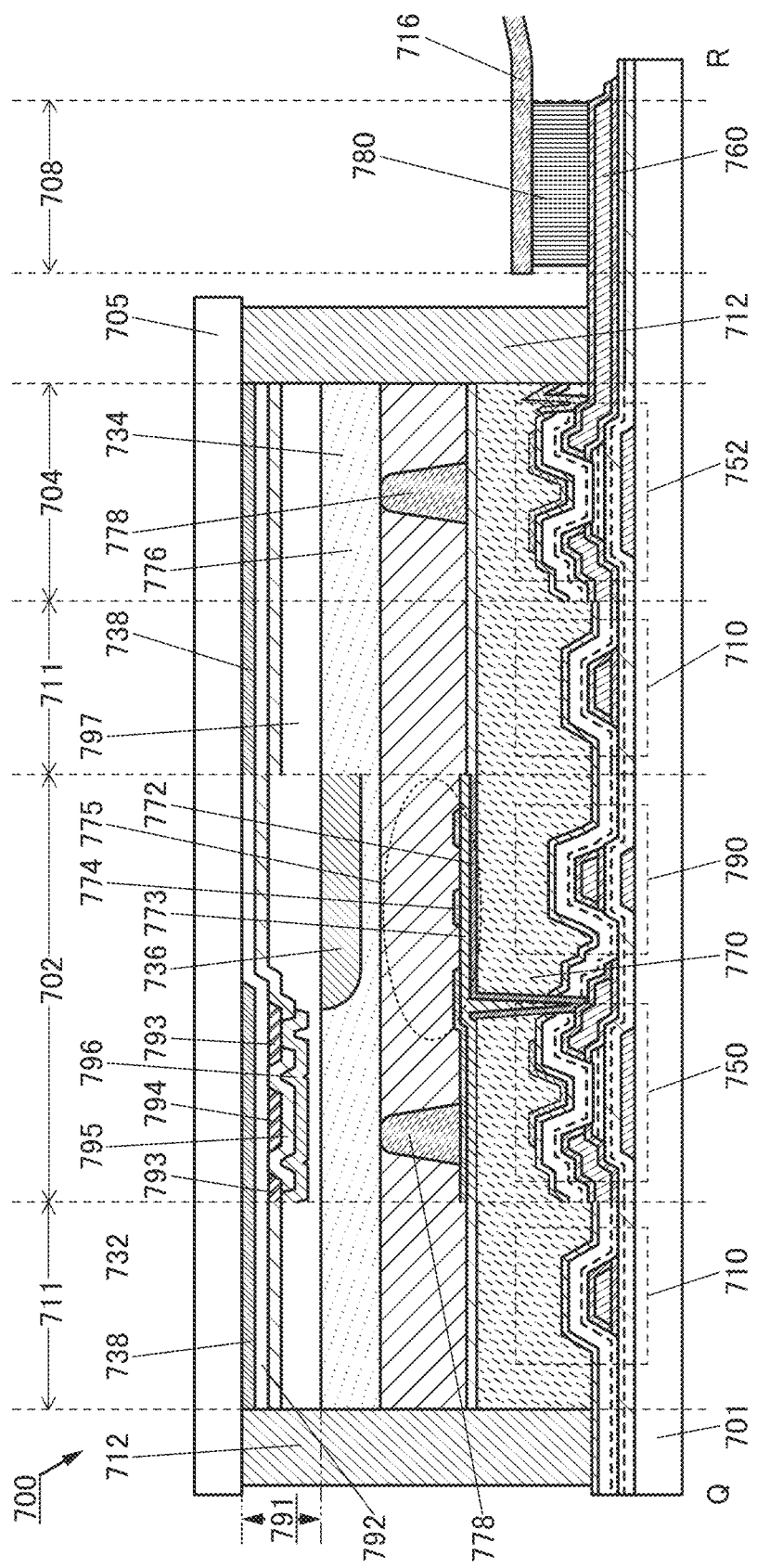
FIG. 19 illustrates a structure example of a display device.
Figure 20:
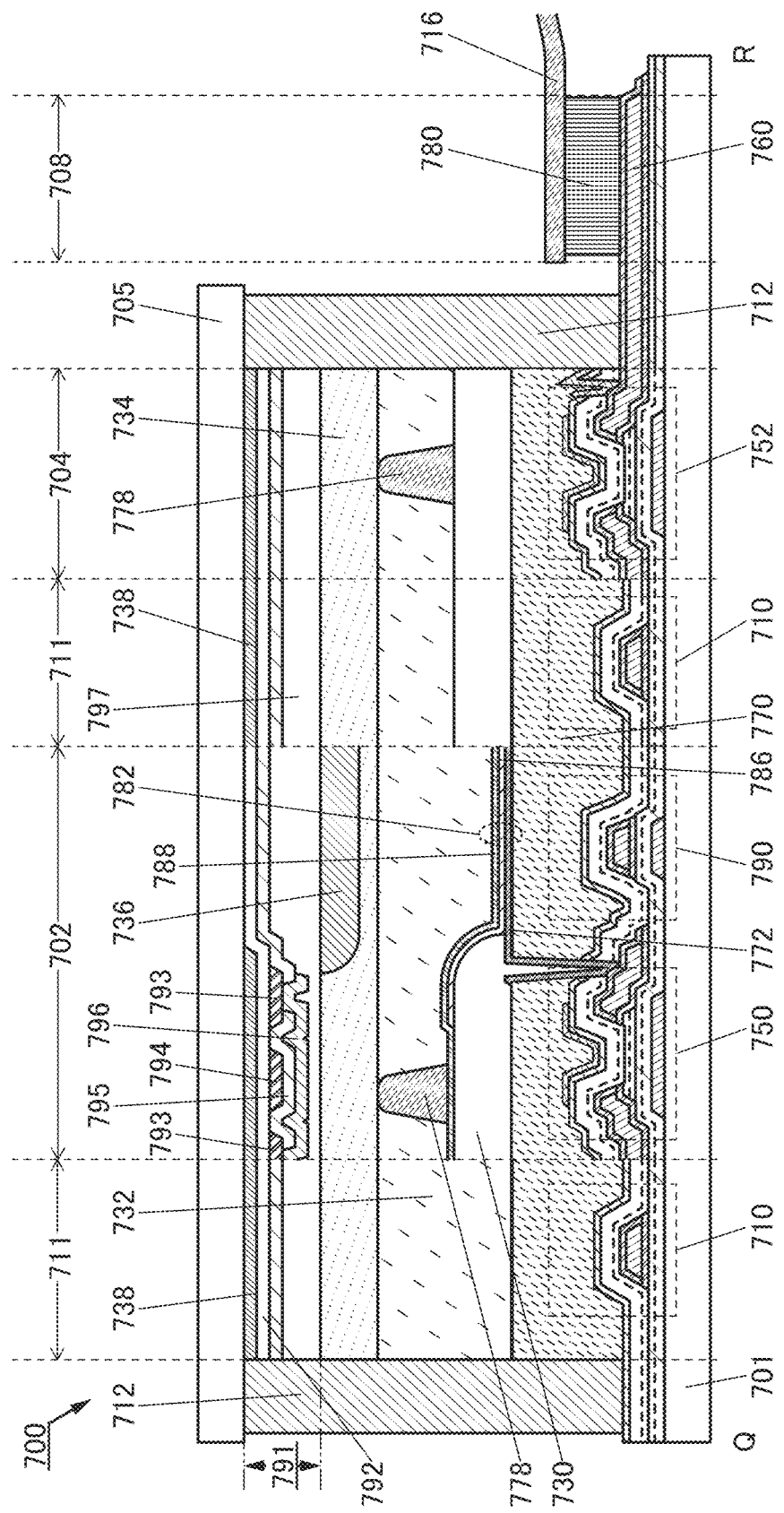
FIG. 20 illustrates a structure example of a display device.

FIG. 19 illustrates a structure in which the display device 700 illustrated in FIG. 17 includes a touch panel 791. FIG. 20 illustrates a structure in which the display device 700 illustrated in FIG. 18 includes the touch panel 791.

FIG. 19 is a cross-sectional view of the structure in which the touch panel 791 is provided in the display device 700 illustrated in FIG. 17, and FIG. 20 is a cross-sectional view of the structure in which the touch panel 791 is provided in the display device 700 illustrated in FIG. 18.

First, the touch panel 791 illustrated in FIG. 19 and FIG. 20 will be described below.

The touch panel 791 illustrated in FIG. 19 and FIG. 20 is what is called an in-cell touch panel provided between the second substrate 705 and the coloring film 736. The touch panel 791 is formed on the second substrate 705 side before the light-blocking film 738 and the coloring film 736 are formed.

The touch panel 791 includes the light-blocking film 738, an insulating film 792, an electrode 793, an electrode 794, an insulating film 795, an electrode 796, and an insulating film 797. A change in the capacitance between the electrodes 793 and 794 can be detected when an object such as a finger or a stylus approaches, for example.

A portion in which the electrode 793 intersects with the electrode 794 is illustrated in the upper portion of the transistor 750 illustrated in FIG. 19 and FIG. 20. Through openings in the insulating film 795, the electrode 796 is electrically connected to the two electrodes 793 between which the electrode 794 is positioned. Note that a structure in which a region where the electrode 796 is provided is provided in the pixel portion 702 is illustrated in FIG. 19 and FIG. 20 as an example; however, one embodiment of the present invention is not limited thereto. For example, the region where the electrode 796 is provided may be provided in the source driver circuit portion 704.

The electrodes 793 and 794 are provided in a region overlapping with the light-blocking film 738. As illustrated in FIG. 19, it is preferable that the electrode 793 not overlap with the light-emitting element 782. As illustrated in FIG. 20, it is preferable that the electrode 793 not overlap with the liquid crystal element 775. In other words, the electrode 793 has an opening in a region overlapping with the light-emitting element 782 and the liquid crystal element 775. That is, the electrode 793 has a mesh shape. With this structure, the electrode 793 does not block light emitted from the light-emitting element 782. Alternatively, the electrode 793 can have a structure in which light transmitted through the liquid crystal element 775 is not blocked. Thus, since luminance is hardly reduced even when the touch panel 791 is placed, a display device with high visibility and low power consumption can be achieved. Note that the electrode 794 can have a similar structure.

In addition, since the electrodes 793 and 794 do not overlap with the light-emitting element 782, the electrodes 793 and 794 can be formed using a metal material with low visible light transmittance. Furthermore, since the electrode 793 and the electrode 794 do not overlap with the liquid crystal element 775, a metal material having low transmittance with respect to visible light can be used for the electrode 793 and the electrode 794.

Accordingly, the resistance of the electrodes 793 and 794 can be reduced as compared with an electrode using an oxide material with high visible light transmittance, so that the sensitivity of the touch panel can be increased.

For example, conductive nanowires may be used for the electrodes 793, 794, and 796. The nanowires may have a mean diameter greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of the electrodes 664, 665, and 667, the transmittance of visible light can be greater than or equal to 89% and the sheet resistivity can be greater than or equal to 40 Ω/square and less than or equal to 100 Ω/square.

Although the structure of the in-cell touch panel is illustrated in FIG. 19 and FIG. 20, one embodiment of the present invention is not limited thereto. For example, a touch panel formed over the display device 700, what is called an on-cell touch panel, or a touch panel attached to the display device 700, what is called an out-cell touch panel may be used.

In this manner, the display device of one embodiment of the present invention can be combined with various types of touch panels.

At least part of this embodiment can be implemented in combination with any of the other embodiments and the other examples described in this specification as appropriate.

Embodiment 3

In this embodiment, a display device that includes a semiconductor device of one embodiment of the present invention is described with reference to FIGS. 21A to 21C.
<Circuit Configuration of Display Device>

The display device illustrated in FIG. 21A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 which is based on the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches, for example. The source driver 504b can output, as the data signals, signals obtained by time-dividing the video signal by sequentially turning on the plurality of analog switches. The source driver 504b may include a shift register or the like.

A pulse signal and a data signal are inputted to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number less than or equal to X, and n is a natural number less than or equal to Y), a pulse signal is inputted from the gate driver 504a through the scan line GL_m, and a data signal is inputted from the source driver 504b through the data line DL_n in accordance with the potential of the scan line GL_m.

Figure 21A:
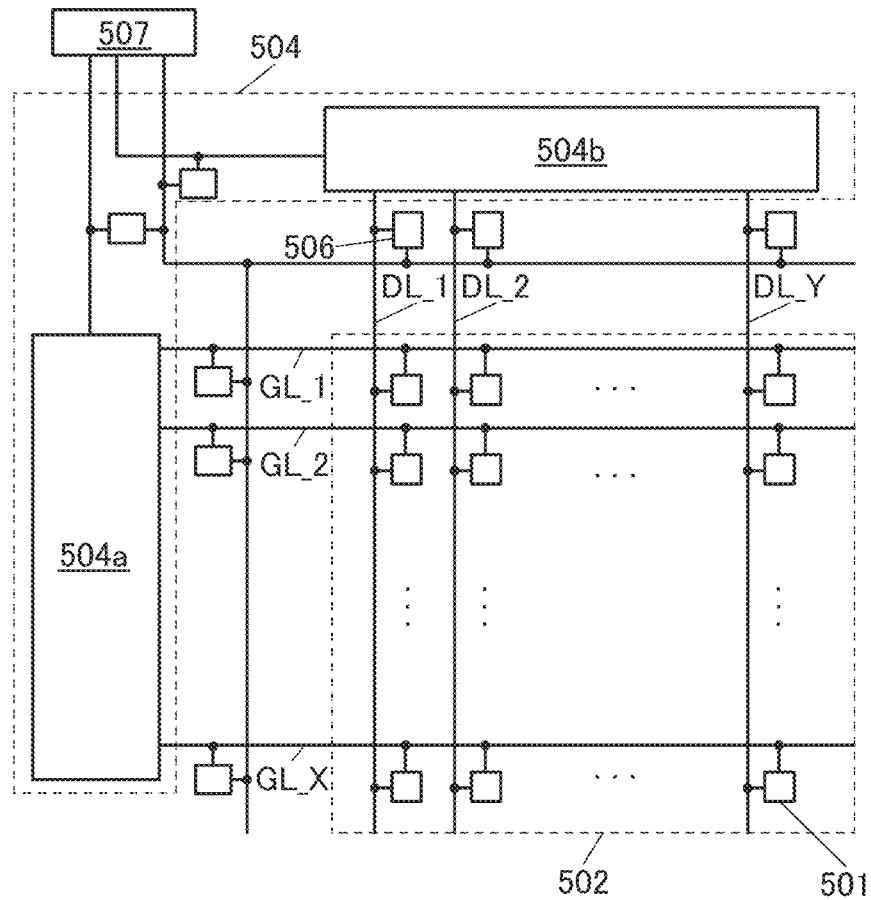
FIGS. 21A to 21C are a block diagram and circuit diagrams of a display device.

The protection circuit 506 shown in FIG. 21A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 21A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 21A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 22:
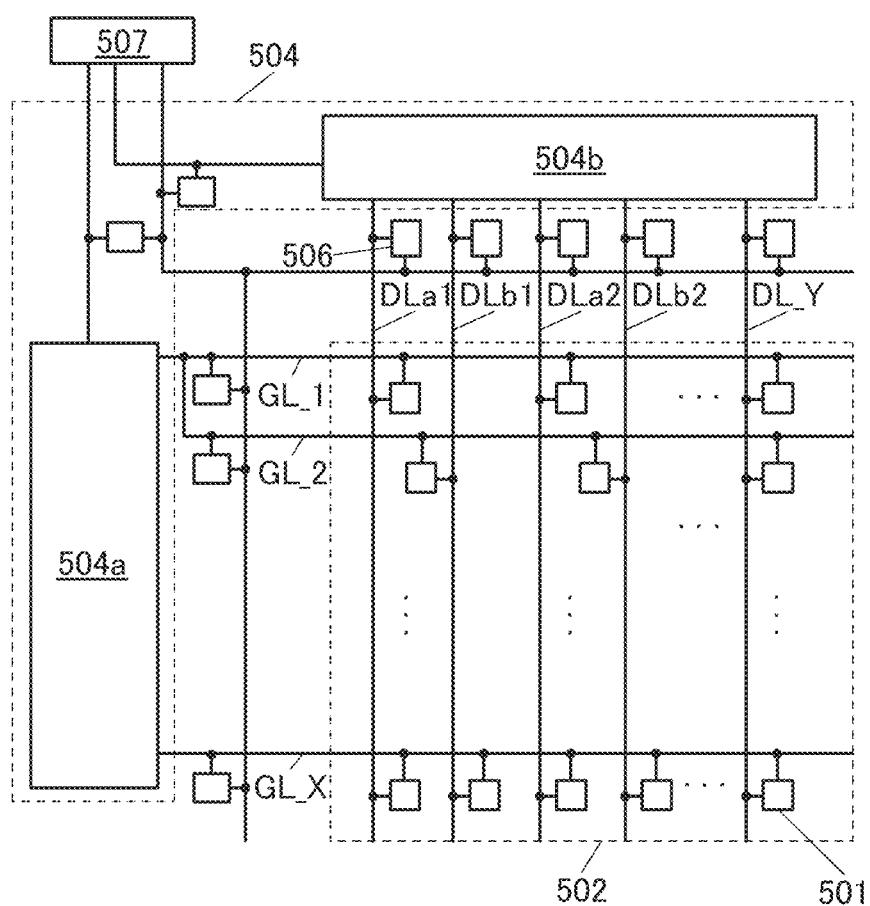
FIG. 22 is a block diagram of a display device.

FIG. 22 illustrates a configuration different from that in FIG. 21A. In FIG. 22, a pair of source lines (for example, a source line DLa1 and a source line DLb1) is provided so that a plurality of pixels arranged in the source line direction are sandwiched therebetween. In addition, two adjacent gate lines (for example, a gate line GL_1 and a gate line GL_2) are electrically connected to each other.

Pixels connected to the gate line GL_1 are electrically connected to one of the pair of source lines (such as the source line DLa1 or a source line DLa2). Pixels connected to the gate line GL_2 are connected to the other source line (such as the source line DLb1 or a source line DLb2).

In such a configuration, two gate lines can be selected concurrently, which enables one horizontal period to have a length twice that in the configuration in FIG. 21A. This facilitates an increase in resolution and an increase in screen size of a display device.

Figure 21B:
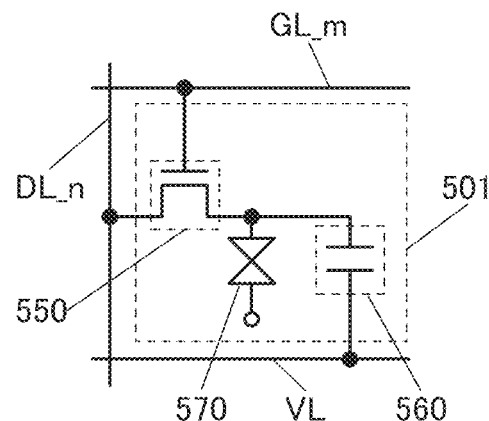

Each of the plurality of pixel circuits 501 in FIG. 21A can have the structure illustrated in FIG. 21B, for example.

The pixel circuit 501 illustrated in FIG. 21B includes a liquid crystal element 570, a transistor 550, and a capacitor 560. As the transistor 550, any of the transistors described in the above embodiment, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. A variety of liquid crystal elements and the driving methods thereof can be used.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 21B, the pixel circuits 501 are sequentially selected row by row by the gate driver 504a illustrated in FIG. 21A, whereby the transistors 550 are turned on and a data signal is written.

When the transistors 550 are turned off, the pixel circuits 501 in which the data has been written are brought into a holding state. This operation is sequentially performed row by row; thus, an image is displayed.

Figure 21C:
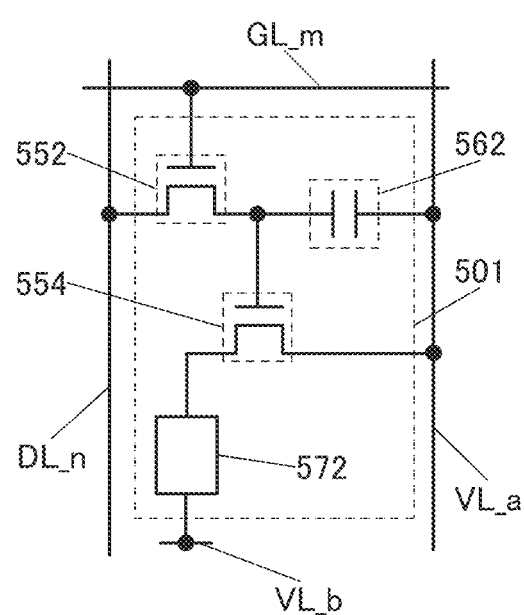

Alternatively, each of the plurality of pixel circuits 501 in FIG. 21A can have the structure illustrated in FIG. 21C, for example.

The pixel circuit 501 illustrated in FIG. 21C includes transistors 552 and 554, a capacitor 562, and a light-emitting element 572. Any of the transistors described in the above embodiment, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. Note that the light-emitting element 572 is not limited to an organic EL element; an inorganic EL element including an inorganic material may be used.

Note that a high power supply potential VDD is supplied to one of the potential supply line VL_a and the potential supply line VL_b, and a low power supply potential VSS is supplied to the other.

For example, in the display device including the pixel circuit 501 in FIG. 21C, the pixel circuits 501 are sequentially selected row by row by the gate driver 504a illustrated in FIG. 21A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with luminance corresponding to the amount of flowing current. This operation is sequentially performed row by row; thus, an image is displayed.

At least part of this embodiment can be implemented in combination with any of the other embodiments and the other examples described in this specification as appropriate.

Embodiment 4

In this embodiment, an electronic device of one embodiment of the present invention will be described with reference to drawings.

Electronic devices described below are provided with a display device of one embodiment of the present invention in a display portion. Thus, the electronic devices achieve high resolution. In addition, the electronic devices can achieve both high resolution and a large screen.

The display portion of the electronic device of one embodiment of the present invention can display an image with a resolution, for example, higher than the full high definition, such as 4K2K, 8K4K, 16K8K, or more. As a screen size of the display portion, the diagonal size can be greater than or equal to 20 inches, greater than or equal to 30 inches, greater than or equal to 50 inches, greater than or equal to 60 inches, or greater than or equal to 70 inches.

Examples of electronic devices include a television set, a desktop or laptop personal computer, a monitor of a computer or the like, a camera, such as a digital camera or a digital video camera, a digital photo frame, a mobile phone, a portable game console, a portable information terminal, an audio reproducing device, and a large game machine, such as a pachinko machine.

The electronic device or the lighting device of one embodiment of the present invention can be incorporated along a curved inside/outside wall surface of a house or a building or a curved interior/exterior surface of a car.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 23A:
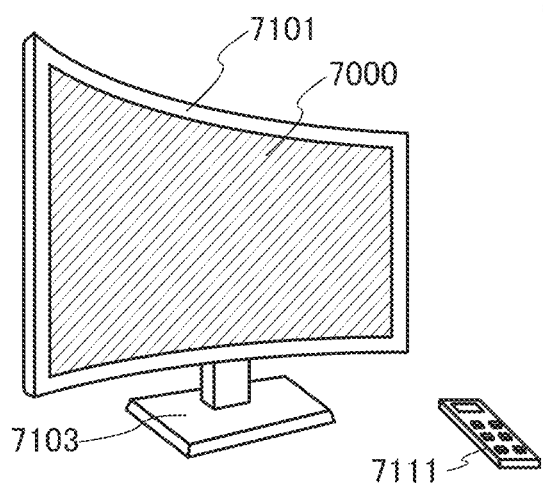
FIGS. 23A to 23D each illustrate a structure example of an electronic device.

FIG. 23A illustrates an example of a television device. In a television device 7100, a display portion 7000 is incorporated in a housing 7101. In addition, here, the housing 7101 is supported by a stand 7103.

The display device of one embodiment of the present invention can be used in the display portion 7000.

The television device 7100 illustrated in FIG. 23A can be operated with an operation switch provided in the housing 7101 or a separate remote controller 7111. Furthermore, the display portion 7000 may include a touch sensor. The display portion 7000 can be operated by touching the display portion 7000 with a finger or the like.

Furthermore, the remote controller 7111 may be provided with a display portion for displaying data outputted from the remote controller 7111. With operation keys or a touch panel of the remote controller 7111, channels and volume can be controlled and images displayed on the display portion 7000 can be controlled.

Note that the television device 7100 is provided with a receiver, a modem, and the like. With use of the receiver, general television broadcasting can be received. When the television device is connected to a communication network with or without wires via the modem, one-way (from a transmitter to a receiver) or two-way (between a transmitter and a receiver or between receivers) data communication can be performed.

Figure 23B:
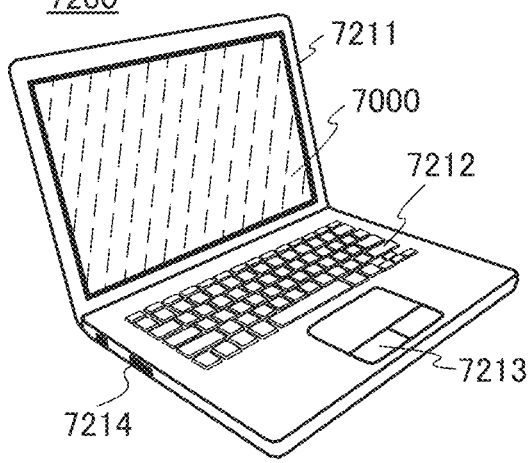

FIG. 23B illustrates a laptop personal computer 7200. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 23C:
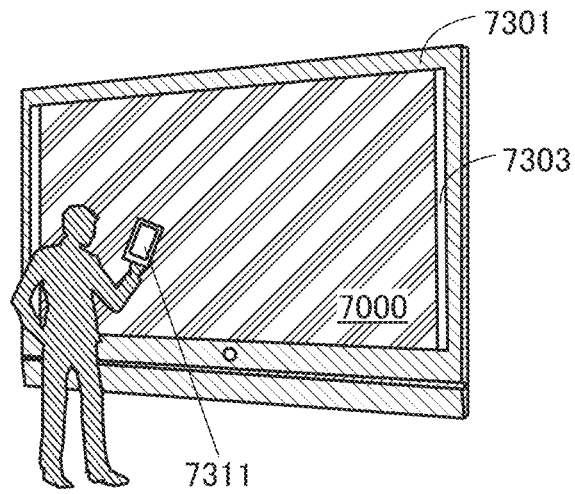
Figure 23D:
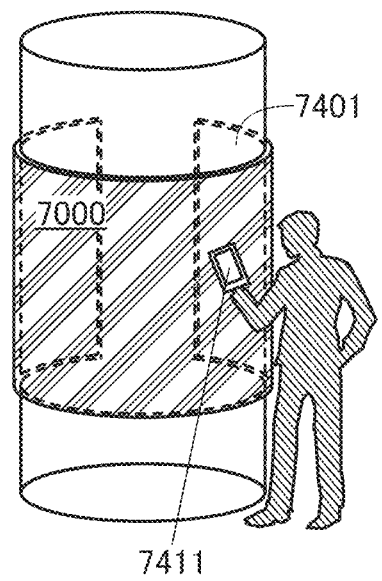

FIGS. 23C and 23D illustrate examples of digital signages.

A digital signage 7300 illustrated in FIG. 23C includes a housing 7301, the display portion 7000, a speaker 7303, and the like. Also, the digital signage can include an LED lamp, operation keys (including a power switch or an operation switch), a connection terminal, a variety of sensors, a microphone, and the like.

FIG. 23D illustrates a digital signage 7400 mounted on a cylindrical pillar 7401. The digital signage 7400 includes the display portion 7000 provided along a curved surface of the pillar 7401.

The display device of one embodiment of the present invention can be used for each of the display portions 7000 illustrated in FIGS. 23C and 23D.

A larger area of the display portion 7000 can provide more information at a time. In addition, the larger display portion 7000 attracts more attention, so that the effectiveness of the advertisement is expected to be increased, for example.

It is preferable to use a touch panel in the display portion 7000 because a device with such a structure does not just display a still or moving image, but can be operated by users intuitively. Alternatively, in the case where the display device of one embodiment of the present invention is used for providing information such as route information or traffic information, usability can be enhanced by intuitive operation.

Furthermore, as illustrated in FIGS. 23C and 23D, it is preferable that the digital signage 7300 or the digital signage 7400 work with an information terminal 7311 or an information terminal 7411 such as a smartphone a user has through wireless communication. For example, information of an advertisement displayed on the display portion 7000 can be displayed on a screen of the portable information terminal 7311 or 7411. Moreover, by operation of the portable information terminal 7311 or 7411, a displayed image on the display portion 7000 can be switched.

Furthermore, it is possible to make the digital signage 7300 or 7400 execute a game with use of the screen of the portable information terminal 7311 or 7411 as an operation means (controller). Thus, an unspecified number of people can join in and enjoy the game concurrently.

At least part of this embodiment can be implemented in combination with any of the other embodiments and the other examples described in this specification as appropriate.

Embodiment 5

In this embodiment, an example of a television device for which a display device of one embodiment of the present invention is used will be described with reference to drawings.

Figure 24A:
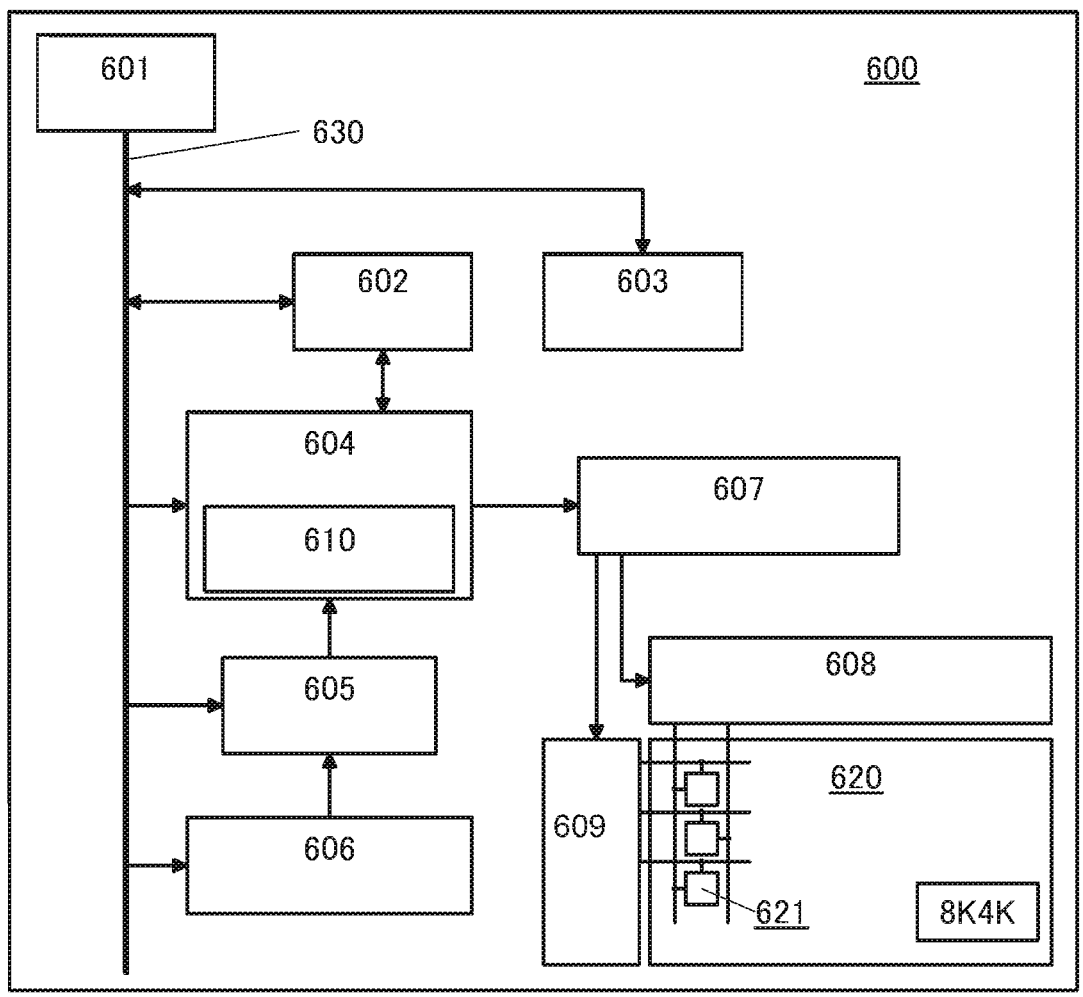
FIGS. 24A and 24B illustrate configuration examples of a television device.

FIG. 24A is a block diagram illustrating a television device 600.

Note that in a block diagram attached to this specification, components are classified according to their functions and shown as independent blocks; however, it is practically difficult to completely separate the components according to their functions, and one component may have a plurality of functions.

The television device 600 includes a control portion 601, a memory portion 602, a communication control portion 603, an image processing circuit 604, a decoder circuit 605, a video signal reception portion 606, a timing controller 607, a source driver 608, a gate driver 609, a display panel 620, and the like.

The display device described in the above embodiment can be used for the display panel 620 illustrated in FIG. 24A. Thus, the television device 600 with a large size, high definition, and high visibility can be fabricated.

The control portion 601 can function as, for example, a central processing unit (CPU). For example, the control portion 601 has a function of controlling components such as the memory portion 602, the communication control portion 603, the image processing circuit 604, the decoder circuit 605, and the video signal reception portion 606 via a system bus 630.

Signals are transmitted between the control portion 601 and the components via the system bus 630. The control portion 601 has a function of processing signals inputted from the components which are connected via the system bus 630, a function of generating signals to be outputted to the components, and the like, so that the components connected to the system bus 630 can be controlled comprehensively.

The memory portion 602 functions as a register, a cache memory, a main memory, a secondary memory, or the like that can be accessed by the control portion 601 and the image processing circuit 604.

As a memory device that can be used as a secondary memory, a memory device that includes a rewritable non-volatile memory element can be used, for example. Examples of them include a flash memory, a magnetoresistive random access memory (MRAM), a phase change RAM (PRAM), a resistive RAM (ReRAM), and a ferroelectric RAM (FeRAM).

As a memory device that can be used as a temporary memory such as a register, a cache memory, or a main memory, a volatile memory element such as a dynamic RAM (DRAM) or a static random access memory (SRAM) may be used.

For example, as a RAM provided in the main memory, a DRAM is used, in which case a memory space as a workspace for the control portion 601 is virtually allocated and used. An operating system, an application program, a program module, program data, and the like which are stored in the memory portion 602 are loaded into the RAM and executed. The data, program, and program module which are loaded into the RAM are directly accessed and operated by the control portion 601.

In the ROM, a basic input/output system (BIOS), firmware, and the like for which rewriting is not needed can be stored. As the ROM, a mask ROM, a one-time programmable read only memory (OTPROM), or an erasable programmable read only memory (EPROM) can be used. As an EPROM, an ultra-violet erasable programmable read only memory (UV-EPROM) which can erase stored data by irradiation with ultraviolet rays, an electrically erasable programmable read only memory (EEPROM), a flash memory, and the like can be given.

Besides the memory portion 602, a detachable memory device may be connected to the television device 600. For example, it is preferable to provide a terminal connected to a storage media drive functioning as a storage device such as a hard disk drive (HDD) or a solid state drive (SSD) or a storage medium such as a flash memory, a Blu-ray Disc, or a DVD. With such a structure, an image can be stored.

The communication control portion 603 has a function of controlling communication exchanged via a computer network. For example, the communication control portion 603 controls a control signal for connection to a computer network in response to instructions from the control portion 601 and transmits the signal to the computer network. Accordingly, communication can be performed by connecting to a computer network such as the Internet, which is an infrastructure of the World Wide Web (WWW), an intranet, an extranet, a personal area network (PAN), a local area network (LAN), a campus area network (CAN), a metropolitan area network (MAN), a wide area network (WAN), or a global area network (GAN).

The communication control portion 603 may have a function of communicating with a computer network or another electronic device with a communication standard such as Wi-Fi (registered trademark), Bluetooth (registered trademark), or ZigBee (registered trademark).

The communication control portion 603 may have a function of wireless communication. For example, an antenna and a high frequency circuit (an RF circuit) are provided to receive and transmit an RF signal. The high frequency circuit converts an electromagnetic signal into an electric signal in a frequency band in accordance with respective national laws and transmits the electromagnetic signal wirelessly to another communication device. Several tens of kilohertz to several tens of gigahertz are a practical frequency band which is generally used. The high frequency circuit connected to an antenna includes a high frequency circuit portion compatible with a plurality of frequency bands; the high frequency circuit portion can include an amplifier, a mixer, a filter, a DSP, an RF transceiver, or the like.

The video signal reception portion 606 includes, for example, an antenna, a demodulation circuit, and analog-digital conversion circuit (AD converter circuit), and the like. The demodulation circuit has a function of demodulating a signal inputted from the antenna. The AD converter circuit has a function of converting the demodulated analog signal into a digital signal. The signal processed in the video signal reception portion 606 is transmitted to the decoder circuit 605.

The decoder circuit 605 has a function of decoding video data included in a digital signal inputted from the video signal reception portion 606, in accordance with the specifications of the broadcasting standard for transmitting the video data, and a function of generating a signal transmitted to the image processing circuit. For example, as the broadcasting standard in 8K broadcasts, H.265|MPEG-H high efficiency video coding (hereinafter referred to as HEVC) is given.

The antenna included in the video signal reception portion 606 can receive airwaves such as a ground wave and a satellite wave. The antenna can receive airwaves for analog broadcasting, digital broadcasting, and the like, and image-sound-only broadcasting, sound-only broadcasting, and the like. For example, the antenna can receive airwaves transmitted in a certain frequency band, such as a UHF band (about 300 MHz to 3 GHz) or a VHF band (30 MHz to 300 MHz). When a plurality of pieces of data received in a plurality of frequency bands is used, the transfer rate can be increased and more information can thus be obtained. Accordingly, the display panel 620 can display a video with a resolution higher than the full high definition, such as 4K2K, 8K4K, 16K8K, or more.

Alternatively, the video signal reception portion 606 and the decoder circuit 605 may generate a signal using the broadcasting data transmitted to the image processing circuit 604 with data transmission technology through a computer network. In the case where a digital signal is received, the video signal reception portion 606 does not necessarily include a demodulating circuit, an AD converter circuit, and the like.

The image processing circuit 604 has a function of generating a video signal outputted to the timing controller 607, on the basis of a video signal inputted from the decoder circuit 605.

The timing controller 607 has a function of generating a signal (e.g., a clock signal or a start pulse signal) outputted to the gate driver 609 and the source driver 608 on the basis of a synchronization signal included in a video signal or the like on which the image processing circuit 604 performs processing. In addition, the timing controller 607 has a function of generating a video signal outputted to the source driver 608, as well as the above signal.

The display panel 620 includes a plurality of pixels 621. Each pixel 621 is driven by a signal supplied from the gate driver 609 and the source driver 608. Here, an example of a display panel with the 7680×4320 pixels, i.e., the resolution corresponding to the standard of 8K4K, is shown. Note that the resolution of the display panel 620 is not limited to the above, and may have a resolution corresponding to the standard such as full high-definition (the number of pixels is 1920×1080) or 4K2K (the number of pixels is 3840×2160).

The control portion 601 or the image processing circuit 604 illustrated in FIG. 24A may include, for example, a processor. For example, a processor functioning as a central processing unit (CPU) can be used for the control portion 601. Another processor such as a digital signal processor (DSP) or a graphics processing unit (GPU) can be used, for example for the image processing circuit 604. Furthermore, such a processor obtained with a programmable logic device (PLD) such as a field programmable gate array (FPGA) or a field programmable analog array (FPAA) may be used for the control portion 601 or the image processing circuit 604.

The processor interprets and executes instructions from various programs to process various kinds of data and control programs. The programs executed by the processor may be stored in a memory region included in the processor or a memory device which is additionally provided.

Two or more functions among the functions of the control portion 601, the memory portion 602, the communication control portion 603, the image processing circuit 604, the decoder circuit 605, the video signal reception portion 606, and the timing controller 607 are aggregated in one IC chip to form a system LSI. For example, such a system LSI may include a processor, a decoder circuit, a tuner circuit, an AD converter circuit, a DRAM, an SRAM, and the like.

Note that a transistor that includes an oxide semiconductor in a channel formation region and that has an extremely low off-state current can be used in an IC or the like included in the control portion 601 or another component. With use of the transistor having an extremely low off-state current as a switch for holding electric charge (data) which flows into a capacitor serving as a memory element, a long data retention period can be ensured. By utilizing this characteristic for a register or a cache memory of the control portion 601 or the like, normally-off computing is achieved where the control portion 601 operates only when needed and data on the previous processing is stored in the memory element in the rest of time; thus, power consumption of television device 600 can be reduced.

Note that the structure of the television device 600 illustrated in FIG. 24A is just an example, and all of the components illustrated here are not necessarily included. The television device 600 may include at least necessary components among the components illustrated in FIG. 24A. Furthermore, the television device 600 may include a component other than the components illustrated in FIG. 24A.

For example, the television device 600 may include an external interface, a sound output portion, a touch panel unit, a sensor unit, a camera unit, or the like besides the components in FIG. 24A. Examples of the external interfaces include an external connection terminal such as an universal serial bus (USB) terminal, a local area network (LAN) connection terminal, a power reception terminal, a sound output terminal, a sound input terminal, a video output terminal, and a video input terminal, a transceiver for optical communication using infrared rays, visible light, ultraviolet rays, or the like, a physical button provided on a housing, or the like. Examples of sound input/output portions include a sound controller, a microphone, and a speaker.

The image processing circuit 604 is described in detail below.

The image processing circuit 604 preferably has a function of performing image processing on the basis of a video signal inputted from the decoder circuit 605.

Examples of the image processing include noise removal, grayscale conversion, tone correction, and luminance correction. As the tone correction or the luminance correction, gamma correction can be given, for example.

Furthermore, the image processing circuit 604 preferably has a function of pixel interpolation in accordance with up-conversion of the resolution, a function of frame interpolation in accordance with up-conversion of the frame frequency, or the like.

The noise removing process is a process for removing various noise, such as mosquito noise which appears near outline of texts and the like, block noise which appears in high-speed moving images, random noise causing flicker, and dot noise caused by up-conversion of the resolution.

The grayscale conversion processing converts the grayscale of an image to a grayscale corresponding to output characteristics of the display panel 620. For example, in the case where the number of grayscale levels is increased, gradation values of pixels are interpolated and assigned to respective images inputted with low grayscale levels, so that a smooth histogram can be obtained. In addition, a high-dynamic range (HDR) processing for increasing the dynamic range is also included in the grayscale conversion processing.

The pixel interpolation process interpolates data which does not actually exists when resolution is up-converted. For example, referring pixels around the target pixel, data is interpolated to display intermediate color between the pixels.

The tone correction process corrects the tone of an image. The luminance correction process corrects the brightness (luminance contrast) of an image. For example, these processes detect a type, luminance, color purity, and the like of a lighting in a space where the television device 600 is provided, and corrects luminance and tone of images displayed on the display panel 620 to be optimal luminance and tone in accordance with the detection. These processes can have a function of referring a displayed image to various images of various scenes in an image list stored in advance, and then correcting luminance and tone of the displayed image to be suitable to the images in the closest scene of the image.

In the case where the frame frequency of the displayed video is increased, the frame interpolation generates an image for a frame that does not exist originally (interpolation frame). For example, an image for an interpolation frame which is interposed between two images is generated from a difference between the two images. Alternatively, images for a plurality of interpolation frames can be generated between two images. For example, when the frame frequency of a video signal inputted from the decoder circuit 605 is 60 Hz, a plurality of interpolation frames are generated, and the frame frequency of a video signal outputted to the timing controller 607 can be increased twofold (120 Hz), fourfold (240 Hz), eightfold (480 Hz), or the like.

The image processing circuit 604 preferably has a function of performing image processing utilizing a neural network. FIG. 24A illustrates an example in which the image processing circuit 604 includes a neural network 610.

For example, with the neural network 610, features can be extracted from image data included in a video. In addition, the image processing circuit 604 can select an optimal correction method in accordance with the extracted feature or select a parameter used for the correction.

Alternatively, the neural network 610 itself may have a function of performing image processing. In other words, the neural network 610 may receive image data on which image processing is not performed and output image data that has been subjected to image processing.

Data of a weight coefficient used for the neural network 610 is stored in the memory portion 602 as a data table. The data table including the weight coefficient can be updated, for example, by the communication control portion 603 through the computer network. Alternatively, the image processing circuit 604 may have a learning function and enable the update of the data table including the weight coefficient.

Figure 24B:
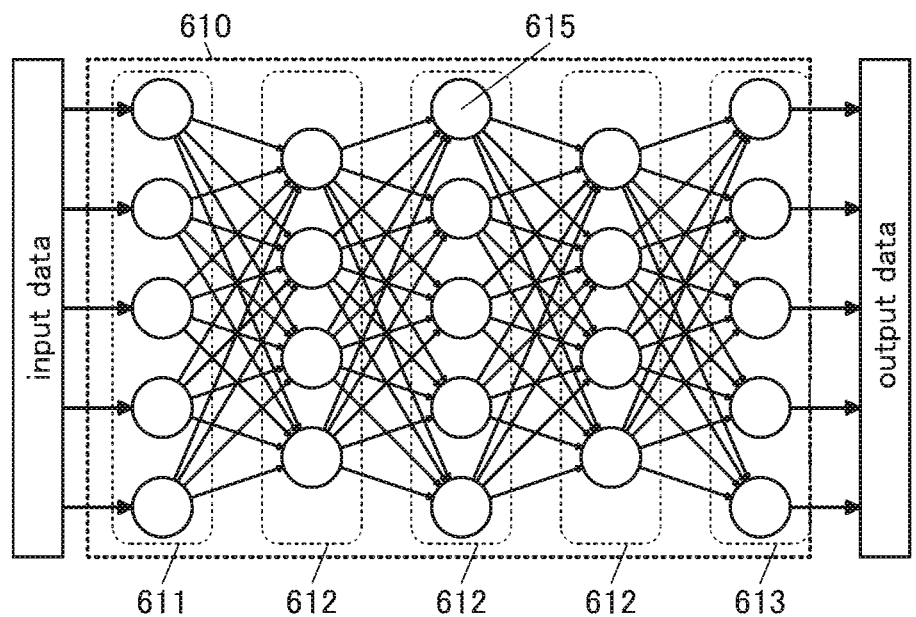

FIG. 24B is a schematic view illustrating the neural network 610 included in the image processing circuit 604.

In this specification and the like, the neural network indicates a general model having the capability of solving problems, which is modeled on a biological neural network and determines the connection strength of neurons by the learning. The neural network includes an input layer, a middle layer (also referred to as hidden layer), and an output layer. A neural network having two or more middle layers is referred to as deep neural network (DNN), and the learning using such a DNN is referred to as deep learning.

In the description of the neural network in this specification and the like, to determine a connection strength of neurons (also referred to as weight coefficient) from the existing data is called "leaning" in some cases. In this specification and the like, to form a neural network using the connection strength obtained by the learning, to lead to a new conclusion, is called "inference" in some cases.

The neural network 610 includes an input layer 611, one or more middle layers 612, and an output layer 613. Input data is inputted to the input layer 611. Output data is outputted from the output layer 613.

Each of the input layer 611, the middle layer 612, and the output layer 613 includes neurons 615. The neuron 615 indicates a circuit element that performs product-sum operation (product-sum operation element). In FIG. 24B, directions of inputting/outputting data between the two neurons 615 in two layers are denoted by arrows.

The arithmetic processing in each layer is executed by the product-sum operation of an output of the neuron 615 in the previous layer and a weight coefficient. For example, when the output from an i-th neuron in the input layer 611 is denoted by $x_i$, and the connection strength (weight coefficient) between the output $x_i$, and a j-th neuron in the middle layer 612 next to the input layer 611 is denoted by $w_{ji}$, the output from the j-th neuron in the middle layer can be denoted by $y_j=f(\Sigma w_{ji} \cdot x_i)$. Note that i and j are each an integer greater than or equal to 1. Here, f(x) represents an activation function, and a sigmoid function, a threshold function, or the like can be used therefor. In this manner, the output of the neuron 615 in each layer is a value obtained from the activation function with respect to the result of product-sum operation of the output from the neuron 615 in the previous layer and the weight coefficient. The connection between layers may be a full connection where all of the neurons are connected or a partial connection where part of neurons is connected.

FIG. 24B illustrates an example including three middle layers 612. The number of the middle layers 612 is not limited to three, and a structure including at least one middle layer is acceptable. The number of neurons included in one middle layer 612 may be changed as appropriate depending on the specifications. For example, the number of the neurons 615 included in one middle layer 612 may be larger or smaller than the number of the neurons 615 included in the input layer 611 or the output layer 613.

The weight coefficient serving as an indicator of the connection strength between the neurons 615 is determined by learning. Although the learning may be executed by the processor in the television device 600, it is preferable to execute the learning with a calculator having high arithmetic processing properties, such as a dedicated server or a cloud. The weight coefficient determined by the learning is stored in the memory portion 602 as the data table and used when the weight coefficient is read out by the image processing circuit 604. The table can be updated as needed through the computer network.

The above is the description of the neural network.

At least part of this embodiment can be implemented in combination with any of the other embodiments and the other examples described in this specification as appropriate.

Example 1

In this example, the examination of an insulating layer of one embodiment of the present invention is described. Samples A1 to A3 described below were fabricated and used for this example. Sample A1 and Sample A2 are insulating layers of one embodiment of the present invention, which correspond to the insulating layer 106 and the region 106a described in the above embodiment. Sample A3 is an insulating layer for comparison.

<Sample A1, Sample A2, Sample A3>

First, samples fabricated in this example are described.

Each of Sample A1, Sample A2, and Sample A3 were fabricated in such a manner that a 400-nm-thick silicon nitride film was formed over a glass substrate with a PECVD apparatus. The silicon nitride film was deposited as follows. First, a 50-nm-thick silicon nitride film was deposited under the conditions where the substrate temperature was 350° C.; a silane gas at a flow rate of 200 sccm, a nitrogen gas at a flow rate of 2000 sccm, and an ammonia gas at a flow rate of 100 sccm were introduced into a chamber; the pressure was set to 100 Pa; and an RF power of 2000 W was supplied between parallel-plate electrodes placed in a PECVD apparatus. Then, the flow rate of an ammonia gas was changed to 2000 sccm to deposit a 300-nm-thick silicon nitride film. Finally, the flow rate of an ammonia gas was changed to 100 sccm to deposit a 50-nm-thick silicon nitride film.

Next, plasma treatment was performed in an atmosphere containing oxygen. The conditions of plasma treatment performed on Sample A1 were a temperature of 350° C., a pressure of 40 Pa, a power supply of 3000 W, an oxygen flow rate of 3000 sccm, and a treatment time of 300 seconds. The conditions of plasma treatment performed on Sample A2 were a temperature of 350° C., a pressure of 40 Pa, a power supply of 3000 W, a dinitrogen monoxide flow rate of 3000 sccm, and a treatment time of 300 seconds. Sample A3 was not subjected to the plasma treatment. In the case of Sample A1 and Sample A2, plasma treatment was performed in vacuum successively after the silicon nitride film was deposited.

The size of the glass substrate used for each sample was 600 mm×720 mm.

<X-Ray Photoelectron Spectroscopy Measurement>

Next, Sample A1 to Sample A3 were measured by X-ray photoelectron spectroscopy (XPS).

Figure 25:
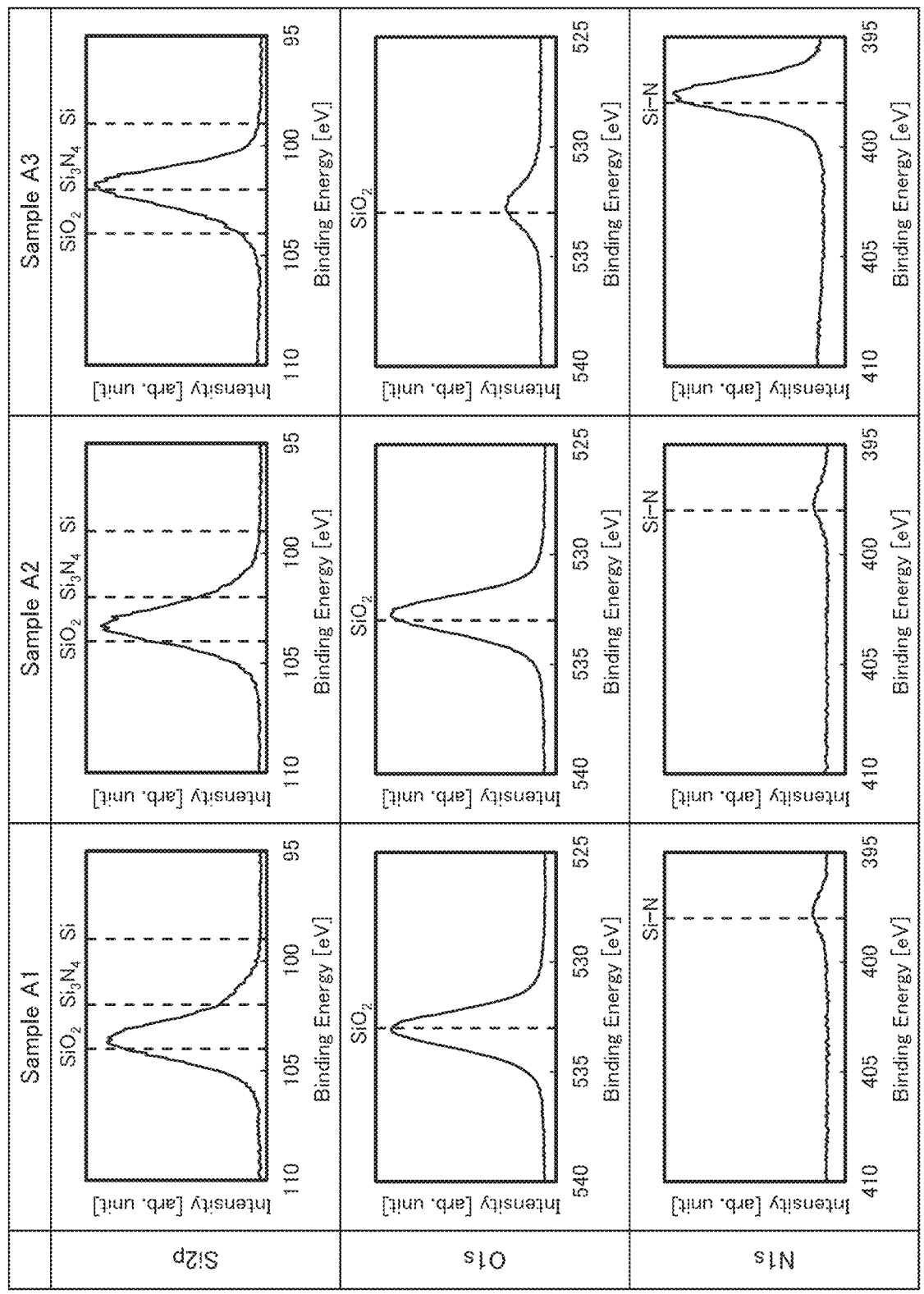
FIG. 25 shows XPS spectra of Example 1.

FIG. 25 shows spectra of Si2p, O1s, and N1s obtained by the XPS measurement. In FIG. 25, the horizontal axes each represent the biding energy [eV], and the vertical axes each represent the intensity of photoelectron (arbitrary unit).

For the XPS measurement, Quantera SXM manufactured by PHI, Inc. was used. Monochromatic Al Kα ray (1486.6 eV) was used for an X-ray source. A detection area was set to 100 μmϕ and an extraction angle was set to 45°. Thus, the detection depth might be approximately 4 to 5 nm.

According to FIG. 25, each of Sample A1 and Sample A2 has a lower peak intensity attributed to the Si—N bond than Sample A3 and has a higher peak intensity attributed to the Si—O bond than Sample A3. The results indicate that in each of Sample A1 and Sample A2, the vicinity of a surface of the silicon nitride film was oxidized by the plasma treatment, and a region containing more oxygen than the silicon nitride film was formed.

<Tem Observation>

Next, Sample A1 to Sample A3 were thinned by a focused ion beam (FIB), and cross sections of the samples were observed with a TEM. The TEM observation was conducted at an acceleration voltage of 300 kV using a transmission electron microscope, H-9500, produced by Hitachi High-Technologies Corporation.

Figure 26A:
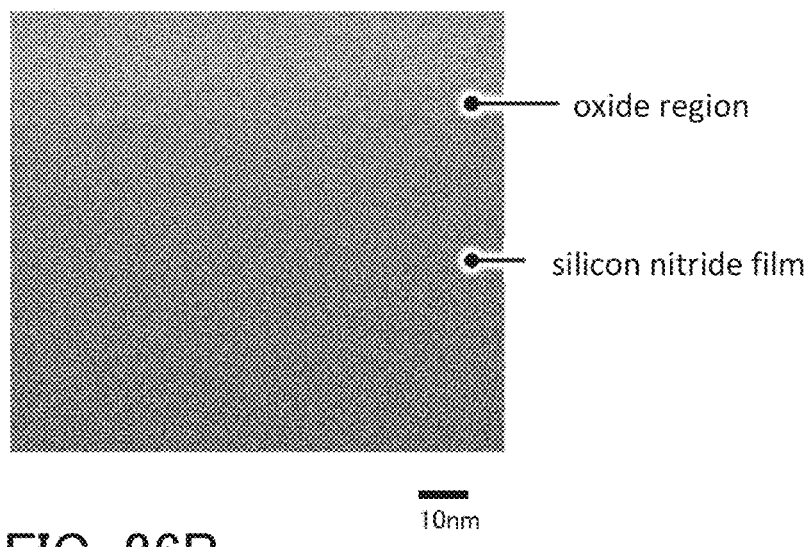
FIGS. 26A to 26C are each a cross-sectional TEM image described in Example 1.
Figure 26B:
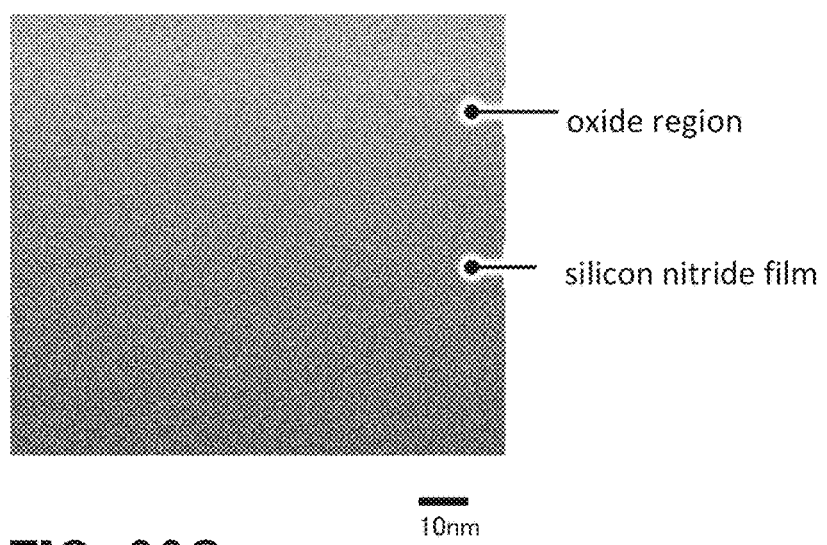
Figure 26C:
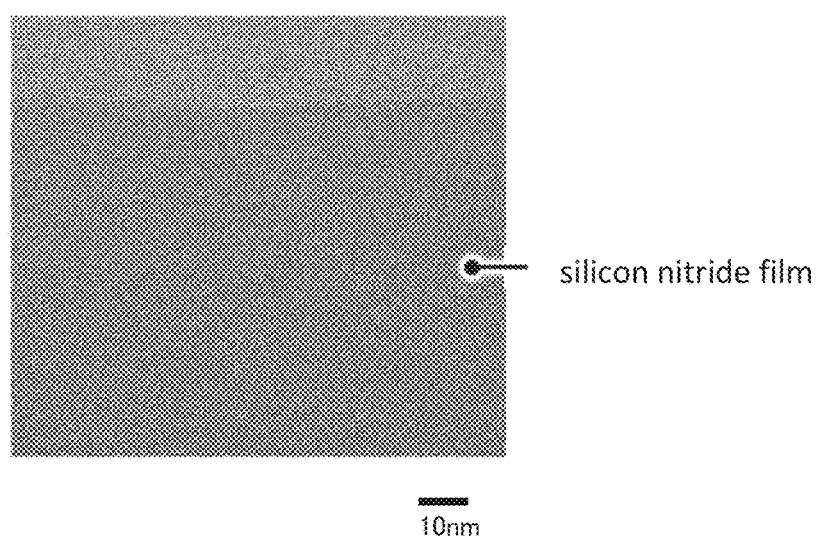

A cross-sectional TEM image of Sample A1, that of Sample A2, and that of Sample A3 are shown in FIG. 26A, FIG. 26B, and FIG. 26C, respectively. FIGS. 26A to 26C are transmission electron images (TE images) taken at a magnification of 200000 times.

As shown in FIGS. 26A and 26B, a region with a different concentration (luminance) was observed around each surface of Sample A1 and Sample A2 in the TEM images. In view of the XPS measurement results, the surface of the silicon nitride film was oxidized in each of Sample A1 and Sample A2, which led to formation of a region containing more oxygen than the silicon nitride film (hereinafter, the region is referred to as oxide region). Note that a layer with a different concentration (luminance) was not observed around the surface of Sample A3 in the TEM image.

Figure 27A:
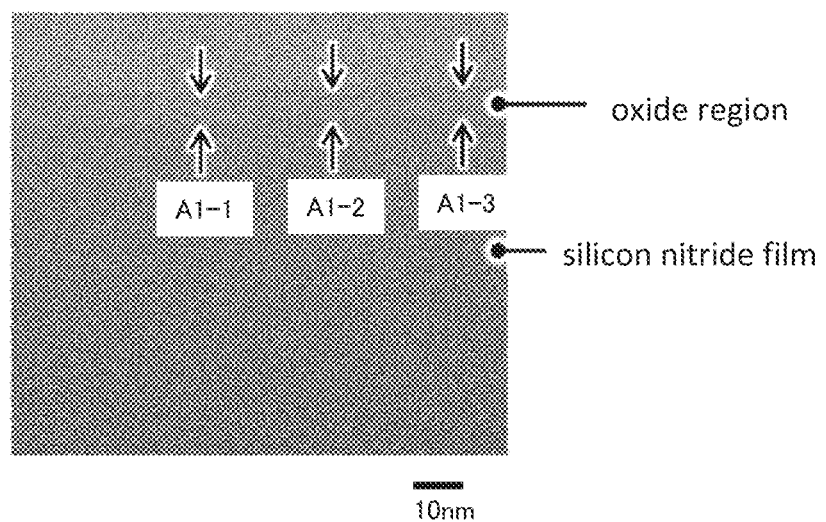
FIGS. 27A and 27B are each a cross-sectional TEM image described in Example 1.
Figure 27B:
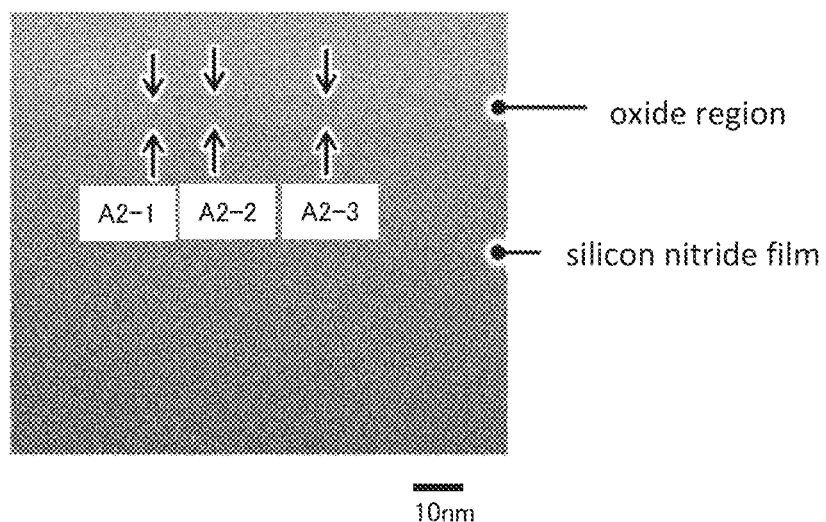

The thicknesses of the oxide regions in Sample A1 and Sample A2 were measured. The measured portions in Sample A1 and Sample A2 are shown in FIG. 27A and FIG. 27B, respectively. In each of FIGS. 27A and 27B, the measured portions are sandwiched between arrows facing each other. In each of Sample A1 and Sample A2, measurement was performed at three portions. The measurement results are shown in Table 1. In Table 1, values at measured portions are written in the column for "thickness of oxide region", and an average value of the measured values per sample is written in the column for "average". It is found that the thickness of the oxide region was approximately 6 nm in each of Sample A1 and Sample A2.

TABLE 1

|  | Measured portion | Thickness of oxide region [nm] | average [nm] |
| --- | --- | --- | --- |
| Sample A1 | A1-1 | 6.1 | 6.2 |
|  | A1-2 | 6.2 |  |
|  | A1-3 | 6.2 |  |
| Sample A2 | A2-1 | 5.9 | 5.9 |
|  | A2-2 | 5.9 |  |
|  | A2-3 | 6.0 |  |

Note that the structure described in this example can be combined as appropriate with any of the structures described in the other embodiments and the other examples.

Example 2

In this example, the evaluation of the crystallinity of a metal oxide film of one embodiment of the present invention is described. Sample B1 to Sample B29 and Sample C1 to Sample C25 were fabricated for this example. Note that Sample B1 to Sample B29 and Sample C1 to Sample C25 are metal oxide films of one embodiment of the present invention.

<Sample B1 to Sample B29, Sample C1 to Sample C25>

First, samples fabricated in this example are described.

Sample B1 to Sample B29 each have a structure where a 100-nm-thick metal oxide film is formed over a glass substrate. The metal oxide film was deposited with a sputtering apparatus, and an In—Ga—Zn oxide (having an atomic ratio of In:Ga:Zn=4:2:3) was used as a sputtering target. For the sputtering, the pressure was adjusted to 0.6 Pa and an AC power of 2500 W was applied. Between Sample B1 to Sample B29, the substrate temperature (Tsub.) during the film deposition, the Ar flow rate, and the O$_2$ flow rate were different. Main items of the deposition conditions are listed in Table 2.

Sample C1 to Sample C25 each have a structure where a 100-nm-thick metal oxide film is formed over a glass substrate. The metal oxide film was deposited with a sputtering apparatus, and an In—Ga—Zn oxide (having an atomic ratio of In:Ga:Zn=1:1:1.2) was used as a sputtering target. For the sputtering, the pressure was adjusted to 0.6 Pa and an AC power of 2500 W was applied. Between Sample C1 to Sample C25, the substrate temperature (Tsub.) during the film deposition, the Ar flow rate, and the $O_2$ flow rate were different. Main items of the deposition conditions are listed in Table 3.

In each of Table 2 and Table 3, in the case where the column for "substrate temperature (Tsub.)" is denoted by the room temperature (R.T.), the substrate was not heated during film deposition. In the column for "oxygen flow rate ratio", the proportion of $O_2$ flow rate in the total flow rate of the deposition gas (the total amount of Ar flow rate and $O_2$ flow rate) is written.

Note that Sample B1 to Sample B29 and Sample C1 to Sample C25 were each fabricated using a parallel-plate-type sputtering apparatus. An AC power source was used as a power source that supplied power to the target during fabrication of each sample. A glass substrate with a size of 600 mm×720 mm was used for each sample.

TABLE 2

| | Target composition In:Ga:Zn [atomic ratio] | Substrate temperature Tsub. [° C.] | Gas flow rate [sccm] $O_2$ | Gas flow rate [sccm] Ar | Oxygen flow rate ratio $O_2/(Ar + O_2) \times 100$ [%] |
|---|---|---|---|---|---|
| Sample B1 | 4:2:3 | R.T. | 20 | 180 | 10 |
| Sample B2 | | | 60 | 140 | 30 |
| Sample B3 | | | 100 | 100 | 50 |
| Sample B4 | | | 140 | 60 | 70 |
| Sample B5 | | | 180 | 20 | 90 |
| Sample B6 | | | 200 | 0 | 100 |
| Sample B7 | 4:2:3 | 70 | 20 | 180 | 10 |
| Sample B8 | | | 60 | 140 | 30 |
| Sample B9 | | | 100 | 100 | 50 |
| Sample B10 | | | 140 | 60 | 70 |
| Sample B11 | | | 200 | 0 | 100 |
| Sample B12 | 4:2:3 | 100 | 20 | 180 | 10 |
| Sample B13 | | | 60 | 140 | 30 |
| Sample B14 | | | 100 | 100 | 50 |
| Sample B15 | | | 140 | 60 | 70 |
| Sample B16 | | | 180 | 20 | 90 |
| Sample B17 | | | 200 | 0 | 100 |
| Sample B18 | 4:2:3 | 130 | 20 | 180 | 10 |
| Sample B19 | | | 60 | 140 | 30 |
| Sample B20 | | | 100 | 100 | 50 |
| Sample B21 | | | 140 | 60 | 70 |
| Sample B22 | | | 180 | 20 | 90 |
| Sample B23 | | | 200 | 0 | 100 |
| Sample B24 | 4:2:3 | 170 | 20 | 180 | 10 |
| Sample B25 | | | 60 | 140 | 30 |
| Sample B26 | | | 100 | 100 | 50 |
| Sample B27 | | | 140 | 60 | 70 |
| Sample B28 | | | 180 | 20 | 90 |
| Sample B29 | | | 200 | 0 | 100 |

TABLE 3

| | Target composition In:Ga:Zn [atomic ratio] | Substrate temperature Tsub. [° C.] | Gas flow rate [sccm] $O_2$ | Gas flow rate [sccm] Ar | Oxygen flow rate ratio $O_2/(Ar + O_2) \times 100$ [%] |
|---|---|---|---|---|---|
| Sample C1 | 1:1:1.2 | R.T. | 20 | 180 | 10 |
| Sample C2 | | | 60 | 140 | 30 |
| Sample C3 | | | 100 | 100 | 50 |
| Sample C4 | | | 140 | 60 | 70 |
| Sample C5 | | | 200 | 0 | 100 |
| Sample C6 | 1:1:1.2 | 70 | 20 | 180 | 10 |
| Sample C7 | | | 60 | 140 | 30 |
| Sample C8 | | | 100 | 100 | 50 |
| Sample C9 | | | 140 | 60 | 70 |
| Sample C10 | | | 200 | 0 | 100 |
| Sample C11 | 1:1:1.2 | 100 | 20 | 180 | 10 |
| Sample C12 | | | 60 | 140 | 30 |
| Sample C13 | | | 100 | 100 | 50 |
| Sample C14 | | | 140 | 60 | 70 |
| Sample C15 | | | 200 | 0 | 100 |

TABLE 3-continued

| | Target composition In:Ga:Zn [atomic ratio] | Substrate temperature Tsub. [° C.] | Gas flow rate [sccm] | | Oxygen flow rate ratio O$_2$/(Ar + O$_2$) × 100 [%] |
|---|---|---|---|---|---|
| | | | O$_2$ | Ar | |
| Sample C16 | 1:1:1.2 | 130 | 20 | 180 | 10 |
| Sample C17 | | | 60 | 140 | 30 |
| Sample C18 | | | 100 | 100 | 50 |
| Sample C19 | | | 140 | 60 | 70 |
| Sample C20 | | | 200 | 0 | 100 |
| Sample C21 | 1:1:1.2 | 170 | 20 | 180 | 10 |
| Sample C22 | | | 60 | 140 | 30 |
| Sample C23 | | | 100 | 100 | 50 |
| Sample C24 | | | 140 | 60 | 70 |
| Sample C25 | | | 200 | 0 | 100 |

<Evaluation of Crystallinity by XRD Measurement>

Figure 28:
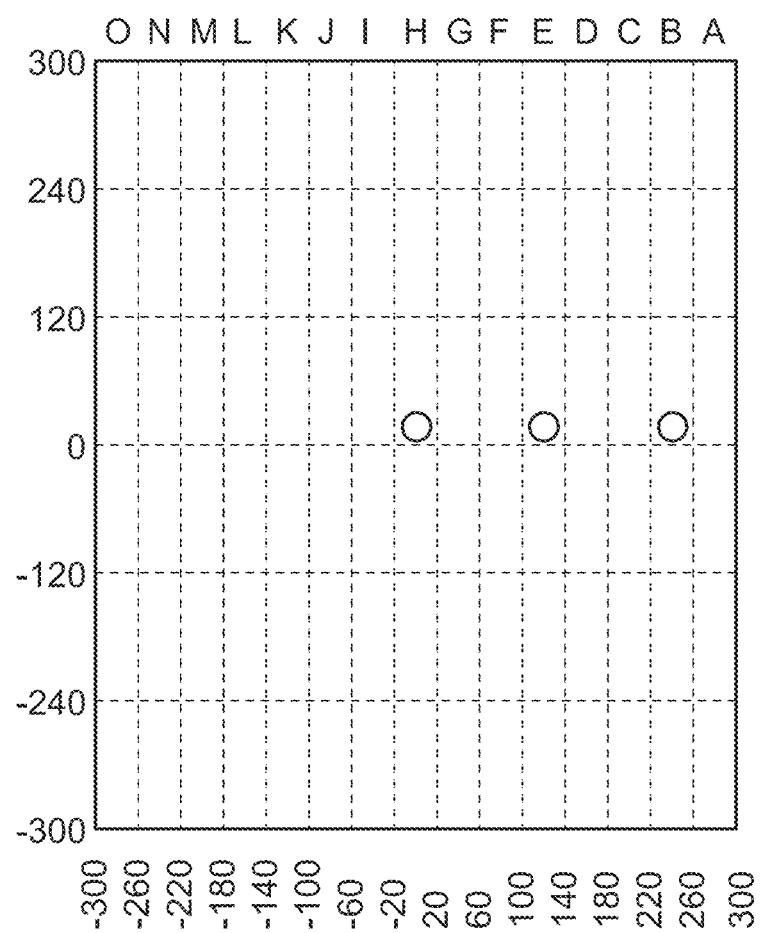
FIG. 28 is a graph showing measurement coordinates of samples described in Example 2.

Next, Sample B1 to Sample B29 and Sample C1 to Sample C25 were measured by X-ray diffraction (XRD). The coordinate points in a glass substrate with a size of 600 mm× 720 mm subjected to XRD are shown in FIG. 28. The coordinate points correspond to B, E, and H represented by white circles in FIG. 28.

Figure 29:
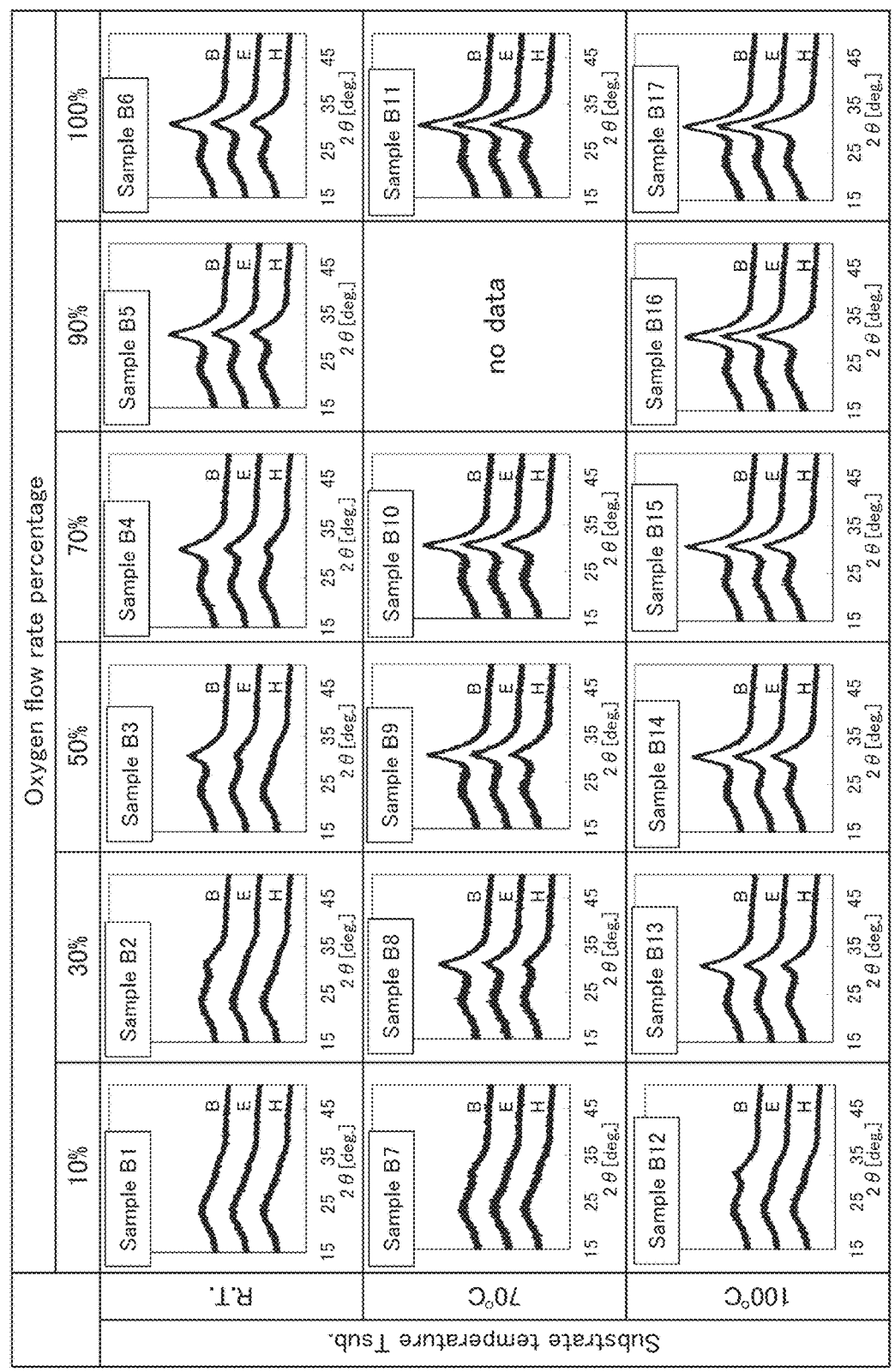
FIG. 29 shows XRD spectra described in Example 2.
Figure 30:
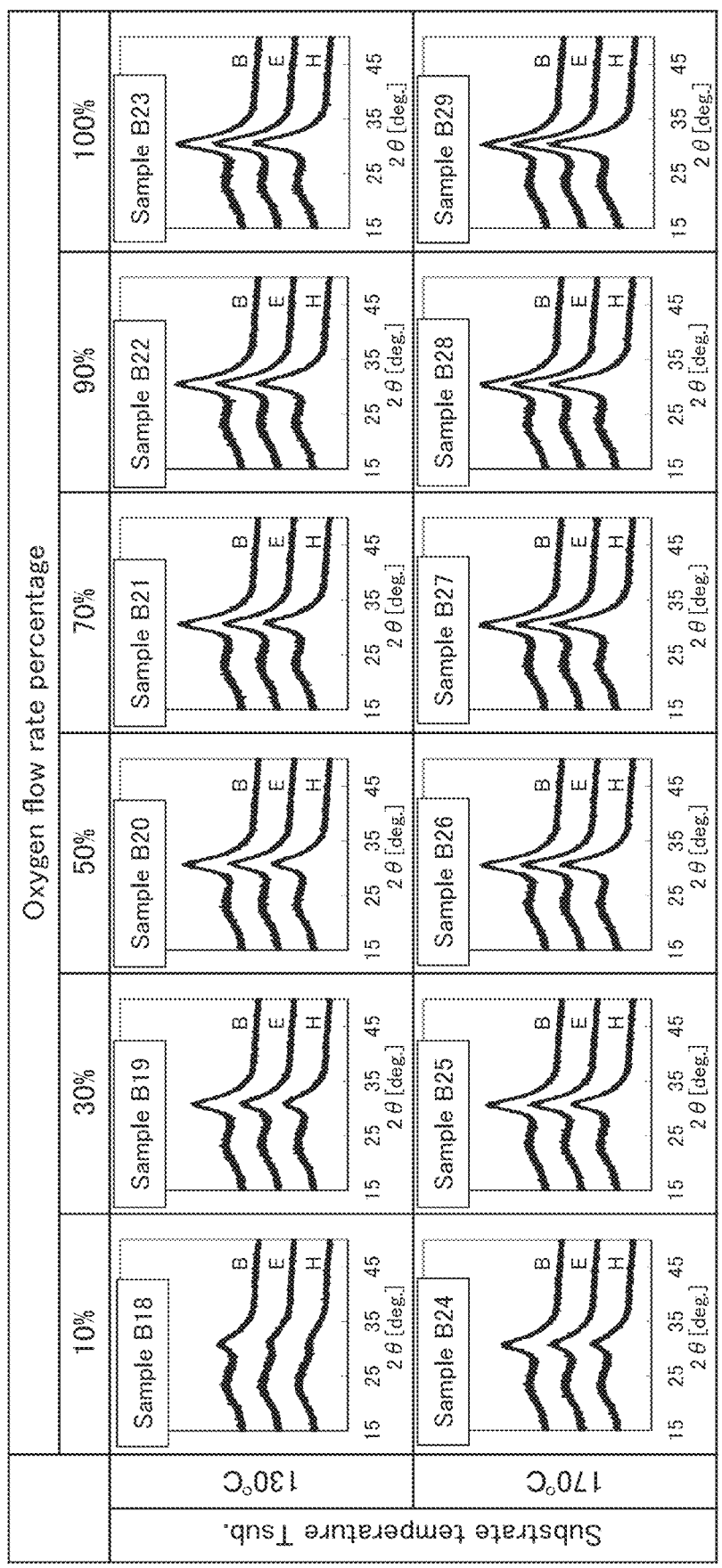
FIG. 30 shows XRD spectra described in Example 2.
Figure 31:
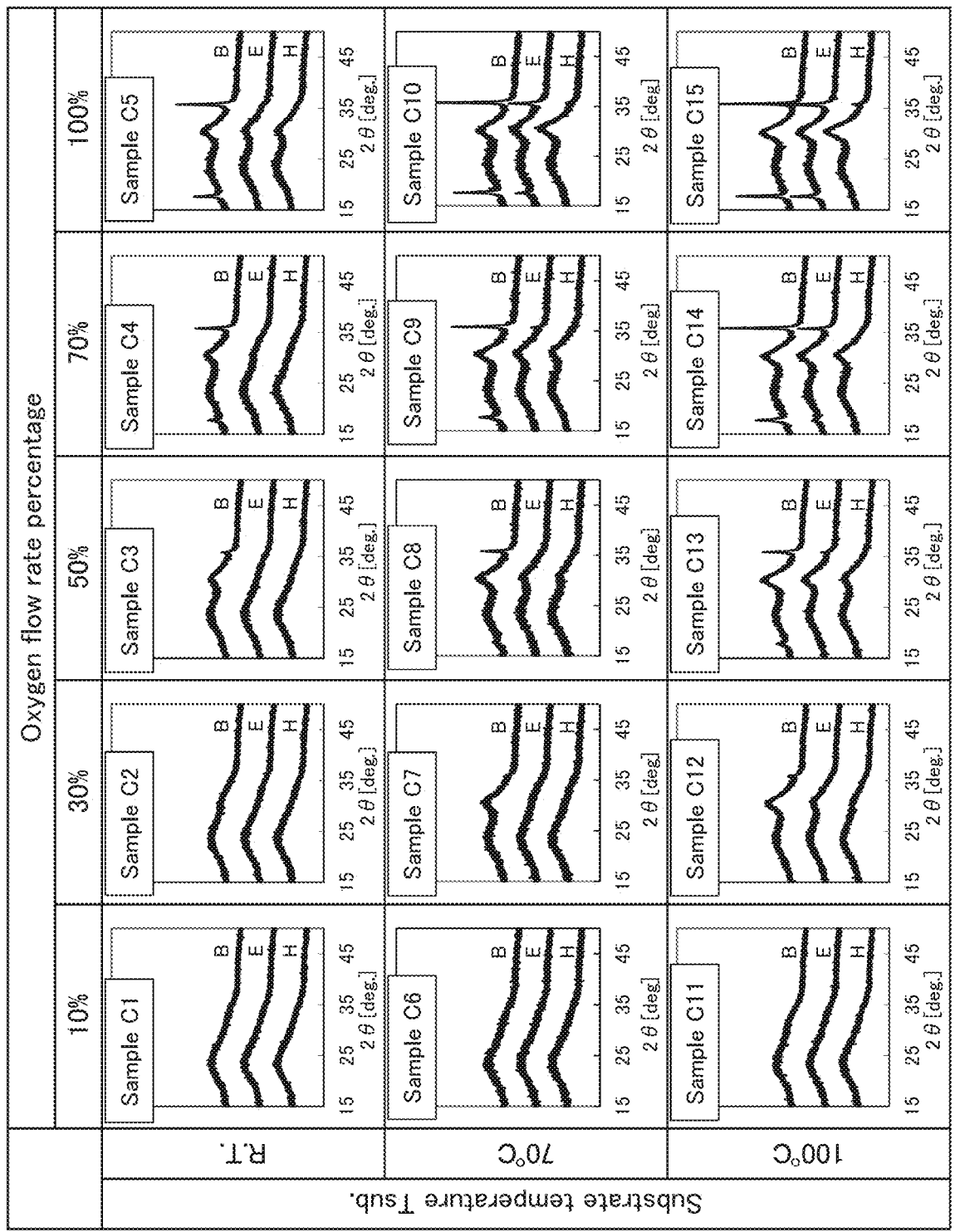
FIG. 31 shows XRD spectra described in Example 2.
Figure 32:
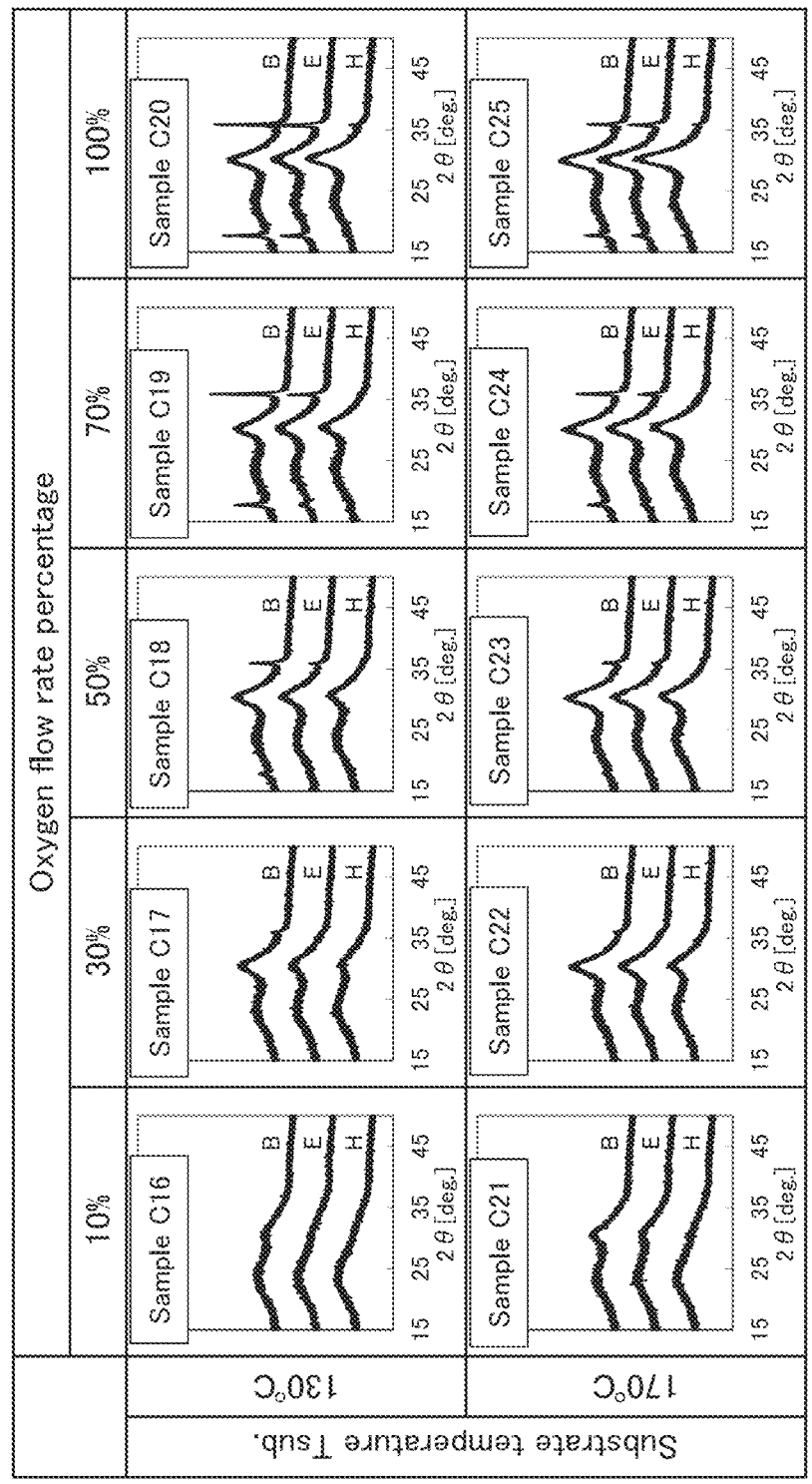
FIG. 32 shows XRD spectra described in Example 2.
Figure 33A:
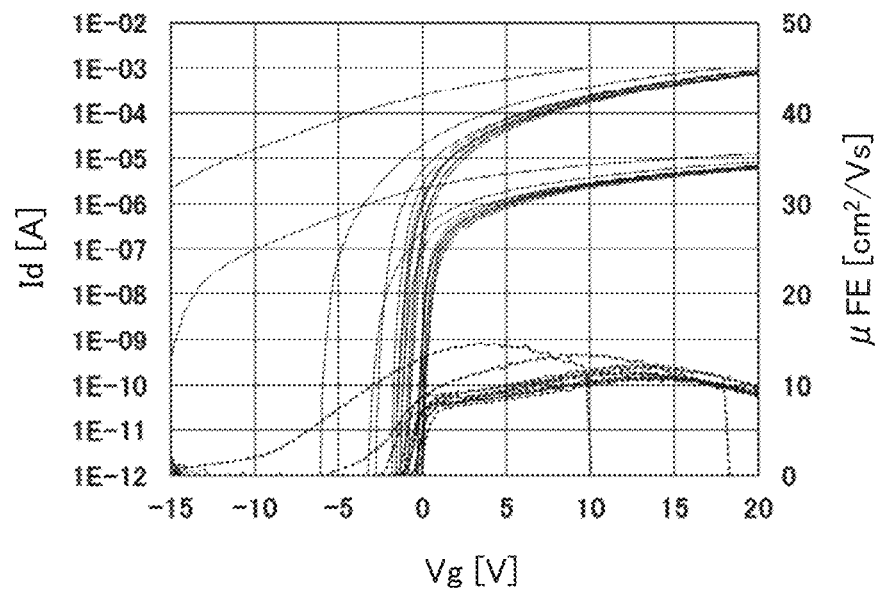
FIGS. 33A and 33B each show $I_d$-$V_g$ characteristics of a transistor described in Example 3.
Figure 33B:
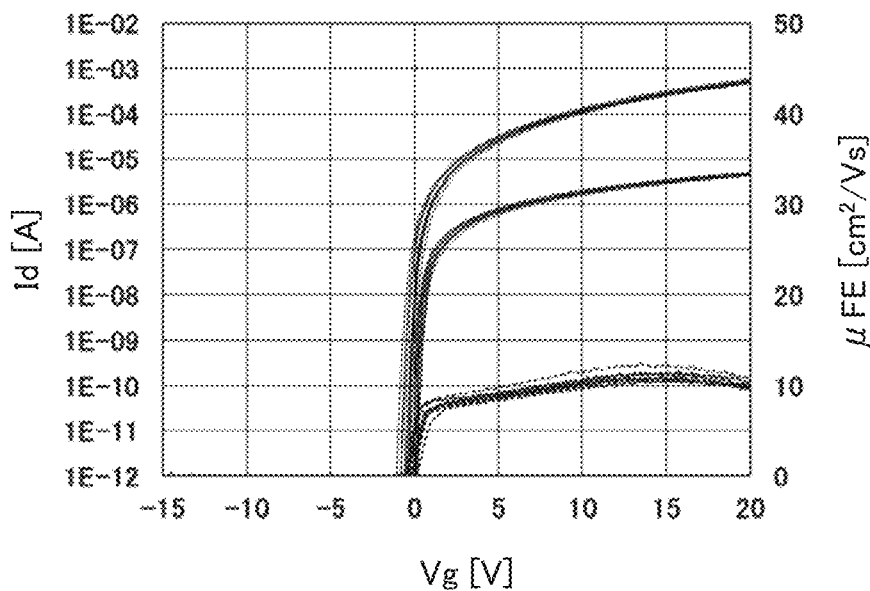
Figure 34A:
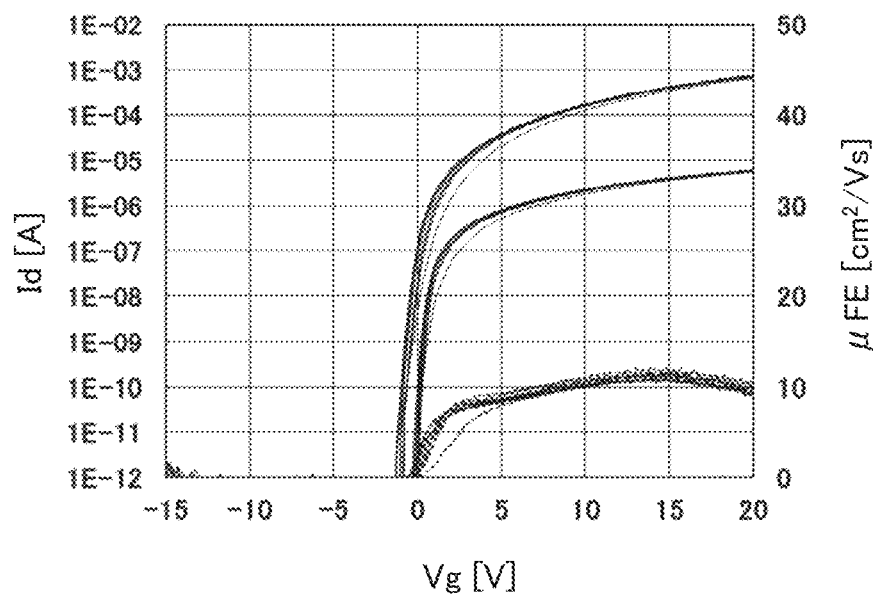
FIGS. 34A and 34B each show $I_d$-$V_g$ characteristics of a transistor described in Example 3.
Figure 34B:
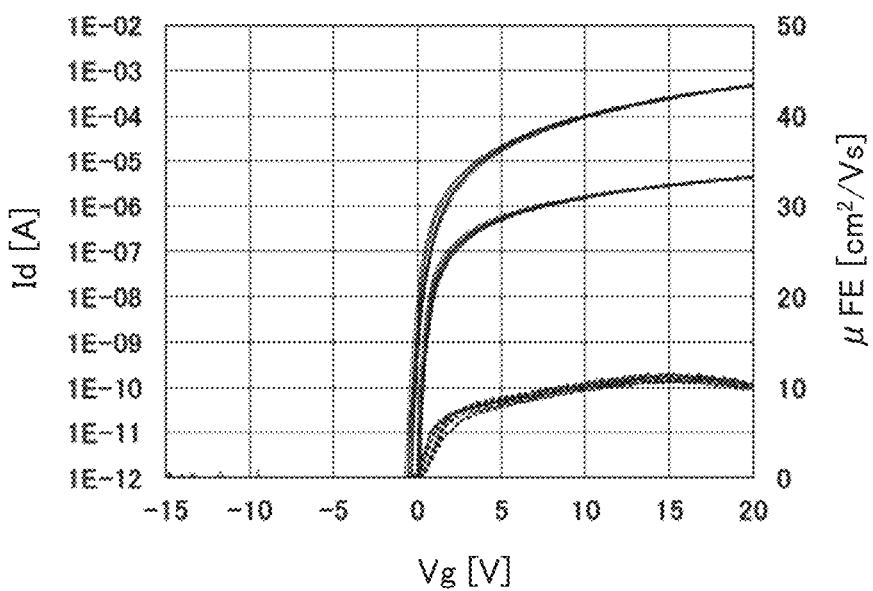
Figure 35A:
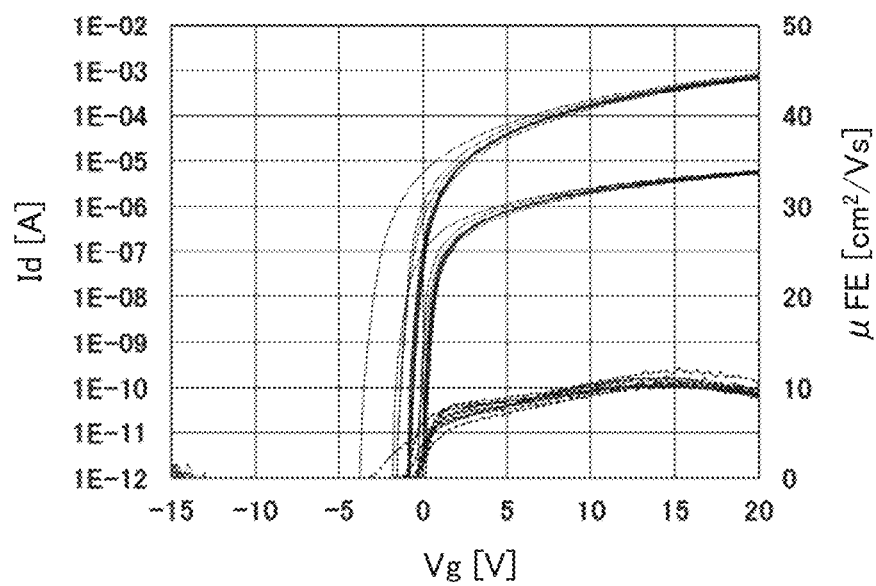
FIGS. 35A and 35B each show $I_d$-$V_g$ characteristics of a transistor described in Example 3.
Figure 35B:
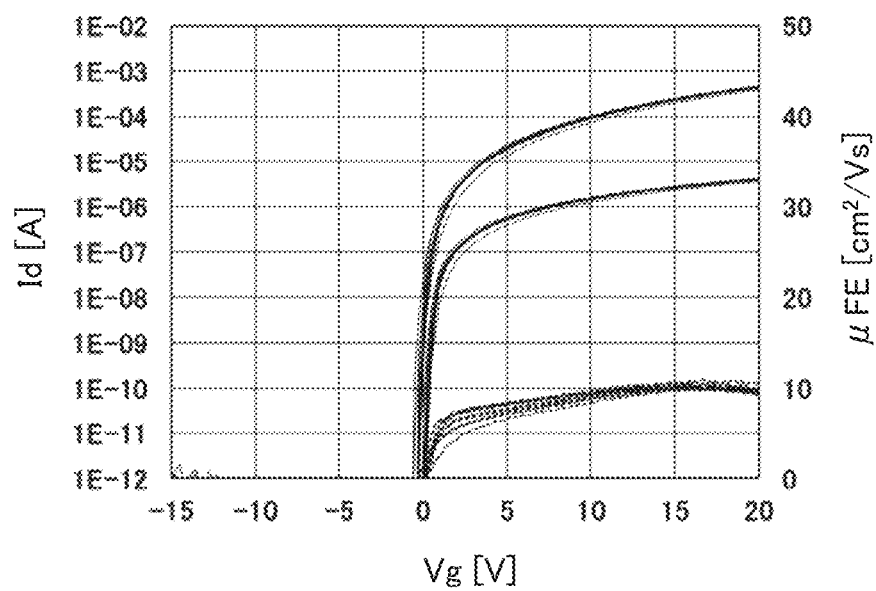
Figure 36A:
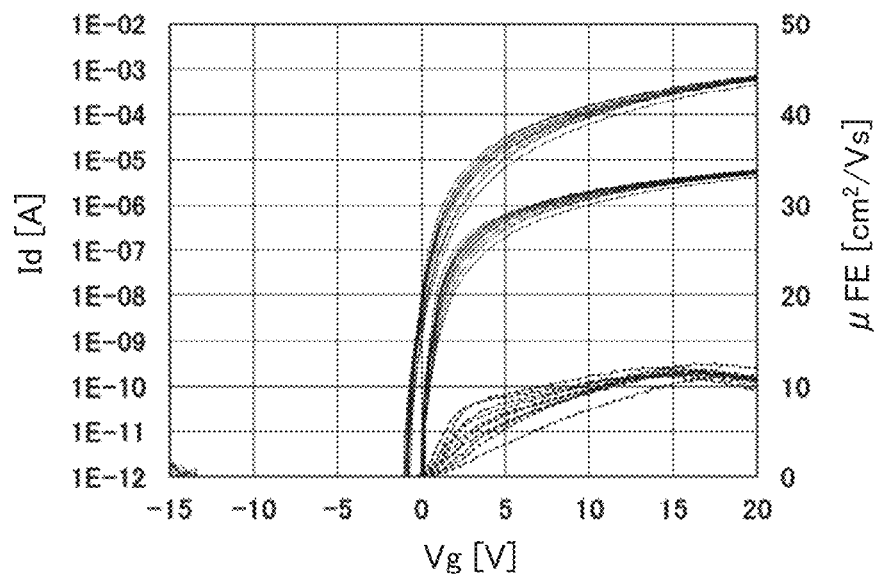
FIGS. 36A and 36B each show $I_d$-$V_g$ characteristics of a transistor described in Example 3.
Figure 36B:
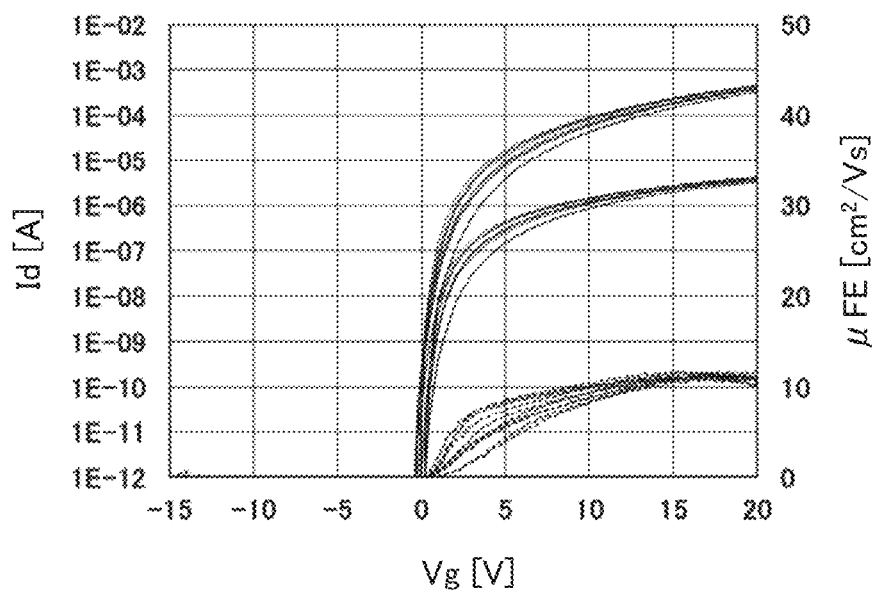

FIG. 29 shows XRD spectra of Sample B1 to Sample B17, and FIG. 30 shows XRD spectra of Sample B18 to B29. FIG. 31 shows XRD spectra of Sample C1 to Sample C15, and FIG. 32 shows XRD spectra of Sample C16 to Sample C25.

Each of FIGS. 29 to 32 shows spectra obtained by a θ-2θ scanning method which is a kind of out-of-plane methods. The horizontal axes each represent the diffraction angle 2θ [deg.] and the vertical axes each represents the X-ray diffraction intensity (arbitrary unit). Note that in a θ-2θ scanning method, X-ray diffraction intensity is measured while an incident angle of an X-ray is changed and the angle of a detector facing an X-ray source is set equal to the incident angle. The θ-2θ scanning method is called a powder method in some cases.

The XRD measurement was performed using an X-ray diffractometer D8 ADVANCE produced by Bruker AXS. As the X-ray source, a CuKα ray with a wavelength of 0.15418 nm was used. The scanning range at 2θ was 15 deg. to 50 deg., the step width was 0.01 deg., and the scanning speed was 6.0 deg./min.

According to FIG. 29 and FIG. 30, a peak around 2θ=31°, indicating the existence of CAAC-OS, is observed in each of Sample B2 to Sample B29, which means that Sample B2 to Sample B29 have favorable crystallinity. A peak is not clearly observed around 2θ=31° in Sample B1, which means that Sample B1 has lower crystallinity than Sample B2 to Sample B29.

According to FIG. 29 and FIG. 30, the higher the substrate temperature at the time of film deposition is or the higher the oxygen gas flow rate ratio at the time of film deposition is, the higher the intensity of the peak at around 2θ=31° is. Note that in Sample B1 to Sample B29, peaks around 2θ=36°, which are considered to be attributed to a spinel phase, were not observed.

According to FIG. 31 and FIG. 32, a peak around 2θ=31°, indicating the existence of CAAC-OS, is observed in each of Sample C3 to Sample C5, Sample C7 to Sample C10, and Sample C12 to Sample C25, which means that each of Sample C3 to Sample C5, Sample C7 to Sample C10, and Sample C12 to Sample C25 has favorable crystallinity. In addition, in each of Sample C2 and Sample C11, a slight peak around 2θ=31°, indicating the existence of CAAC-OS, is observed, which means that Sample C2 and Sample C11 also have crystallinity. In each of Sample C1 and Sample C6, a peak is not clearly observed around 2θ=31°, which means that Sample C1 and Sample C6 have lower crystallinity than Sample C2 to Sample C5 and Sample C7 to Sample C25.

According to FIG. 31 and FIG. 32, the higher the substrate temperature at the time of film deposition is or the higher the oxygen gas flow rate ratio at the time of film deposition is, the higher the intensity of the peak at around 2θ=31° is. Note that in each of Sample C3 to Sample C5, Sample C8 to Sample C10, Sample C12 to Sample C15, Sample C17 to Sample C20, and Sample C22 to Sample C25, peaks around 2θ=36°, which are considered to be attributed to a spinel phase, were observed.

Note that the structure described in this example can be combined as appropriate with any of the structures described in the other embodiments and the other examples.

Example 3

For this example, transistors were fabricated, and the electrical characteristics of the transistors were measured. Sample D1 to Sample D4 described below were fabricated for the measurement in this example. Metal oxide layers 108 in Sample D1 to Sample D4 are different from each other. In each of Sample D1 to Sample D4, transistors have a channel width W of 50 μm and a channel length L of 2 μm or 3 μm. Each of Sample D1 to Sample D4 includes ten transistors with a channel length L of 2 μm and ten transistors with a channel length L of 3 μm.

<Manufacturing Method of Sample D1>

First, the conductive layer 104 was formed over the substrate 102. As the substrate 102, a glass substrate was used. A 100-nm-thick tungsten film was deposited with a sputtering apparatus and processed to form the conductive layer 104.

Next, the insulating layer 106 was formed over the substrate 102 and the conductive layer 104. As the insulating layer 106, a 400-nm-thick silicon nitride film and a 5-nm-thick silicon oxynitride film over the 400-nm-thick silicon nitride film were formed with a PECVD apparatus.

The insulating layer 106 was deposited as follows. First, a 50-nm-thick silicon nitride film was deposited under the conditions where the substrate temperature was 350° C.; a silane gas at a flow rate of 200 sccm, a nitrogen gas at a flow rate of 2000 sccm, and an ammonia gas at a flow rate of 100 sccm were introduced into a chamber; the pressure was set to 100 Pa; and an RF power of 2000 W was supplied between parallel-plate electrodes placed in the PECVD apparatus. Then, the flow rate of an ammonia gas was changed to 2000 sccm to deposit a 300-nm-thick silicon nitride film. Finally, the flow rate of an ammonia gas was changed to 100 sccm to deposit a 50-nm-thick silicon nitride film. After the silicon nitride film was deposited, a silicon oxynitride film was deposited successively in the chamber of the PECVD apparatus. The silicon oxynitride film was deposited under the conditions where the substrate temperature was 350° C., a silane gas at a flow rate of 20 sccm and a dinitrogen monoxide gas at a flow rate of 3000 sccm were introduced into the chamber, the pressure was set 40 Pa, and an RF power of 500 W was supplied between parallel-plate electrodes placed in the PECVD apparatus.

Next, the metal oxide layer 108 was formed over the insulating layer 106. Note that the metal oxide layer 108 in Sample D1 had a stacked structure including a first metal oxide layer IGZOa1 and a second metal oxide layer IGZOb1 over the first metal oxide layer IGZOa1. The first metal oxide layer IGZOa1 and the second metal oxide layer IGZOb1 were successively deposited in vacuum with a sputtering apparatus. The stacked metal oxide layers were processed, whereby the metal oxide layer 108 was obtained.

As the IGZOa1, a 20-nm-thick In—Ga—Zn oxide film was formed. Note that the IGZOa1 was deposited under the conditions where the substrate temperature was room temperature, an argon gas at a flow rate of 180 sccm and an oxygen gas at a flow rate of 20 sccm (an oxygen flow rate ratio of 10%) were introduced into a chamber, the pressure was 0.6 Pa, and an AC power of 2500 W was applied to a polycrystalline metal oxide sputtering target (having an atomic ratio of In:Ga:Zn=1:1:1.2).

A 30-nm-thick IGZO film was formed as the IGZOb1. Note that the IGZOb1 was deposited under the conditions where the substrate temperature was room temperature, an argon gas at a flow rate of 100 sccm and an oxygen gas at a flow rate of 100 sccm (an oxygen flow rate ratio of 50%) were introduced into a chamber, the pressure was 0.6 Pa, and an AC power of 2500 W was applied to a polycrystalline metal oxide sputtering target (having an atomic ratio of In:Ga:Zn=1:1:1.2).

Next, heat treatment was performed at 350° C. for 1 hour in a nitrogen atmosphere. Then, heat treatment was performed at 350° C. for 1 hour in a mixed gas atmosphere of nitrogen and oxygen.

Next, a conductive film was formed over the insulating layer 106 and the metal oxide layer 108 and processed, whereby the conductive layers 112a and 112b were formed. For the conductive films, a 30-nm-thick first titanium film and a 200-nm-thick copper film were formed in this order using the sputtering apparatus. After the copper film was etched by a photolithography method, a 100-nm-thick second titanium film was formed using the sputtering apparatus. Then, the first titanium film and the second titanium film were etched by a photolithography method to form the conductive layers 112a and 112b.

Next, a surface of the exposed metal oxide layer 108 (on the back channel side) was cleaned using phosphoric acid. As the cleaning using phosphoric acid, treatment was performed for 15 seconds using a solution in which 85% phosphoric acid was diluted 100 times.

Next, first plasma treatment was performed in an atmosphere containing an oxygen gas with a PECVD apparatus. The conditions of the first plasma treatment were a temperature of 350° C., a pressure of 40 Pa, a power supply of 3000 W, an oxygen flow rate of 3000 sccm (oxygen flow rate ratio of 100%), and a treatment time of 300 seconds.

Next, the insulating layer 114 is formed over the insulating layer 106, the metal oxide layer 108, the conductive layers 112a and 112b. As the insulating layer 114, a 50-nm-thick silicon oxynitride film was deposited with a PECVD apparatus.

The insulating layer 114 was deposited under the conditions where the substrate temperature was 350° C., a silane gas at a flow rate of 100 sccm and a dinitrogen monoxide gas at a flow rate of 2500 sccm were introduced into a chamber, the pressure was 400 Pa, and an RF power of 500 W was supplied between parallel-plate electrodes provided in the PECVD apparatus.

After the insulating layer 114 was deposited, second plasma treatment was performed successively in the chamber of the PECVD apparatus. The conditions of the second plasma treatment were a temperature of 350° C., a pressure of 40 Pa, a power supply of 3000 W, an oxygen flow rate of 3000 sccm (oxygen flow rate ratio of 100%), and a treatment time of 600 seconds.

Next, third plasma treatment was performed in an atmosphere containing an oxygen gas. The conditions of the third plasma treatment were a temperature of 220° C., a pressure of 40 Pa, a power supply of 3000 W, an oxygen flow rate of 3000 sccm (oxygen flow rate ratio of 100%), and a treatment time of 600 seconds.

Next, the insulating layer 116 was formed over the insulating layer 114. As the insulating layer 116, a 100-nm-thick silicon nitride film was deposited with a PECVD apparatus.

The insulating layer 116 was deposited under the conditions where the substrate temperature was 350° C.; a silane gas at a flow rate of 50 sccm, a nitrogen gas at a flow rate of 5000 sccm, and an ammonia gas at a flow rate of 100 sccm were introduced into a chamber; the pressure was 100 Pa; and an RF power of 1000 W was supplied between parallel-plate electrodes provided in the PECVD apparatus.

Then, a 1.5-μm-thick acrylic resin film was formed over the insulating layer 116 and processed to form a planarization film. The acrylic resin film was formed using an acrylic photosensitive resin by baking for 1 hour at 250° C. in a nitrogen atmosphere. After that, heat treatment was performed at 250° C. for 1 hour in a nitrogen atmosphere.

Through the above process, Sample D1 of this example was fabricated.

<Manufacturing Method of Sample D2>

A difference between Sample D2 and Sample D1 is deposition conditions of the metal oxide layer 108. The other steps were the same as the steps for Sample D1.

The metal oxide layer 108 in Sample D2 had a stacked structure of a third metal oxide layer IGZOc2, a first metal oxide layer IGZOa2 over the third metal oxide layer IGZOc2, and a second metal oxide layer IGZOb2 over the first metal oxide layer IGZOa2. The third metal oxide layer IGZOc2, the first metal oxide layer IGZOa2, and the second metal oxide layer IGZOb2 were deposited successively in vacuum with a sputtering apparatus. The stacked metal oxide layer was processed to obtain the metal oxide layer 108.

A 5-nm-thick IGZO film was formed as the IGZOc2. Note that the IGZOc2 was deposited under the conditions where the substrate temperature was room temperature, an argon gas at a flow rate of 100 sccm and an oxygen gas at a flow rate of 100 sccm (an oxygen flow rate ratio of 50%) were introduced into a chamber, the pressure was 0.6 Pa, and an AC power of 2500 W was applied to a polycrystalline metal oxide sputtering target (having an atomic ratio of In:Ga:Zn=1:1:1.2).

A 20-nm-thick In—Ga—Zn oxide film was formed as the IGZOa2. Note that the IGZOa2 was deposited under the conditions where the substrate temperature was room temperature, an argon gas at a flow rate of 180 sccm and an oxygen gas at a flow rate of 20 sccm (an oxygen flow rate ratio of 10%) were introduced into the chamber, the pressure was 0.6 Pa, and an AC power of 2500 W was applied to a polycrystalline metal oxide sputtering target (having an atomic ratio of In:Ga:Zn=1:1:1.2).

A 30-nm-thick IGZO film was formed as the IGZOb2. Note that the IGZOb2 was deposited under the conditions where the substrate temperature was room temperature, an argon gas at a flow rate of 100 sccm and an oxygen gas at a flow rate of 100 sccm (an oxygen flow rate ratio of 50%) were introduced into the chamber, the pressure was 0.6 Pa, and an AC power of 2500 W was applied to a polycrystalline metal oxide sputtering target (having an atomic ratio of In:Ga:Zn=1:1:1.2).

Through the above process, Sample D2 of this example was fabricated.

<Manufacturing Method of Sample D3>

A difference between Sample D3 and Sample D1 is deposition conditions of the metal oxide layer 108. The other steps were the same as the steps for Sample D1.

The metal oxide layer 108 in Sample D3 had a stacked structure of a first metal oxide layer IGZOa3 and a second metal oxide layer IGZOb3 over the first metal oxide layer IGZOa3. The first metal oxide layer IGZOa3 and the second metal oxide layer IGZOb3 were formed successively in vacuum with a sputtering apparatus. The stacked metal oxide layer was processed to obtain the metal oxide layer 108.

A 20-nm-thick In—Ga—Zn oxide film was formed as the IGZOa3. Note that the IGZOa3 was deposited under the conditions where the substrate temperature was 70° C., an argon gas at a flow rate of 180 sccm and an oxygen gas at a flow rate of 20 sccm (oxygen flow rate ratio of 10%) were introduced into a chamber, the pressure was 0.6 Pa, and an AC power of 2500 W was applied to a polycrystalline metal oxide sputtering target (having an atomic ratio of In:Ga:Zn=1:1:1.2).

A 30-nm-thick IGZO film was formed as the IGZOb3. Note that the IGZOb3 was deposited under the conditions where the substrate temperature was 70° C., an argon gas at a flow rate of 100 sccm and an oxygen gas at a flow rate of 100 sccm (oxygen flow rate ratio of 50%) were introduced into the chamber, the pressure was 0.6 Pa, and an AC power of 2500 W was applied to a polycrystalline metal oxide sputtering target (having an atomic ratio of In:Ga:Zn=1:1:1.2).

Through the above process, Sample D3 of this example was fabricated.

<Manufacturing Method of Sample D4>

A difference between Sample D4 and Sample D1 is deposition conditions of the metal oxide layer 108. The other steps were the same as the steps for Sample D1.

The metal oxide layer 108 in Sample D4 had a stacked structure of a third metal oxide layer IGZOc4, a first metal oxide layer IGZOa4 over the third metal oxide layer IGZOc4, and a second metal oxide layer IGZOb4 over the first metal oxide layer IGZOa4. The third metal oxide layer IGZOc4, the first metal oxide layer IGZOa4, and the second metal oxide layer IGZOb4 were formed successively in vacuum with a sputtering apparatus. The stacked metal oxide layer was processed to obtain the metal oxide layer 108.

A 5-nm-thick IGZO film was formed as the IGZOc4. Note that the IGZOc4 was deposited under the conditions where the substrate temperature was 70° C., an argon gas at a flow rate of 100 sccm and an oxygen gas at a flow rate of 100 sccm (oxygen flow rate ratio of 50%) were introduced into a chamber, the pressure was 0.6 Pa, and an AC power of 2500 W was applied to a polycrystalline metal oxide sputtering target (having an atomic ratio of In:Ga:Zn=1:1:1.2).

A 20-nm-thick In—Ga—Zn oxide film was formed as the IGZOa4. Note that the IGZOa4 was deposited under the conditions where the substrate temperature was 70° C., an argon gas at a flow rate of 180 sccm and an oxygen gas at a flow rate of 20 sccm (oxygen flow rate ratio of 10%) were introduced into the chamber, the pressure was 0.6 Pa, and an AC power of 2500 W was applied to a polycrystalline metal oxide sputtering target (having an atomic ratio of In:Ga:Zn=1:1:1.2).

A 30-nm-thick IGZO film was formed as the IGZOb4. Note that the IGZOb4 was deposited under the conditions where the substrate temperature was 70° C., an argon gas at a flow rate of 100 sccm and an oxygen gas at a flow rate of 100 sccm (oxygen flow rate ratio of 50%) were introduced into the chamber, the pressure was 0.6 Pa, and an AC power of 2500 W was applied to a polycrystalline metal oxide sputtering target (having an atomic ratio of In:Ga:Zn=1:1:1.2).

Through the above process, Sample D4 of this example was fabricated.

<Electrical Characteristics of Transistor>

Next, $I_d$-$V_g$ characteristics of transistors of the fabricated samples were measured. In measuring the $I_d$-$V_g$ characteristics of the transistors, the gate voltage ($V_g$) was changed from −15 V to +20 V in increments of 0.25 V. The source voltage ($V_s$) was set to 0 V, and the drain voltage ($V_d$) was set to 0.1 V or 15V. The number of measured transistors was 10 for each sample.

Next, the $I_d$-$V_g$ characteristics of Sample D1 to Sample D4 were measured. Measurement results of the $I_d$-$V_g$ characteristics of Sample D1, those of Sample D2, those of sample D3, and those of Sample D4 are shown in FIGS. 33A and 33B, FIGS. 34A and 34B, FIGS. 35A and 35B, and FIGS. 36A and 36B, respectively. Each of FIG. 33A, FIG. 34A, FIG. 35A, and FIG. 36A shows the results of the transistors with a channel length L of 2 μm and a channel width W of 50 μm. Each of FIG. 33B, FIG. 34B, FIG. 35B, and FIG. 36B shows the results of the transistors with a channel length L of 3 μm and a channel width W of 50 μm. Furthermore, in each of FIGS. 33A and 33B, FIGS. 34A and 34B, FIGS. 35A and 35B, and FIGS. 36A and 36B, the first vertical axis represents Id[A], the second vertical axis represents μFE [cm$^2$/Vs], and the horizontal axis represents Vg[V].

As shown in FIGS. 33A and 33B, FIGS. 34A and 34B, FIGS. 35A and 35B, and FIGS. 36A and 36B, Sample D1 to Sample D4 with a channel length L of 3 μm have favorable electrical characteristics with less variation. Furthermore, even in the case of a channel length L of 2 μm, Sample D2 to Sample D4 have favorable electrical characteristics with less variation.

Next, the reliability of Sample D1 to Sample D4 was evaluated. To evaluate the reliability, a bias-temperature stress test (hereinafter referred to as a GBT test) was performed.

The GBT tests in this example were performed under the conditions where the gate voltage (Vg) was ±30 V, the drain voltage (Vd) and the source voltage (Vs) were 0 V (comm), the stress temperature was 70° C., the time for stress application was 1 hour, and two kinds of measurement environments, a dark environment and a photo environment (irradiation with light having approximately 10000 lx with a white LED), were employed. In other words, the source electrode and the drain electrode of the transistor were set at the same potential, and a potential different from that of the source and drain electrodes was applied to the gate electrode for a certain time (1 hour, here). The transistors used for the GBT test have a channel length L of 3 µm and a channel width W of 50 µm.

A case where the potential applied to the gate electrode is higher than that of the source and drain electrodes is called positive stress, and a case where the potential applied to the gate electrode is lower than that of the source and drain electrodes is called negative stress. Thus, the reliability evaluation was performed under four conditions in total, i.e., positive GBT stress (Dark), negative GBT stress (Dark), positive GBT stress (Light irradiation), and negative GBT stress (Light irradiation). Note that positive GBT (Dark) can be referred to as PBTS (Positive Bias Temperature Stress), negative GBT (Dark) as NBTS (Negative Bias Temperature Stress), positive GBT (Light irradiation) as PBITS (Positive Bias Illuminations Temperature Stress), and negative GBT (Light irradiation) as NBITS (Negative Bias Illuminations Temperature Stress).

Figure 37:
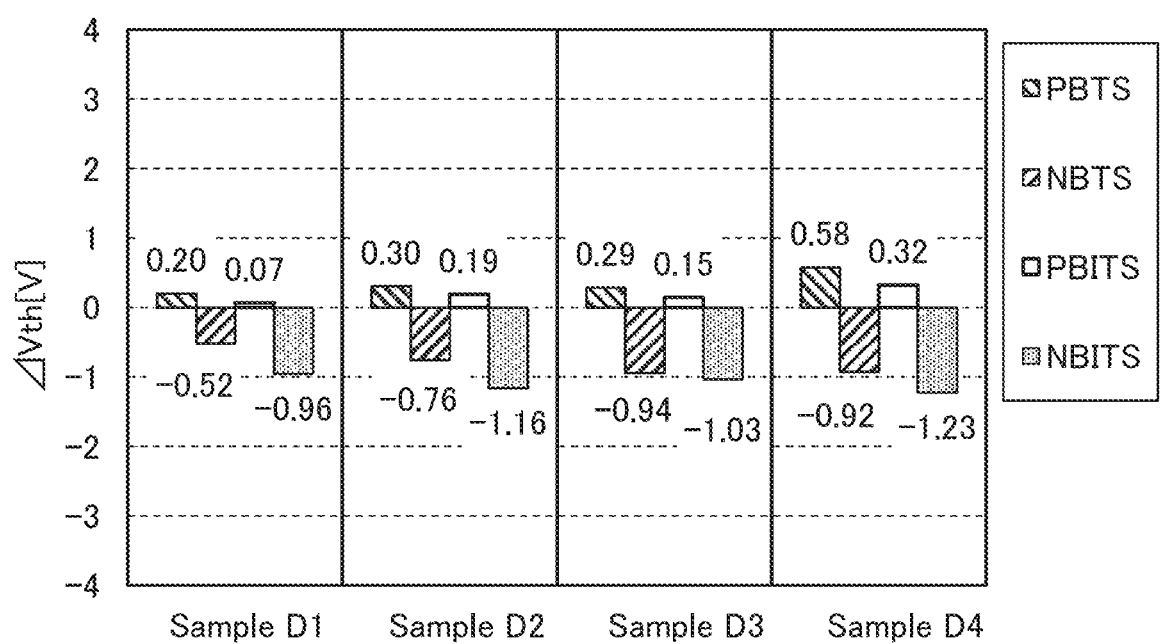
FIG. 37 shows GBT test results described in Example 3.

FIG. 37 shows the GBT test results of Sample D1 to Sample D4. In FIG. 37, the vertical axis represents the amount of change in threshold voltage (ΔVth), and the horizontal axis represents the sample name.

According to FIG. 37, in all of Sample D1 to Sample D4, the amount of change in threshold voltage (ΔVth) due to the GBT tests is within ±2 V. Thus, it was found that a transistor including the metal oxide film of one embodiment of the present invention had high reliability.

The structure described in this example can be combined with any of the structures described in the other embodiments and the other examples as appropriate.

This application is based on Japanese Patent Application Serial No. 2017-041019 filed with Japan Patent Office on Mar. 3, 2017, and Japanese Patent Application Serial No. 2017-047019 filed with Japan Patent Office on Mar. 13, 2017, the entire contents of which are hereby incorporated by reference.

What is claimed is:

1. A method for manufacturing a semiconductor device comprising the steps of:
   forming a gate electrode;
   forming a first insulating layer over the gate electrode;
   adding oxygen in a vicinity of a surface of the first insulating layer;
   forming a metal oxide layer over the first insulating layer;
   forming a pair of electrodes over the metal oxide layer; and
   forming a second insulating layer over the pair of electrodes,
   wherein the step of forming the metal oxide layer is divided into a first step and a second step to deposit the metal oxide layer in vacuum through the first step and the second step conducted continuously,
   wherein the first step is conducted before the second step,
   wherein the second step has a higher flow ratio of oxygen in a whole deposition gas than the first step,
   wherein the second insulating layer comprises a first region and a second region,
   wherein the first region comprises a region in contact with the metal oxide layer,
   wherein the second region comprises a region containing more nitrogen than the first region and comprises a region containing more excess oxygen than the first region,
   wherein the metal oxide layer has at least a concentration gradient of oxygen in a thickness direction, and
   wherein the concentration gradient becomes high on a first region side and on a first insulating layer side.

2. The method for manufacturing a semiconductor device according to claim 1, further comprising the step of forming a third insulating layer over the second insulating layer,
   wherein the third insulating layer comprises silicon nitride.

3. The method for manufacturing a semiconductor device according to claim 1,
   wherein the metal oxide layer comprises In, an element M, and zinc, and
   wherein the element M is at least one of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

4. The method for manufacturing a semiconductor device according to claim 1, wherein the first region comprises a region with a thickness greater than or equal to 1 nm and less than or equal to 10 nm.

5. The method for manufacturing a semiconductor device according to claim 1, wherein the metal oxide layer has an atomic ratio of M greater than or equal to 0.5 and less than or equal to 1.5 and an atomic ratio of Zn greater than or equal to 0.1 and less than or equal to 2 when an atomic ratio of In is 1.

6. The method for manufacturing a semiconductor device according to claim 1, wherein the metal oxide layer has an atomic ratio of M greater than or equal to 1.5 and less than or equal to 2.5 and an atomic ratio of Zn greater than or equal to 2 and less than or equal to 4 when an atomic ratio of In is 4.

7. The method for manufacturing a semiconductor device according to claim 1, wherein the metal oxide layer has an atomic ratio of M greater than or equal to 0.5 and less than or equal to 1.5 and an atomic ratio of Zn greater than or equal to 5 and less than or equal to 7 when an atomic ratio of In is 5.

8. A method for manufacturing a semiconductor device comprising the steps of:
   forming a gate electrode;
   forming a first insulating layer over the gate electrode;
   adding oxygen in a vicinity of a surface of the first insulating layer;
   forming a metal oxide layer over the first insulating layer;
   forming a pair of electrodes over the metal oxide layer; and
   forming a second insulating layer over the pair of electrodes,
   wherein the step of forming the metal oxide layer is divided into a first step, a second step, and a third step to deposit the metal oxide layer in vacuum through the first step, the second step, and the third step conducted continuously,
   wherein the first step is conducted before the second step,
   wherein the second step has a higher flow ratio of oxygen in a whole deposition gas than the first step,
   wherein the third step is conducted before the first step,
   wherein the third step has a higher flow ratio of oxygen in a whole deposition gas than the first step, wherein the second insulating layer comprises a first region and a second region, wherein the first region comprises a region in contact with the metal oxide layer, wherein the second region comprises a region containing more nitrogen than the first region and comprises a region containing more excess oxygen than the first region, wherein the metal oxide layer has at least a concentration gradient of oxygen in a thickness direction, and wherein the concentration gradient becomes high on a first region side and on a first insulating layer side.

9. The method for manufacturing a semiconductor device according to claim 8, further comprising the step of forming a third insulating layer over the second insulating layer, wherein the third insulating layer comprises silicon nitride.

10. The method for manufacturing a semiconductor device according to claim 8, wherein the metal oxide layer comprises In, an element M, and zinc, and wherein the element M is at least one of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

11. The method for manufacturing a semiconductor device according to claim 2, wherein the first region comprises a region with a thickness greater than or equal to 1 nm and less than or equal to 10 nm.

12. The method for manufacturing a semiconductor device according to claim 8, wherein the metal oxide layer has an atomic ratio of M greater than or equal to 0.5 and less than or equal to 1.5 and an atomic ratio of Zn greater than or equal to 0.1 and less than or equal to 2 when an atomic ratio of In is 1.

13. The method for manufacturing a semiconductor device according to claim 8, wherein the metal oxide layer has an atomic ratio of M greater than or equal to 1.5 and less than or equal to 2.5 and an atomic ratio of Zn greater than or equal to 2 and less than or equal to 4 when an atomic ratio of In is 4.

14. The method for manufacturing a semiconductor device according to claim 8, wherein the metal oxide layer has an atomic ratio of M greater than or equal to 0.5 and less than or equal to 1.5 and an atomic ratio of Zn greater than or equal to 5 and less than or equal to 7 when an atomic ratio of In is 5.

15. A method for manufacturing a semiconductor device comprising the steps of:

forming a gate electrode;

forming a first insulating layer over the gate electrode;

adding oxygen in a vicinity of a surface of the first insulating layer;

forming a metal oxide layer over the first insulating layer;

forming a pair of electrodes over the metal oxide layer;

forming a second insulating layer over the pair of electrodes; and performing a heat treatment after the formation of the second insulating layer, wherein the step of forming the metal oxide layer is divided into a first step and a second step to deposit the metal oxide layer in vacuum through the first step and the second step conducted continuously, wherein the first step is conducted before the second step, wherein the second step has a higher flow ratio of oxygen in a whole deposition gas than the first step, wherein the second insulating layer is formed at a substrate temperature of higher than or equal to 180° C and lower than or equal to 280° C, wherein the second insulating layer comprises a first region and a second region, wherein the first region comprises a region in contact with the metal oxide layer, wherein the second region comprises a region containing more nitrogen than the first region and comprises a region containing more excess oxygen than the first region, wherein the metal oxide layer has at least a concentration gradient of oxygen in a thickness direction, and wherein the concentration gradient becomes high on a first region side and on a first insulating layer side.

* * * * *